United States Patent
Fang et al.

(10) Patent No.: US 7,998,330 B2
(45) Date of Patent: Aug. 16, 2011

(54) DIRECT NANOSCALE PATTERNING OF METALS USING POLYMER ELECTROLYTES

(75) Inventors: Nicholas X. Fang, Champaign, IL (US); Placid M. Ferreira, Champaign, IL (US); Keng Hao Hsu, Savoy, IL (US); Peter Lee Schultz, Urbana, IL (US); Kyle E. Jacobs, Urbana, IL (US); Anil Kumar, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 745 days.

(21) Appl. No.: 12/122,967

(22) Filed: May 19, 2008

(65) Prior Publication Data
US 2009/0050487 A1 Feb. 26, 2009

Related U.S. Application Data

(63) Continuation-in-part of application No. 11/376,908, filed on Mar. 16, 2006, and a continuation-in-part of application No. PCT/US2007/064132, filed on Mar. 16, 2007, which is a continuation-in-part of application No. 11/376,908.

(60) Provisional application No. 60/938,934, filed on May 18, 2007.

(51) Int. Cl.
C25D 5/02 (2006.01)
C25D 17/00 (2006.01)
(52) U.S. Cl. .................. 205/118; 205/136; 204/224 M
(58) Field of Classification Search .................. 205/118, 205/136; 204/224 M
See application file for complete search history.

(56) References Cited

U.S. PATENT DOCUMENTS

| | | | |
|---|---|---|---|
| 4,968,390 A * | 11/1990 | Bard et al. ............... 205/115 |
| 5,641,391 A | 6/1997 | Hunter et al. |
| 5,837,157 A | 11/1998 | Kohjiya et al. |
| 6,165,705 A | 12/2000 | Danosh et al. |
| 6,294,450 B1 | 9/2001 | Chen et al. |
| 6,555,945 B1 | 4/2003 | Baughman et al. |
| 6,782,179 B2 | 8/2004 | Bozhevolnyi et al. |
| 2003/0044687 A1 | 3/2003 | Noda et al. |
| 2005/0023148 A1 | 2/2005 | Lockard et al. |

(Continued)

FOREIGN PATENT DOCUMENTS
WO WO 2007/106911 9/2007

OTHER PUBLICATIONS

Office Action, Corresponding to U.S. Appl. No. 11/376,908, Mailed Sep. 4, 2009.

(Continued)

*Primary Examiner* — Luan Van
(74) *Attorney, Agent, or Firm* — Greenlee Sullivan P.C.

(57) ABSTRACT

Disclosed herein are electrochemical fabrication platforms for making structures, arrays of structures and functional devices having selected nanosized and/or microsized physical dimensions, shapes and spatial orientations. Methods, systems and system components use an electrochemical stamping tool such as solid state polymeric electrolytes for generating patterns of relief and/or recessed features exhibiting excellent reproducibility, pattern fidelity and resolution on surfaces of solid state ionic conductors and in metal. Electrochemical stamping tools are capable high throughput patterning of large substrate areas, are compatible with commercially attractive manufacturing pathways to access a range of functional systems and devices including nano- and micro-electromechanical systems, sensors, energy storage devices, metal masks for printing, interconnects, and integrated electronic circuits.

25 Claims, 55 Drawing Sheets

Anodic:

(a) $Cu - 2e = Cu^{2+}$ (b) Cathodic:

$2Ag^+ + 2e = 2Ag$ (c)

U.S. PATENT DOCUMENTS

2005/0285096 A1    12/2005   Kozicki
2006/0249391 A1    11/2006   Jin et al.
2007/0215480 A1     9/2007   Fang et al.

OTHER PUBLICATIONS

Office Action, Corresponding to U.S. Appl. No. 11/376,908, Mailed Feb. 2, 2010.

Office Action, Corresponding to U.S. Appl. No. 11/376,908, Mailed Sep. 7, 2010.

Response to Office Action, corresponding to U.S. Appl. No. 11/376,908, filed Jan. 4, 2010.

Response to Office Action, corresponding to U.S. Appl. No. 11/376,908, filed Jul. 1, 2010.

Avouris et al. (Jul. 14, 1997) "Atomic Force Microscope Tip-Induced Local Oxidation of Silicon: Kinetics, Mechanism, and Nanofabrication," *Appl. Phys. Lett.* 71(2):285-287.

Bhattacharyya et al. (2001) "Electrochemical Micro-Machining: New Possibilities for Micro-Manufacturing," *J. Mater. Process. Technol.* 113:301-305.

Bozhevolnyi et al. (Mar. 23, 2006) "Channel Plasmon Subwavelength Waveguide Components Including Interferometers and Ring Resonators," *Nature* 440:508-511.

Chou et al. (Nov./Dec. 1996) "Nanoimprint Lithography," *J. Vac. Sci. Technol. B.* 14(6):4129-4133.

Chou et al. (Nov./Dec./1997) "Sub-10nm Imprint Lithography and Applications," *J. Vac. Sci. Technol. B* 15(6):2897-2904.

Chou et al. (Apr. 5, 1996) "Imprint Lithography with 25-Nanometer Resolution," *Science* 272:85-87.

Dong et al. (2003) "Development of a High-Speed 3-Axis Machine Tool Using a Novel Parallel-Kinematics X-Y Table," *Int. J. Machine Tools Maufac.*

Ebbesen et al. (Feb. 12, 1998) "Extraordinary Optical Transmission Through Subwavelength Hole Arrays," *Nature* 391:667-669.

Fang et al. (Apr. 22, 2005) "Sub-Diffraction-Limited Optical Imaging with a Silver Superlens," *Science* 308:534-537.

Fang et al. (2008) "Solid-State Superionic Stamping," Power Point Presentation, Presented at the Industrial Advisory Board Meeting of NanoCEMMS, Mar. 2008.

Hans, R. (1982) "Reaction of Silver with Liquid Lulfur at 400° C.," In; *Electrochemistry of Solids*, Springer-Verlag, Berlin Heidelberg, New York, pp. 165-166.

Hebb, M. (Jan. 1952) "Electrical Conductivity of Silver Sulfide," *J. Chem. Phys.* 20(1):185-190.

Ho et al. (Jul. 26, 2005) "Electrolytic Transport Through a Synthetic Nanometer-Diameter Pore," *Proc. Nat. Acad. Sci. USA* 102(30):10445-10450.

Hsu et al. (Nov. 2006) Direct Nanopatterning with Solid Ionic Stamping, ASME IMECE, Chicago, IL Nov. 5-10.

Hsu et al. (Nov. 2006) "A Solid Phase Electrochemical Nanoimprint Process," Paper p-35, Nanoimprint and Nanoprint Technology Conference, Nov. 15-17 San Francisco, CA.

Hsu et al. (Web Release Jan. 26, 2007) "Electrochemical Nanoimprinting with Solid-State Superionic Stamps," *Nano Lett.* 7(2):446-451.

Hull, S. (Jun. 14, 2004) "Superionics: Crystal Structures and Conduction Processes," *Rep. Prog. Phys.* 67:1233-1314.

Hüsser et al. (Nov. 1988) "High-Resolution Deposition and Etching of Metals with a Scanning Electrochemical Microscope," *J. Vac. Sci. Technol. B.* 6(6):1873-1876.

International Search Report and Written Opinion Corresponding to International Application No. PCT/US07/64132, Mailed Jan. 29, 2008.

International Assessment of Research and Development in Micromanufacturing (2005) http://www.wtec.org/micromfg/report/Micro-report.pdf.

Kaeriyama et al. (Jan. 2005) "A Nonvolatile Programmable Solid-Electrolyte Nanometer Switch," *IEEE J. Solid-State Circ.* 40(1):168-176.

Kamada et al. (Web Release Mar. 24, 2005) "Solid-Sate Electrochemical Micromachining," *Chem. Mater.* 17:1930-1932.

Kashida et al. (2003) "Electronic Structure of Ag2S, Band Calculation and Photoelectron Spectroscopy," *Solid State Ionics* :167-175.

Lee et al. (Oct. 18, 2004) "Electrochemical Nanopatterning of Ag on Solid-State Ionic Conductor RbAg4I5 Using Atomic Force Microscopy," *Appl. Phys. Lett.* 85(16):3552-3554.

Lim et al. (2004) "Preparation of Ag2S Nanocrystals of Predictable Shape and Size," *Angew. Chem. Int. Ed.* 43:5685-5689.

Lin et al. (1997) "Automated Selection of Cutting Tools Based on Solid Models," *J. Mater. Process. Technol.* 72:317-329.

Mair et al. (Nov. 2005) "Nanoionics: Ion Transport and Electrochemical Storage in Confined Systems," *Nat. Mater.* 4:805-815.

Matsui et al. (1978) "Inorganic Copper Ion Conductors," In; *Solid Electrolytes General Principles, Characterization, Materials and Applications*, Hagenmuller et al Eds., Academic Press, pp. 237-252.

Mullin et al. (Jul. 28, 1997) "Use of Solid Electrolytic Erosion for Generating Nano-Aperture Near-Field Collectors," *Appl. Phys. Lett.* 71(4):437-439.

O'Brien et al. (2002) "Magnetic Activity at Infrared Frequencies in Structures Metallic Photonic Crystals," *J. Phys. Cond. Matt.* 14:6383-6394.

Park et al. (2003) "Etch Characteristics of Silver by Inductively Coupled Fluorine-Based Plasma," *Thin Solid Films* 445:138-143.

Prinz et al. (Oct. 18, 2004) "Electrochemical Nanopatterning of Ag on Solid-State Ionic Conductor $RbAg_4I_5$ Using Atomic Force Microscopy," *App. Phys. Lett.* 85(16):3552-3554.

Rynders et al. (May 1994) "Use of In Situ Atomic Force Microscope to Image Copper Electrodeposits on Platinum," *J. Electrochem. Soc.* 141(15):1166-1173.

Sata et al. (Dec. 2000) "Mesoscopic Fast Ion Conduction in Nanometre-Scale Planar Heterostructures," *Nature* 408:946-949.

Schultz (Nov./Dec. 2007) "Solid-State Electrochemical Nanoimprinting of Copper," *Journal of Vacuum Science and Technology B*, 25(6):2149-2424.

Schuster et al. (Jun. 22, 1998) "Nanoscale Electrochemistry," *Phys. Rev. Lett.* 80(25):5599-5602.

Schuster et al. (Jul. 7, 2000) "Electrochemical Micromachining," *Science* 289:98-101.

Shahinpoor et al. (2004) "Ionic Polymer-Metal Composites: III. Modeling and Simulation as Biomimetic Sensors, Actuators, Transducers, and Artificial Muscles," *Smar. Mater. Struct.* 14:197-.

Tan et al. (2004) "Current Status of Nanonex Nanoimprint Solutions," http://www.nanonex.com/technology.htm.

Tennant, D.M. (Apr./Jun. 1983) "Metal on Polymer Ion Implantation Mask," *J. Vac. Sci. Technol. B* 1(2):494-496.

Terabe et al. (Jan. 6, 2005) "Quantized Conductance Atomic Switch," *Nature* 433:47-50.

Terabe et al. (Jun. 14, 2002) "Formation and Disappearance of a Nanoscale Silver Cluster Realized by Solid Electrochemical Reaction," *J. Appl. Phys.* 91(12):10110-10114.

Terabe et al. (May 27, 2002) "Ionic / Electronic Mixed Conductor Tip of a Scanning Tunneling Microscope as a Metal Atom Source for Nanostructuring," *Appl. Phys. Lett.* 80(21):4009-4011.

Trimmer et al. (May 12, 2003) "Single-Step Electrochemical Machining of Complex Nanostructures with Ultrashort Voltage Pulses," *Appl. Phys. Lett.* 82(19):3327-3329.

Veeramani et al. (1997) "Selection of an Optimal Set of Cutting—Tools for a General Triangular Pocket," *Int. J. Prod. Res.* 35(9):2621-2637.

Wagner, C. (Oct. 1953) "Investigations on Silver Sulfide," *J. Chem. Phys.* 21(10):1819-1827.

Weissmüller et al. (Apr. 11, 2003) "Charge-Induced Reversible Strain in a Metal," *Science* 300:312-315.

Wu et al. (Jul. 7, 2003) "Terahertz Plasmonic High Pass Filter," *Appl. Phys. Lett.* 83(1):201-203.

Wu et al. (2007) "Midinfrared Metamaterials Fabricated by Nanoimprint Lithography," Applied Physics Letters, 90(6):063107.

Wysk et al. (1997) "Electrochemical Investigation of the α/β-Phase Transition of Silver Sulfide," *Solid State Ionics* 96:41-47.

Xie et al. (Sep. 17, 2004) "Gate Controlled Atomic Quantum Switch," *Phys. Rev. Lett.* 93(12):128303.

Yen et al. (Mar. 5, 2004) "Terahertz Magnetic Response from Artificial Materials," *Science* 303(5663):1494-1496.

Zankovych et al. (2001) "Nanoimprint Lithography: Challenges and Prospects," *Nanotechnology* 12:91-95.

"What's Next in Science and Technology," Feb. 21, 2007, http://whatsnextnetwork.com/technology/index.php/2007/02/21.

* cited by examiner

A.

B.

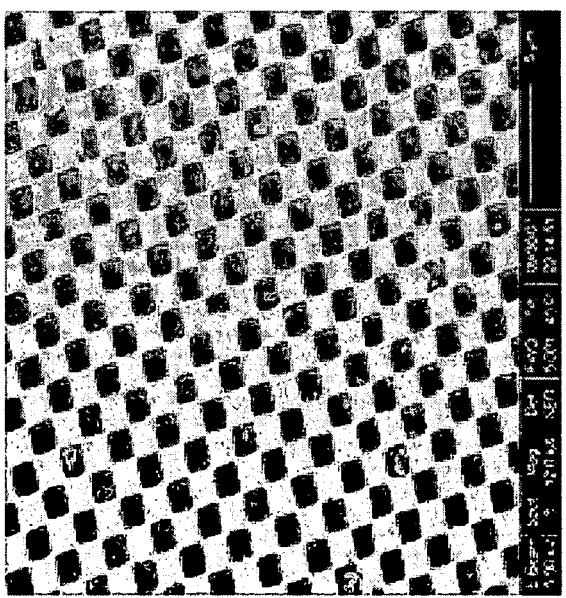
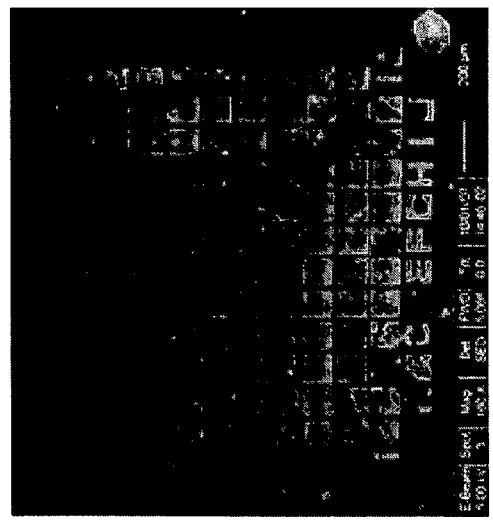
FIG. 46A
FIG. 46B
FIG. 46C

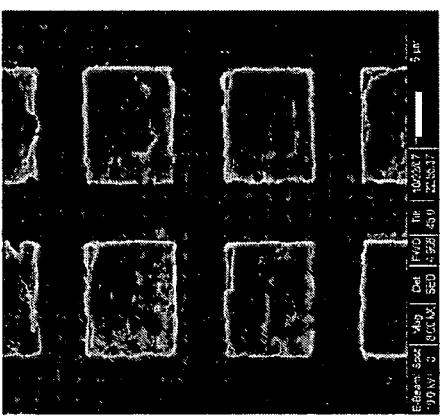
FIG. 47C
FIG. 47B
FIG. 47A
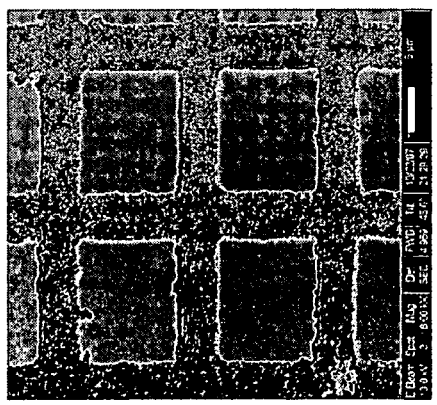
FIG. 47E
FIG. 47D

DIRECT NANOSCALE PATTERNING OF METALS USING POLYMER ELECTROLYTES

CROSS-REFERENCE TO RELATED APPLICATIONS

This application claims the benefit of U.S. Provisional Application No. 60/938,934 filed May 18, 2007 and is a continuation-in-part application of U.S. patent application Ser. No. 11/376,908 filed Mar. 16, 2006 and PCT/US2007/064132 filed Mar. 16, 2007, which claims the benefit of U.S. patent application Ser. No. 11/376,908, each of which are hereby incorporated by reference in their entireties to the extent they are not inconsistent with the disclosure herein.

STATEMENT REGARDING FEDERALLY SPONSORED RESEARCH OR DEVELOPMENT

This invention was made, at least in part, with United States governmental support awarded by National Science Foundation under contract number DMI-0328162. The United States government has certain rights in this invention.

BACKGROUND OF THE INVENTION

The use of solid state ionic conductors allows for nanoscale patterning and stamping by highly localized electrochemical etching and deposition. When an electric field is applied by two electrodes in contact with a material that exhibits ionic conduction, the metal ions near one of the electrodes migrate through the bulk of the ionic conductor, and, upon receiving electrons at the counter electrode, reduce back to metal atoms precipitating at the interface. Alternatively, under a reverse potential, a counter electrode of the metal is etched. By nano-patterning the contact between the electrode and the ionic conductor, one can deposit or etch metal patterns at a conductive substrate.

Electrochemical micromachining, which works by local dissolution of a conducting substrate (metals, semiconductors) under an applied anodic bias in solution, shows promise in fabricating 3D micro and nanoscale structures and devices, since it requires relatively simple equipment and offers rapid etching compared to other techniques such as ion beam milling and laser abrasion. However, a liquid electrolyte, which is difficult to handle, is required as a conducting medium between the two electrodes. This challenge is overcome in the present invention by utilizing solid state ionic conductors.

Terabe et al, demonstrate the use of mass transport in ionic conductors to implement a quantized atomic conductance switch, QCAS, where the concept of formation and dissolution of nanometer silver cluster was used. In their QCAS, a silver wire with a thin layer of silver sulfide cover was laid on a substrate, and a platinum wire went across it with a gap of one nanometer [K. Terabe, et al., Quantized conductance atomic switch, Nature, Vol 433, 6, January 2005.]. By forming silver cluster from silver ions drawn from underlying silver wire and hence bridging the gap in between, the switch operated at room temperature at a frequency of 1 MHz.

Terabe et al, show formation and disappearance of nano scale metal cluster on the apex of an Scanning Tunneling Microscopy (STM) tip. Based on the concept of electrochemical reaction, they show growth and shrinkage of a silver pillar of 70 nm in diameter and 200 nm in length on a silver sulfide coated silver STM probe [K. Terabe, et al., Formation and disappearance of a nanoscale silver cluster realized by solid electrochemical reaction, Journal of applied physics, Vol 91, 12, June, 2002]. By controlling the current going tunneling through the STM tip and their sample, the growth rate of the silver cluster is regulated.

M. Lee et al. have used Atomic Force Microscopy (AFM), and a super ionic conductor material, $RbAg_4I_5$, for nanopatterning [M. Lee, et al., Electrochemical nanopatterning of Ag on solid-state ionic conductor $RbAg_4I_5$ using atomic force microscopy, Applied physics letters, Vol 85, 16, October 2004]. With pulsed electric field input through a metal coated AFM probe controlled to step across an $RbAg_4I_5$ sample, they were able to place nanoscale silver cluster with each pulsed bias input, and hence arrange the clusters in designed pattern.

The use of solid state ionic conduction for switches and for single-point direct writing (with a modified stylus tip) has been previously demonstrated.

None of those methods, however, are fully adaptable to massive manufacturing due to the slow serial scanning process. Accordingly, there is currently a need in the art for methods of manufacturing structures, including nanostructures, that are capable of high-throughput large area patterning. The invention disclosed herein is a stamping process that can simultaneously produce a number of spatial features and can scale-up to high production rates for massive manufacturing over a large pattern area that conventional approaches cannot match. An additional advantage of the present methods and systems is the ionic stamp can be programmed, scaled and reprogrammed with different metallic nanopatterns for processes such as nano imprint lithography, molding, transfer printing, etc. With appropriate solid electrolytes, the processes disclosed herein can be used to directly produce a structure or desired pattern of structures in different metallic films, substrates, bulk materials or surfaces, thereby saving steps compared to a conventional photolithography patterning process. The patterning systems and methods of the present invention are particularly suited for manufacture of patterns for use in devices having high sensitivity and/or response times for use in a variety of fields such as optical filtering and transmission, tunable resonators and antennae, chemical and biological sensors, and actuators, for example.

SUMMARY OF THE INVENTION

Provided are electrochemical fabrication platform for making structures, arrays of structures and functional devices having selected nanosized and/or microsized physical dimensions, shapes and spatial orientations. Methods, systems and system components disclosed herein use an electrochemical stamping tool for generating patterns of relief and/or recessed features exhibiting excellent reproducibility, pattern fidelity and resolution on surfaces of solid state ionic conductors and in metal layers. Electrochemical stamping tools of the present invention are capable high throughput patterning of large substrate areas and, thus, enable a robust and commercially attractive manufacturing pathway to a range of functional systems and devices including nano- and micro-electromechanical systems, sensors, energy storage devices and integrated electronic circuits. Further, nanopatterning and micropatterning methods and systems of the present invention are compatible with a wide range of materials, including metals, metal alloys, ionic conductors and superionic conductors, and processing conditions, including room temperature (below about 30° C.) processing.

Advantages of the processes provided herein, such as a electrochemical stamping with solid-state ionic stamps include high-throughput and high-rate processes. The stamping processes provided herein are compatible with simultaneous production of multiple spatial features that is readily scaled-up to high-production rates for massive manufacturing. In addition, the processes provide access to large-area patterning that conventional approaches cannot match. The solid state ionic conductors provide high resolution and dimensional fidelity not achievable with liquid-based processes. The processes provided herein are optionally reprogrammable in that an ionic stamp can be programmed and reprogrammed with different nanopatterns for processes such as nano imprint lithography (see www.nanonex.com for information on imprint lithography), molding, transfer printing, etc. With appropriate solid electrolytes, this process can be used to directly produce a desired metallic mask, saving steps in the conventional photolithography process.

In one embodiment, the present invention provides methods for making structures, including nanostructures and microstructures, using a stamping tool capable of pattern transfer via electrochemical etching or electrochemical deposition. In a method of the present invention, a first electrode is provided in electrical contact with a solid state ionic conductor. A second electrode is provided in electrical contact with a metal, such as a metal film, substrate, surface, or bulk material, and optionally the metal itself is the second electrode. Electrical contact and/or physical contact is established between at least a portion of the solid state ionic conductor and the metal, for example by a configuration wherein the metal layer is separated from the first electrode by the solid state ionic conductor. In this embodiment of the present invention, the solid state ionic conductor or the first electrode is a stamping tool that generates a pattern of electrical contacts between the stamping tool and the solid state ionic conductor or the metal. Optionally, this method of the present invention may further comprise the step of applying a force to the stamping tool, for example a force that is uniformly applied as a function of a selected area of the stamping tool such that it maintains electrical contact with at least a portion of the stamping tool and the solid state ionic conductor or the metal during processing.

To generate a structure or pattern of structures, an electric field is established between the first and second electrodes, for example by applying a selected potential difference between first and second electrodes. Application of an electric field results in oxidation of metal atoms in the metal and subsequent migration of ions and electrons generated by the oxidative process. In a useful embodiment wherein the second electrode functions as an anode and the first electrode functions as a cathode, oxidization generates free electrons that migrate toward the electrode having a higher electric potential (i.e. the anode) and mobile metal ions that migrate toward the counter electrode (i.e. the cathode) having a lower electric potential. At the counter electrode (i.e. the cathode) metal ions are reduced back to metal atoms, for example by precipitation at the surface of the counter electrode. The net effect of the oxidation-reduction reactions and ion-electron transport processes is the formation of structures by electrochemical etching of the metal or by electrochemical deposition on a surface of the solid state ionic conductor at the interface with the stamping tool. The present invention, however, also includes patterning methods employing a potential difference wherein the first electrode has a larger electric potential than the second electrode. In this embodiment, oxidation of metal deposits, particles or metals occurs at the first electrode and reduction of metal ions occurs at the second electrode. This aspect of the present invention may be used to dissolve/reactively eliminate metals at the interface between the solid state ionic conductor and the first electrode, in a manner generating a structure or pattern of structures having selected physical dimensions.

Transport of the metal ions through the solid state ionic conductor is an integral process in the present invention and may involve a transport mechanism involving conduction channels, grain boundaries and/or the presence of bulk defects in the solid state ionic conductor. In one embodiment, a potential difference between first and second electrodes is established and maintained at a value such that oxidation-reduction reactions occur at two interfaces: (i) the interface between the solid state ionic conductor and the metal layer and (ii) first electrode and the solid state ionic conductor. Selection of the appropriate potential difference in this aspect of the present invention depends on the compositions, phases and oxidation-reduction chemistries of the metal layer and solid state ionic conductor, and in some exemplary embodiments range from about 100 mV to about 2000 mV.

In one embodiment of this aspect of the present invention, a structure or pattern of structures are electrochemically etched into the metal layer using a stamping tool that is the solid state ionic conductor itself. In one embodiment, for example, an ionic conductor-stamping tool is provided having a selected pattern of relief features separated from each other by one or more recessed regions. Patterns of relief features for ionic conductor-stamping tools of the present invention may be generated by any means known in the art including, but not limited to, optical lithograph, electron beam writing, ion beam writing, soft lithograph, wet and dry etching techniques and equivalents known in the art. Physical contact between at least a portion of the relief features and the metal generates the pattern of electrical contacts between the stamping tool and the metal. In this embodiment, applying an electric field results oxidization of metal in regions of the metal in physical contact with at least a portion of the relief features of the stamping tool. Metal ions generated via this oxidative process migrate through the ionic conductor-stamping tool an undergo reduction at the first cathode, thereby resulting in localized electrochemical etching of the metal layer at regions of the metal in physical contact with the relief features of the stamping tool. This embodiment of the present invention provides a means of at least partially transferring a pattern from the stamping tool to the metal layer undergoing processing, for example, by generating the negative relief pattern (i.e. the etch pattern) of at least a portion of the pattern of relief features into the metal layer.

In another embodiment of this aspect of the present invention, a structure or pattern of structures are electrochemically deposited onto a surface of the solid state ionic conductor using a stamping tool that is the first electrode itself. In one embodiment, for example, a first electrode-stamping tool is provided that has a selected shape that generates a selected pattern of electrical contacts between the first electrode-stamping tool and a surface of the solid state ionic conductor undergoing processing/patterning. Application of an electric field between a first electrode provided at a lower electric potential and a second electrode provided at a higher electrodic potential, results in oxidation of metal atoms of the metal, thereby generating metal ions that migrate to points of electrical contact in the pattern of electrical contacts established between the first electrode-stamping tool and the surface of the solid state ionic conductor. In this method, reduction of metal ions at the interface between the first electrode-stamping tool and the solid state ionic conductor results in localized electrochemical deposition of metal at regions of the solid state ionic conductor in electrical contact with the stamping tool.

This embodiment of the present invention provides a means of at least partially transferring a pattern from the first electrode-stamping tool to the solid state ionic conductor undergoing processing, for example, by reproducing the relief pattern of at least a portion of the pattern of relief features onto the surface of the solid state ionic conductor in electrical contact with the stamping tool. Useful stamping tools of this aspect of the invention include electrodes, shaped electrodes (e.g. a grid electrode) and electrode arrays. In one embodiment, for example the stamping tool comprises a shaped electrode having a plurality of features arranged in a selected pattern, such as a grid electrode, wherein at least a portion of the pattern of the shaped electrode is transferred to a surface of the solid state ionic conductor via localized electrochemical deposition. In another embodiment, the stamping tool comprises an array of electrodes that may be held at substantially the same or, alternatively, different electric potentials (i.e. voltages). In another embodiment a programmable, scalable or reprogrammable electrochemical stamping tool is use comprising and array of individually addressable electrodes in electrical contact with the solid state ionic conductor, wherein the voltage on each electrode in the array is independently selectable.

In methods of the present invention useful for certain applications it is beneficial to use a combination of a metal and solid state ionic conductor comprising metal atoms that having an elemental composition that corresponds to that of the metal used during processing (e.g., patterning of Cu by a $Cu_2S$ stamp). Use of a combination of elementally matched metal and ionic conductor materials is useful because cations generated from the metal generally will exhibit good transport properties and conductance through the matched solid state ionic conductor in the presence of an electric field, thereby allowing for useful etch rates or deposition rates in the present methods. The present invention includes methods, devices and systems using a combination of a metal and solid state conductor that do not have matched elemental composition with regard to the atomic composition of the metal and the solid state ionic conductor ("substitutional stamping"). In these methods and systems, therefore, the composition of the solid state ionic conductor is selected such that it comprises an atom having an elemental composition different from than that of the metal. In these elementally unmatched metal and ionic conductor systems it is useful to choose a metal that generates cations that are capable of efficient transport through the solid state ionic conductor and which exhibit appreciable solubility in the solid state ionic conductor, such that appreciable etching rates and deposition rates may be achieved. A particularly useful embodiment is patterning of copper by a $Ag_2S$ patterning stamp. Another useful substitutional stamping embodiment is patterning of metal by a solid state ionic conductor that is a polymer electrolyte.

The present methods are useful for patterning a wide range of metal and solid state ionic materials. Metals and solid state ionic conductors having planar surfaces, contoured (e.g. curved, convex, concaved) surfaces, smooth surfaces, rough surfaces or any combination of these may be patterned using the present methods, devices and systems. The term "metal" is used expansively in the present description and includes bulk metals, metal deposits, metal films, metal substrates, metal particles, aggregates of metal particles, metal clusters, and composite metal materials.

Another aspect the present invention provides patterning systems using an electrochemical stamping tool capable of electrochemical etching or electrochemical deposition for making a structure or pattern of structures having selected physical dimension, spatial orientation and positions. In one embodiment, a system of the present invention comprises a first electrode in electrical contact with a solid state ionic conductor; and a second electrode in electrical contact with a metal. In this embodiment, the solid state ionic conductor or the first electrode is a stamping tool that generates a pattern of electrical contacts between the stamping tool and the solid state ionic conductor or the metal. Electrical contact and/or physical contact is established between at least a portion of the solid state ionic conductor and the metal, for example by a configuration wherein the metal layer is separated from the first electrode by the solid state ionic conductor. In a useful embodiment, for example, the solid state ionic conductor and the metal are in electrical contact such that generation of an electric field between the first and second electrodes results in oxidation of metal atoms in the metal, thereby generating metal ions and free electrons, wherein the metal ions migrate through the solid state ionic conductor to the first electrode where they are reduced and wherein the free electrons migrate to the second electrode.

Useful stamping tools for certain embodiments of the present invention have a Young's modulus selected from the range of about 20 GPa to about 200 GPa. A benefit of stamping tools of the present invention having a Young's modulus in this range is that they are less susceptible to pattern distortion than polymeric stamping tools and stamps used in conventional soft lithography patterning techniques, such as conventional nanoimprint lithography. Accordingly, the methods, patterning systems and stamping tools of the present invention are capable of providing good pattern fidelity and high resolution patterning (e.g. resolution less than about 100 nanometers, and more preferably for some applications less than about 50 nanometers). An advantage provided by the present methods, therefore, is the ability to use stamping tools comprising solid state ionic conductor materials having a Young's modulus selected over the range at about 20 GPa to about 200 GPa, which are beneficial for minimizing or completely avoiding stamp distortion during processing.

In an embodiment providing pattern transfer via electrochemical etching, the ionic conductor is a stamping tool having a selected pattern of relief features, wherein at least a portion the relief features of the stamping tool are provided in physical contact with the metal. This configuration provides a pattern of electrical contacts that is useful for transferring at least a portion of the pattern of the stamping tool (i.e. the relief pattern) to the metal layer via electrochemical etching. Useful stamping tools of this embodiment may have nanosized relief features, microsized relief features or both, for example relief features having nanosized lateral dimensions, nanosized vertical dimensions or both. Use of nanosized and or microsized relief features in this aspect of the present invention beneficial for establishing electrical contact limited to selected nanosized and/or microsized regions of the surface of the solid state ionic conductor undergoing processing. This stamping tool configuration is useful for generating nanosized and/or microsized structures and patterns of nanosized and/or microsized structures In an embodiment providing pattern transfer via electrochemical deposition, the first electrode is a stamping tool comprising a shaped electrode having a plurality of structural features, such as a grid electrode, or an array of electrodes provided in electrical contact with the solid state ionic conductor. Electrode and electrode array geometries having nanosized or microsized elements is beneficial for establishing electrical contact limited to selected nanosized and/or microsized regions of the surface of the solid state ionic conductor. This stamping tool configuration is useful for generating nanosized and/or microsized structures and patterns of nanosized and/or microsized structures. Embodiments of this aspect of the present invention also includes use of a scalable, programmable and/or reprogrammable stamping tool comprising an array of individually addressable electrodes, wherein the voltage on each electrode in the array is independently selectable. Use of stamping tools comprising individually addressable electrodes is useful for making a wide range of structures, patterns and devices as the rate and extent of electrochemical deposition on the solid state ionic conductor surface can be individually and separately adjusted for each electrode in the array, thereby providing a fabrication pathway to structures and patterns of structures having a range of physical dimensions.

An embodiment of the present invention is a method of etching a metal layer. The method for making a structure comprises providing a first electrode in electrical contact with a metal and in electrical contact with a solid state ionic conductor, wherein said metal surface covers at least a portion of a surface of said solid state ionic conductor; providing a second electrode electrically connected to a conductive material, including a metal, metal surface, metal layer or bulk metal; establishing electrical contact between at least a portion of said solid state ionic conductor and said conductive material; and generating an electric field between said first and second electrodes, wherein metal atoms in said metal are oxidized, thereby generating metal ions and free electrons, wherein said metal ions migrate through said solid state ionic conductor to said second electrode where they are reduced and wherein said free electrons migrate to said first electrode, thereby making said structures. In an embodiment, the metal located on a solid state ionic conductor is formed by one of the processed disclosed herein.

The method can further comprise the first electrode that is an anode and the second electrode that is a cathode.

In an embodiment, the electrical contact between said first electrode and said metal is a single point contact. In an embodiment, the electrical contact between said first electrode and said metal is an electrical contact pattern. In an embodiment the electrical contact pattern is generated by a stamping tool. In a further embodiment, the electrical contact pattern is generated by the first electrode having a plurality of features arranged in a selected pattern, and wherein at least a portion of the pattern is transferred to a surface of said metal via localized electrochemical etching. In an embodiment, the metal surface is the top surface of a metal layer having a depth or a thickness that ranges between a few nanometers to bulk The composition, physical state, and physical dimensions of metal layers and/or solid ionic conductors of the present invention are important parameters in patterning methods and systems of the present invention. In a useful embodiment, the metal layer has a thickness selected from the range of about a few nanometers to bulk dimensions (e.g. greater than 1 micron), and the solid state ion conductor has a thickness selected from the range of about 100 nanometers to about bulk dimensions (e.g. centimeters). Useful solid state conductors have an ionic conductivity selected from the range of about 0.001 S/cm to about 500 S/cm and include, but are not limited to, $Ag_2S$, $Cu_2S$, $AgI$, $RbAg_4I_5$, $Ag_3SI$, $AgCuS$, $AgCuSe$, and $Br_4Cu_{16}I_7Cl_{13}$, composite materials, materials that are amorphous solids, semicrystalline solids or single crystalline solids. In some embodiments of the present invention providing large etch rates or deposition rates, a solid state ionic conductor is used having a relatively large ionic conductivity, and in some embodiments of the present invention providing small etch rates or deposition rates, a solid state ionic conductor is used having a relatively small ionic conductivity. The present methods and systems include use of solid state ion conductors that are superionic conductors. Useful metals for the methods and systems of the present invention include, but are not limited to, Ag, Cu, Au, Pb, Zn, and other materials that are conductive. In an embodiment, the metal composition matches the metal composition of the solid state ionic conductor (e.g. Cu and $Cu_2S$). In an embodiment the compositions do not match (e.g., Cu and $Ag_2S$).

In an embodiment, any of the processes and devices provided herein have a solid state ionic conductor that comprises a polymeric electrolyte for patterning metal. In an embodiment the polymer electrolyte is an ionomer or other metal-ion conducting polymer that is capable of transporting metal ions from the metal that is to be patterned. In an embodiment, the polymer electrolyte is commercially available, such as NAFION® material or other material used in solid state electrolyte membrane assemblies such as for fuel cells, for example.

Solid ionic stamps that are polymeric provide numerous advantages including: (a) the ability to cast the stamp into desired pattern (b) compatibility with current soft lithography techniques (c) ability to address multiple materials, depending on salt complex used, (d) the ability to alter metal ion selectivity by re-soaking polymer in a new electrolyte (e) good mechanical strength of stamp (f) good thermal stability of stamp.

In another aspect, the present invention provides an electrochemical stamping tools for etching structures into a metal comprising: (i) a first electrode having a first electric potential; (ii) an ionic conductor having a selected pattern of relief features, wherein the ionic conductor is in electrical contact with the first electrode and wherein at least a portion of the relief features are capable of establishing electrical contact with the metal; and (iii) a second electrode having a second electric potential that is higher than the first electrode.

In another aspect, the present invention provides an electrochemical stamping tool for generating structures on a solid state ionic conductor comprising: (i) a first electrode having a first electric potential; (ii) an ionic conductor having a selected pattern of relief features, wherein the ionic conductor is in electrical contact with the first electrode and wherein at least a portion of the relief features are capable of establishing electrical contact with a metal; and (iii) a second electrode having a second electric potential that is higher than the first electrode, wherein the second electrode is in electrical contact with the metal or is the metal itself.

In another aspect, the present invention provides an electrochemical stamping tool for generating structures on a solid state ionic conductor comprising: (i) a first electrode comprising a plurality of features arranged in a selected pattern, wherein at least a portion of the features are capable of establishing electrical contact with the solid state ionic conductor; and (ii) a metal in electrical contact with solid state ionic conductor. Optional, an electrochemical stamping tool of this aspect of the present invention further comprises an electrode array, wherein electrodes in the array are in electrical contact with the solid state ionic conductor undergoing processing/patterning.

In another aspect, the present invention provides a method of making a structure comprising the steps of: (i) providing a first electrode in electrical contact with a solid state ionic conductor; (ii) providing a second electrode in electrical contact with a metal; (iii) establishing electrical contact between at least a portion of the solid state ionic conductor and the metal; and (iv) generating an electric field between the first and second electrodes, wherein metal in the metal is oxidized thereby generating metal ions and free electrons, wherein the metal ions migrate through the solid state ionic conductor to the first electrode where they are reduced and wherein the free electrons migrate to the second electrode, thereby making the structures; wherein the solid state ionic conductor or the first electrode is a stamping tool that generates a pattern of electrical contacts between the stamping tool and the solid state ionic conductor or the metal.

Any of the methods and devices of the present invention can be used to manufacture or pattern structures useful in any number of devices, including but not limited to a plasmonic waveguide, ring resonator, interferometer, sensor (chemical or biological), antennae, or bulls eye plasmonic lens.

Provided herein are applications of metallic patterning related to high resolution multilayer printed circuits/ceramic conductors for sub-millimeter wave devices. Conventional methods of printing such circuits are screen printing and wet electrochemical etching (see, e.g., www.natelengr.com), which confines the conductor width/spacing at 12 micron or above. Solid state electrochemical printing of silver/copper disclosed herein, provides access to print smaller lines, facilitating the manufacture of lowloss capacitors/waveguides for high speed devices (>100 GHz).

Another application is in the area of local interconnects used in microprocessors. Current chip interconnect are made of copper using a so called dual-damascene process followed by liquid state chemical-mechanical polishing or electrochemical planarization (see for example, http://researchweb.watson.ibm.com/journal/rd/491/west.pdf). This is an 8 step process and very time consuming. Moreover, because the copper interconnects are buried inside brittle ceramic materials (low k dielectrics), mechanical polishing does not offer high yield due to possible cracks and peel-off of copper. Liquid electrochemical planarization, on the other hand, can suffer from depletion of etchant and contamination. Use of solid electrolyte patterning of the local interconnect provided herein offers a unique solution of those process issues.

Other applications relate to plasmonics, photonics and sensing of chemical and biological material. Metallic structures are needed for interdigitated electrodes (IDE) for chemical sensors, the sensitivity of which are greatly enhanced by shrinking the separation between the electrodes. The processes provided herein can shrink these distances to less than 100 nm. In SERS (Surface Enhanced Raman Spectroscopy) and LSPR (Localized Surface Plasmon Resonance), patterned metallic nanostructures are critical to obtain large enhancements of Raman frequencies or shifts of extinction peaks. The metallic patterns generated herein provide a clear enhancement (on the order of $10^4$) of Raman spectrum compared to commercial substrate. Such an improvement facilitates lowering laser power and reducing sampling time, thereby leading to on chip integration and parallel screening.

A particularly useful structure generated by the present invention includes a nanowire, including a nanowire having a tunable resonance frequency by incorporating the nanowire with the $S^4$ (solid-state superionic stamping) process of the present invention. In an embodiment, the generated structure is a plurality of nanowires having a nanowire density selected from the range of 40,000 nanowires/cm$^2$ to 55,000 nanowires/cm$^2$ and each nanowire having a cross-sectional dimension selected from the range of about 40 nm to about 100 nm. Each nanowire is tunable by providing a solid state ionic conductor bridge region that divides each nanowire into two regions. Connecting one nanowire region to a first electrode, and the second nanowire region to a second electrode, and applying a potential difference or bias across the bridge region, causes longitudinal migration of the bridge along the length of the wire, thereby tuning the resonance frequency of the nanowire.

In another embodiment, the invention is a device that incorporates the basic solid-state ionic conductor configuration of the present invention and includes but is not limited to: actuators, plasmonic waveguides, plasmonic sensors, or tunable nanowire-based terahertz resonators/antennae. In an aspect, the actuator has a solid state ionic conductor between a pair of electrodes that are capable of establishing a potential difference or of receiving a bias from a power source. This aspect is capable of using any means for establishing a potential difference between the pair of electrodes, such as by applying electric potentials to each electrode via a voltage source or voltage sources, such that a voltage bias is generated between electrode pair. In response to the electric potential difference between the electrodes, ions migrate to one electrode, causing a strain deformation in the actuator. In an embodiment, the actuator is made from any of the materials disclosed herein, including a solid state ionic conductor made from $Ag_2S$, $AgI$, $RbAg_4I_5$, $Ag_3SI$, $AgCuS$, $AgCuSe$, $Br_4Cu_{16}I_7Cl_{13}$, or $Cu_2S$ and with optional metal layer comprising a conductive metal such as Ag or Cu on at least a portion of the top surface, bottom surface or the top and bottom surface. A preferred geometric actuator configuration is a cantilever. "Cantilever" refers to a generally beam-like configuration wherein the length of the device is greater than the width.

In an aspect, the invention is an ionically-tunable nanowire terahertz antenna. This antenna has a plurality of nanowires, wherein each nanowire has a first end electrically connected to a common base, a second end electrically connected to a via, and a superionic conductor bridge region between the nanowire ends. A dielectric material that electrically isolates each nanowire from other nanowires surrounds at least a portion of the nanowires, thereby ensuring each nanowire is capable of independently receiving an electric bias across the bridge region. In this aspect, the antenna is tunable by adjusting the position of the superionic conductor bridge region by applying an electric potential across the bridge region. The antenna optionally comprises a first electrode electrically connected to the common base and a second electrode electrically connected to the via. In the aspect where each of the nanowires are individually addressable with an electric potential, each of nanowire via connections are electrically connected to an individually-addressable electrode capable of applying a potential independent of the potential supplied by any other electrodes. The antenna is made from any of the materials disclosed herein, such as a nanowire that is a metal selected from the group consisting of Ag, Cu, Au, Zn, and Pb; and a superionic conduct bridge region made of a solid state ionic conductor selected from the group consisting of $Ag_2S$, $AgI$, $RbAg_4I_5$, $Ag_3SI$, $AgCuS$, $AgCuSe$, $Br_4Cu_{16}I_7Cl_{13}$, and $Cu_2S$. The antenna is optionally characterized by certain physical parameters that are useful in providing antenna having improvide properties, such as tuning resolution and speed. For example, the speed with which individual nanowires are tuned is related to the longitudinal velocity of the bridge region position along the nanowire. In an aspect, this velocity is characterized as capable of being adjusted at a rate between 70 um/s and 110 um/s under an electric potential of about 2 V.

BRIEF DESCRIPTION OF THE DRAWINGS

1e). FIGS. 1b-d illustrate building of nanostructures by deposition. FIG. 1e illustrates reversing the electric potential builds nanostructures by etching metal overlaying the solid state ionic conductor. The direction of the current is indicated by the arrows showing the flow of electrons ("e−").

FIG. 2 comprises five frames: frame 1 is an AFM photograph the surface of the $Ag_2S$ before the process; frames 2-5 are AFM images of the surface after each line in the asterisk is drawn.

FIG. 11A provides a graphical representation of cyclic voltammetry to monitor the stamp etching process conditions. FIG. 11B is an SEM image of a cross-section of the $Ag_2S$ stamping tool, revealing directional formation of silver nanowires at a scale <100 nm.

FIG. 12A is a schematic showing a cathode-anode pair, with an $Ag_2S$ shaped stamping tool in electrical contact with, and positioned between, the cathode and Ag film. FIG. 12B is an SEM image of an $Ag_2S$ stamping tool prepared by Focused Ion Beam (FIB) milling (scale bar 5 um). FIG. 12C is an SEM image of a sub-micron line etched out of an Ag metal (scale bar 5 um).

FIG. 16A shows a metal (Ag) and a solid state ionic conductor ($Ag_2S$) having a three-dimensional surface (e.g. the stamp) that are not in electrical or physical contact. FIG. 16B shows the stamping process, wherein only a portion of the stamp surface and metal are in electrical contact. There is a detailed view of the boxed region showing that where the $Ag_2S$ and Ag are in contact, oxidation of metal on the metal surface occurs, but substantially no oxidation occurs on the metal surface that is not in contact with the $Ag_2S$ conductor. After the stamping process is complete, the stamp is removed from the metal leaving a three-dimensional pattern in the surface of the metal, as shown in FIG. 16C.

FIGS. 24B and D are corresponding patterns obtained after contacting the stamp with the copper metal. The scale bar in A and B represents 2 μm and the scale bar in C and D represents 5 μm.

FIG. 29A is a photomicrograph of a plasmonic sensor having a bulls-eye configuration. FIG. 29B is a schematic illustration of the sensor configuration in which the sensor is exposed to radiation having a wavelength $\lambda_o$. FIG. 29C is a detailed view of FIG. 29B illustrating that binding events changes the index of refraction and leads to a detectable wavelength shift $\Delta\lambda_{sp}$ (see FIG. 29D) The exemplified small Footprint Plasmonic Chemical Sensor, patterned by $S^4$ process, has: center hole diameter=250 nm; pitch=510 nm; corrugation depth=50 nm (dimensions based on perturbation theory [Popov et al, 2005]).

FIG. 32A is a top view; FIG. 32B is a side view.

FIG. 33A illustrates deformation upon application of an electric potential difference across the solid state ionic conductor as a result of concentration of charged ions and FIG. 33B is the resting state of the actuator without an applied electric potential difference wherein charged ions are distributed throughout the ionic conductor.

FIG. 46 provides examples of patterning results using Nafion. A and B are silver and copper films, respectively, etched with a Nafion stamp embossed with 1.2 μm squares. C. Silver film patterned using Nafion film with 20 nm gold etch stop.

FIG. 47 shows various metals patterned with an electrolyte stamp that is Nafion. A. Ag; B. Cr; C. Au; D. Cu; E. Ti.

DETAILED DESCRIPTION OF THE INVENTION

Figure 1:
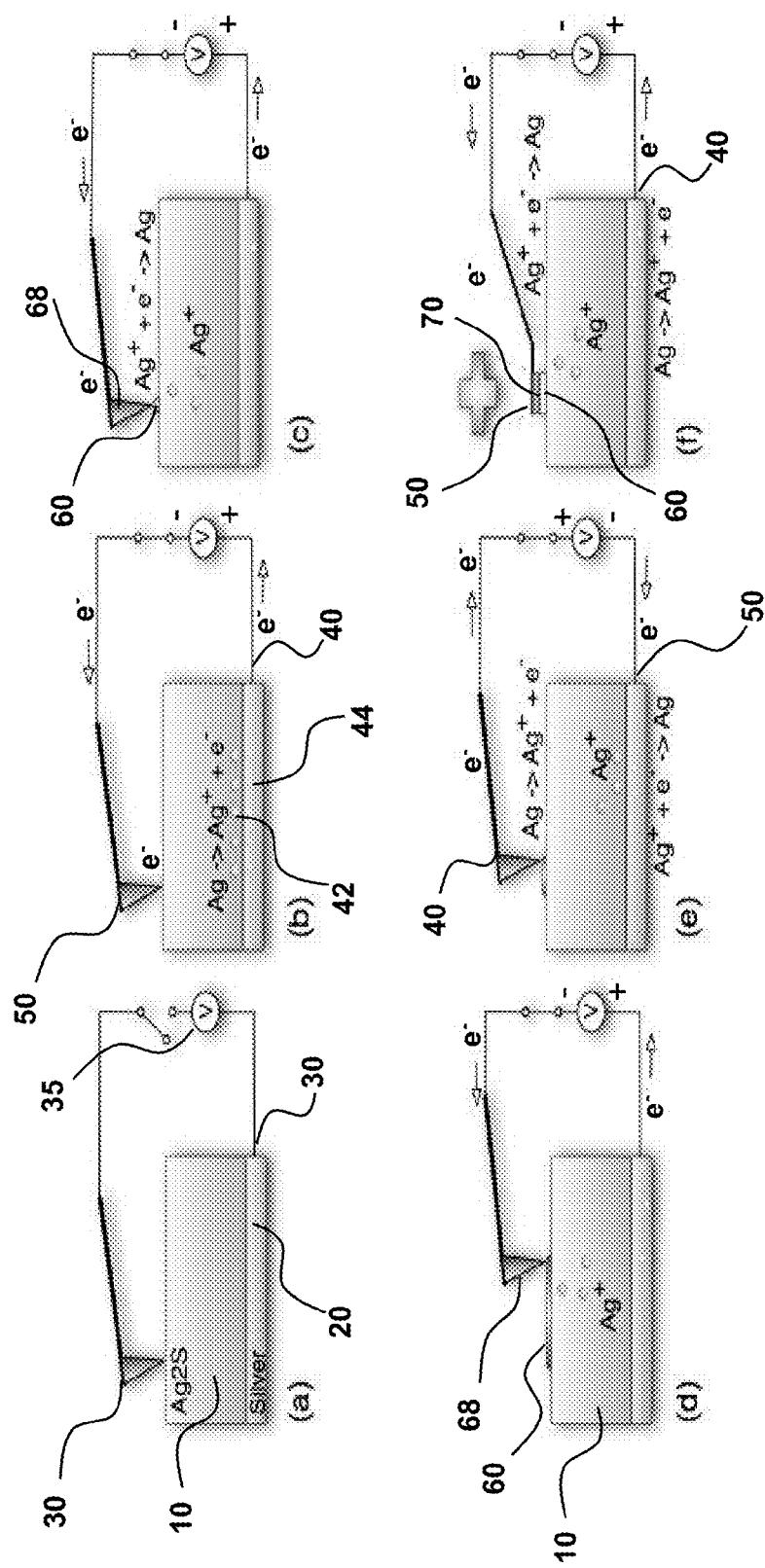
FIG. 1 provides a schematic diagram illustrating a general system without electric potential (FIG. 1a), a deposition system (FIGS. 1b-d), an etching system (FIG. 1e), and an electrochemical patterning system (FIG. 1f) for generating nanostructures. In this embodiment, the solid state ionic conductor is $Ag_2S$, the metal is silver, and the anode and cathode are connected to a power supply with reversible polarity so that the location of the anode and cathode change from the bottom and top, respectively (FIGS. 1b-d) to the top and bottom (FIG.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

As used herein, "structure" is used broadly to refer to formation of patterns, including recessed, relief, or a combination of recessed and relief patterns. A recessed pattern refers to a pattern that is formed by etching a surface, such that channels and/or depressions are formed on the surface. This is also commonly known as "top-down" manufacture. A relief pattern is one that is formed by deposition of material onto a surface to form a pattern. This is also commonly known as "bottom-up" manufacture. The structure can be a three-dimensional pattern, having a pattern on a surface with a depth and/or height to the pattern. Accordingly, the term structure encompasses geometrical features including, but not limited to, any two-dimensional pattern or shape (circle, triangle, rectangle, square), three-dimensional volume (any two-dimensional pattern or shape having a height/depth), as well as systems of interconnected etched "channels" or deposited "walls." In an embodiment, the structures formed are "nanostructures." As used herein, "nanostructures" refer to structures having at least one dimension that is on the order of nanometers to microns. In an embodiment the nanostructure has at least one feature that is on the order of tens of nm. For example, the width of the line can be on the order of 10's to 100's of nm and the length can be on the order of microns to 1000's of microns. In an embodiment the nanostructure has one or more features that range from an order of tens of nm to hundreds of nm. The structures made by the present invention are optionally used within devices useful for generating forces (actuators), providing optical control capability (waveguides, plasmonic sensors), or controlling THz frequency generation and reception (e.g., resonators, antennae).

A "pattern of structures" refers to a plurality of structures that are deposited and/or etched on a surface by a stamp or stamping tool. Accordingly, the term encompasses a plurality of geometrical features etched onto a surface, as well as a plurality of geometrical features deposited onto a surface. The present methods and system are capable of generating patterns of structures having well defined and selected physical dimensions, spatial orientations and positions.

A "stamp" or a "stamping tool" refers to a material having a surface that is shaped for etching and/or depositing a pattern of structures. Accordingly, the stamping tool can have one or more recessed features and/or one or more relief features that define the stamp's "shaped surface." The stamping tool facilitates pattern transfer from the stamp surface. The stamp's "shaped surface" is a three-dimensional shape on the surface that makes electrical contact with a metal surface and, in particular, an electrical contact that is a "pattern of electrical contacts." In an embodiment, the composition of the stamping tool comprises a solid-state ionic conductor. In an embodiment, the stamping tool comprises one or more features on an electrode. A feature on an electrode is a shape that provides an electrical contact pattern. Depending on the process, and in particular the direction of the electric field (e.g. relative electric potentials of the electrodes), the stamping tool can deposit metal structures on a substrate surface to make a relief pattern of structures, or the stamping tool can etch a metal surface to make a recess pattern of structures that correspond to the stamp relief features. In an embodiment, the generated structure comprises both a relief structure and a recess structure. The stamping tool relief features can be constructed by methods known in the art, including by focused ion beam milling. The surface of the stamp that makes electrical contact with a conducting surface can have any shape, including substantially planar, curved, or a combination of planar and curved, The dimensions of the relief feature can be microsized, nanosized, or both microsized and nanosized. A feature is microsized if it has dimensions on the order of greater than microns. A feature is nanosized if it has any one or more dimensions on the order of less than about one micron. In an embodiment, a nanosized feature is less than about 100 nm. A "lateral dimension" refers to a distance that is parallel to the interaction surface of the stamping tool and solid ionic conductor or the stamping tool and the metal. A "vertical dimension" refers to the height of the relief feature.

"Electrical contact" refers to the configuration of two or more elements such that a charged element is capable of migrating from one element to another. For example, a cathode in electrical contact with a solid state ionic conductor permits a metal ion to migrate from the interior of the solid state ionic conductor to the region between the surface of the cathode and the surface of the conductor, where the metal ion is reduced. Similarly, an anode in electrical contact with a metal permits free electrons released due to metal atom oxidization to flow from the metal to the anode. Accordingly, electrical contact encompasses elements that are in "physical contact." Elements are in physical contact when they are observable as touching. Electrical contact also includes elements that may not be in direct physical contact, but instead may instead have an intervening element, such as an electrolyte or a conductive material, located between the two or more elements. Accordingly, electrical contact encompasses an electrode and a solid state ionic conductor, wherein metal is deposited and reduced between the surface of the electrode and the solid ionic conductor.

"Pattern of electrical contacts" refers to a pair of surfaces that have regions of electrical contact and regions of no electrical contact. For example, in the processes disclosed herein, a stamping tool of the present invention is said to have a "pattern of electrical contacts" with a metal so as to generate an etched structure. In an embodiment, the pattern of electrical contacts corresponds to a pattern of physical contact between the stamping tool and the surface to be etched. In an embodiment, the pattern of electrical contacts corresponds to a pattern of physical contact between the stamping tool and the substrate surface on which the deposited metal rests. The process of reducing ionized metal atoms at the interface between the stamp and solid state ionic conductor is referred to as "electrochemical deposition." The process of oxidizing metal at the physical contact pattern between the stamping tool and the metal surface is referred herein as "electrochemical etching." Accordingly, the stamp or stamping tool is also referred herein as an "electrochemical stamp," wherein the stamping tool can be used to etch or deposit metal.

"Localized electrical deposition" refers to deposition that is substantially restricted to an area defined by a region between the stamping tool and the solid state ionic conductor. Outside this region, substantially no reduction of ions, and corresponding deposition, occur. In an embodiment, substantially no reduction refers to a region outside the physical contact area between the stamping tool and metal or stamping tool and solid state ionic conductor.

The stamp and/or the stamping tool has mechanical attributes and characteristics, including Young's modulus, compressibility modulus, conductivity, flexural rigidity, that are optimized as known in the art to ensure suitable structures are obtained from any of the processes disclosed herein. In an embodiment, a separate element such as a rubber or other elastomeric material, is incorporated into a stamping tool to ensure that as the deposition and/or etching process proceeds, physical contact is maintained between the stamp and surface during etching and/or deposition. In an embodiment, a force actuator is connected to the stamping tool for applying a constant and uniform force, and corresponding pressure, between the stamping tool and solid state ionic conductor or metal throughout processing. A force is said to be uniformly applied to a surface such that the pressure distribution between the stamping surface and metal is substantially uniform, thereby ensuring the stamping tool remains level relative to the metal. In other words, the etch rate is uniform over the metal surface, and is independent of location on the metal surface. In addition, a uniform force ensures continued physical contact between the stamping tool and the etched metal throughout the etching process.

"Cathode" and "anode" have their art-recognized meanings. An anode is an electrode where oxidation occurs and a cathode is where reduction occurs. An anode and cathode form an electrode pair where, when each are charged to different electric potentials and used in a process disclosed herein, redox reactions occur. The cathode and anode are made from materials known in the art. In an embodiment the cathode and anode are platinum. The electrodes are each electrically connected to a power supply, so that electrons generated at the anode travel to the cathode.

An aspect of the invention is a solid-state superionic stamping ("$S^4$") process, device, or device component. $S^4$ uses a solid-state ionic conductor to make structures, including structures that can be used in a variety of devices, such as sensors, actuators, plasmonic waveguides and other optical devices. Structures patterned by the present invention are optionally incorporated in additional $S^4$ components and processes to obtain devices with controllable properties (e.g, resonators, antenna, waveguides, etc.).

A "solid state ionic conductor" refers to a material that is in a solid-state and can conduct ions. The solid state ionic conductor functions as a membrane that separates the anode from the cathode, such that at least a portion of the oxidized metal travels from the anode, through the solid ionic conductor, to the cathode surface. Preferred solid state ionic conductors have the property of being fast and selective conductors of a metal ion. The solid state ionic conductor has an ionic conductivity so that patterned structures are obtained. For example, the ionic conductivity can be between about 0.001 to 500 $S/cm^2$, wherein the ionic conductivity is selected so as to obtain a desired etch rate. The solid state ionic conductor includes any materials that are solid-state and selectively conduct metal ions. For example, the solid state ionic conductor encompasses materials that are amorphous solids, have grain boundaries, electroactive polymers, composites and/or comprise single crystalline materials. Polymers and glasses can also comprise solid state ionic conductor. The solid state ionic conductor can comprise a composite material having a mobile ionic conductive phase embedded in a host matrix, such as a polymer electrolyte. Useful solid state ionic conductors of the present invention include a mobile ionic conductive phase in a polymer or glass host matrix and include nano particle composite materials. The solid electrolyte can comprise those disclosed in U.S. Pat. Pub. No. 2003/0044687 (a first binding polymer and a second polymer composed of alkali metal ion conducting polymers), U.S. Pat. No. 6,165,705 ($MAg_4I_5$, where M is a monovalent cation), others known in the art, including but not limited to, $Ag_2S$, $AgI$, $RbAg_4I_5$, $Ag_3SI$, $AgCuS$, $AgCuSe$, $Br_4Cu_{16}I_7Cl_{13}$, and $Cu_2S$, and polymer electrolytes including, but not limited to, NAFION®.

"Potential difference" refers to a cathode and anode having different electric potentials to generate an electric field, such that electrons migrate to the anode, and ions selectively migrate from the anode to the cathode via a path through the solid state ionic conductor positioned between the anode and cathode.

"Metal," "Metal film" or "metal layer" refers to a metal or a metallic alloy material having a surface where oxidation and/or reduction may occur. In an embodiment, the metal is an integral part of the electrode such that the metal is at least a portion of the electrode. In an embodiment, the metal is a metal surface of a metal film, bulk metal, metal substrate, metal particle, metal cluster, metal composite or metal layer that is electrically connected to the electrode. In an embodiment, the metal is a bulk metal. "Bulk metal" refers to a metal that is shaped so that it has dimensions on the order of microns and higher. A dimension referred to as "bulk" has a length on the order of microns and higher. In an embodiment the metal is adjacent and covers at least a portion of a substrate. In an embodiment, the substrate provides structural support to a metal and assists in positioning the metal relative to the counter electrode or the stamping tool. In an embodiment, the substrate comprises chrome or glass. In an embodiment, the substrate comprises a translucent material, or a window, to assist in optical visualization of the process. In an embodiment, the substrate is a solid state ionic conductor. In an embodiment, the thickness of the metal layer is between about 10 nm and 5 mm. In an embodiment, the thickness of the metal layer is between 10 nm and 1 μm. In an embodiment, the thickness of the metal layer is between 10 nm and 500 nm. In an embodiment, the thickness of the metal layer is about 200 nm. In an embodiment the metal layer comprises Ag, Au, or Cu. In an embodiment, the metal layer is Ag.

A metal ion is said to "migrate through" the solid ionic conductor under an electric potential when the metal ion travels from the surface of the metal in electrical contact with the anode to the surface of the cathode by a path within the solid ionic conductor.

An "individually addressable electrode" refers to an electrode that comprises an array of electrodes, wherein each member of the array is independently controllable. Independently controllable refers to an electrode having a potential that can be varied independently of the potential of other electrode array members. An individually addressable electrode is accordingly reprogrammable and reconfigurable, such that a single stamp or stamping tool can be used to generate different structures, and provide a user more control over generated structures. Individually addressable electrodes permit pattern transfer that is programmable and/or scalable. A programmable, reprogrammable and/or scalable electrode array permits a single stamping tool to be variable configurable such that a single stamp can create any number of patterns by electronically controlling the electric potential distribution across the surface of the stamp. A programmable, reprogrammable and/or scalable electrode array is capable of generating different, independently selectable patterns on surface or in materials using the same stamping tool.

A stamping tool is said to have features of "substantially the same voltages" when there is less than about 5% voltage variation between features, including less than about 1% voltage variation between features. A stamp having features of "substantially different voltages" refers to a voltage variation of any one or more feature being greater than 1%, including greater than 5%.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods for making patterns, including micropatterns, nanopatterns and a combination of micro and nanopatterns. The present invention provides methods of patterning by electrochemical stamping, to provide relief and/or recess features directly to a metal surface or metal overlaying a substrate surface, wherein the substrate surface is a solid state ionic conductor.

FIG. 1 provides a schematic diagram illustrating a side view of a pair of electrodes, between which lie a solid state ionic conductor (e.g. $Ag_2S$) and a metal (e.g. Ag). A distinct property of solid-state ionic conductors is that an electric field can induce ion migration resulting in mass transport, providing the mechanism of electrochemical deposition and etching, including structures having nanoscale to microscale dimensions. Some examples of solid-state ionic conductors are copper sulfide ($Cu_2S$), silver iodide (AgI), silver sulfide ($Ag_2S$), etc. FIG. 1 shows the basic schemes for electrochemical patterning. A silver film 20 (connected to one electrode 30) is separated from the counter electrode 30 by a solid electrolyte 10, silver sulfide for example. Under an electric field generated by a power supply 35 (see FIG. 1(b)), silver atoms at the silver substrate 20 are oxidized into silver ions 42 and electrons 44. While electrons move to the anode electrode 40 and then the cathode electrode having higher potential 50, mobile silver ions 42 migrate through the conduction channels formed by the accumulation of defects in the ionic conductor bulk 10 to the counter electrode 50 where, with the available electrons, they are reduced back to silver atoms 60 (see FIG. 1(c)) to form a metallic nanostructure. This is depicted in FIGS. 1(b)-(d). The bias between sample 20 and electrode 50 is such that the redox reaction takes place at two interfaces, one between silver sulfide 10 and the underlying silver film 20, the other between electrode 50 and silver sulfide substrate 10.

FIGS. 1(d)-(f) depict producing metallic nanostructures by a writing tool 68. FIG. 1(d) shows the writing feature of a sharp tip electrode 68 that deposits Ag 60 on an $Ag_2S$ substrate surface 10. FIG. 1(e) shows the erasing feature of a sharp tip electrode by moving the sharp tip electrode under a reverse electric field such that the cathode 50 and anode 40 reverse relative to writing scheme depicted in FIGS. 1(b)-(d), such that a portion of the metal layer 60 is erased. FIG. 1(f) illustrates the use of a stamp 70 connected to a cathode 50 for single-step production of a patterned deposited structure 60 on the surface of the solid state ionic conductor 10.

Figure 2:
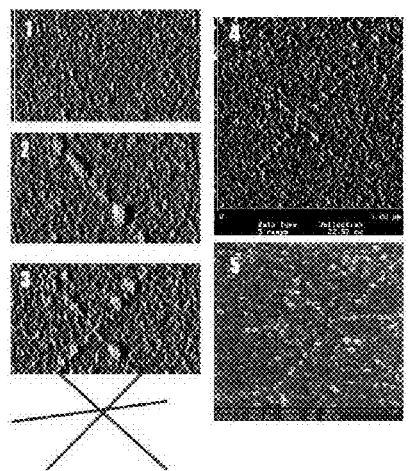
FIG. 2 provides atomic force microscopy (AFM) micrographs illustrating the writing and dissolution of silver structures using the scheme depicted in FIGS. 1b-e using an AFM electrode.
Figure 3:
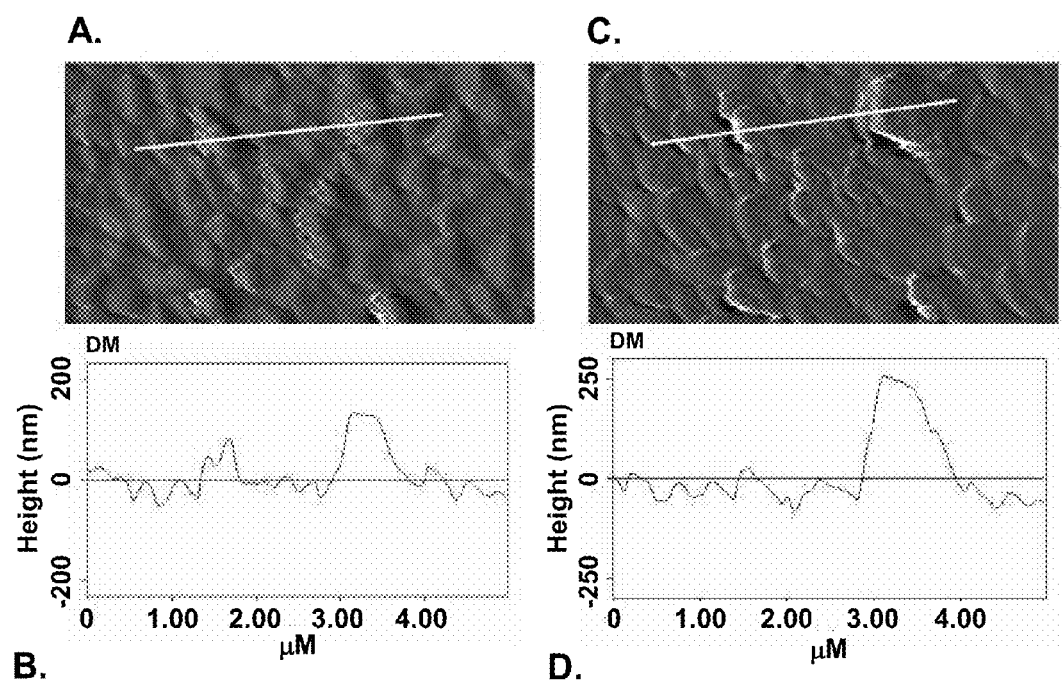
FIG. 3 provides atomic force microscopy (AFM) photographs (FIGS. 3A & C) and corresponding height measurements (FIGS. 3B & D) illustrating the dissolution and growth of silver structures. The lines in A and C track the positions at which heights are measured in B and D. The silver clusters are written to a height of about 250 nm (see B and D) and dissolved to a height of about 150 nm (see A and C).

FIGS. 2 and 3 show AFM images of the results obtained using the process summarized in FIG. 1. FIG. 2 demonstrates use of the process to write a silver asterisk by a sequence of lines as shown. Panel 2 contains a single silver line, panel 3 contains two lines forming an X shape, Panels 4 and 5 show the three lines forming an asterisk. FIG. 3 shows the growth and dissolution of a silver pillar by reversing the electric field. The silver structure was grown to 250 nm (FIGS. 3C and 3D) and then dissolved to 150 nm (FIGS. 3A and 3B).

Figure 4:
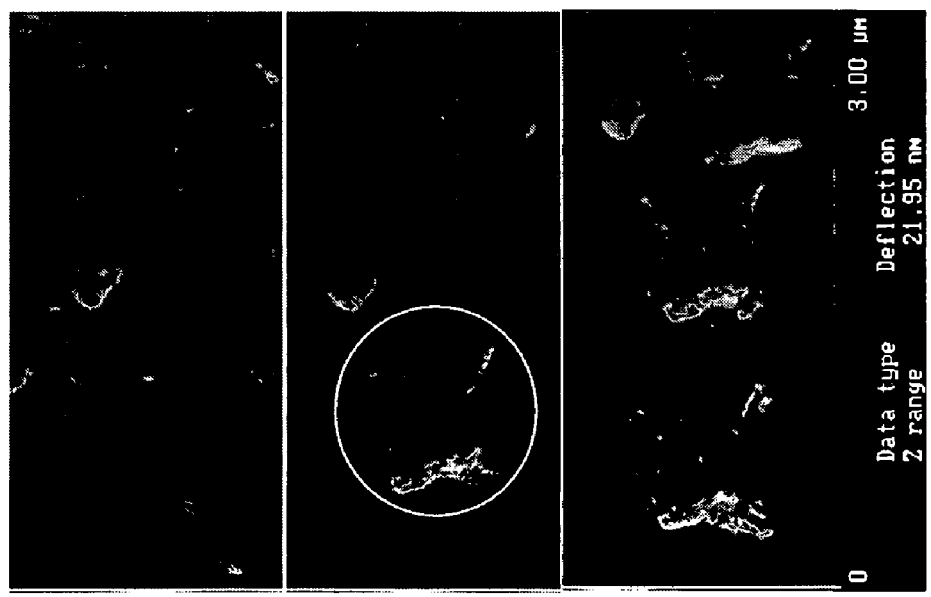
FIG. 4 shows AFM images of electrochemical stamping of silver structures on $Ag_2S$ with a stamping tip using the scheme shown in FIG. 1f. The top panel (A) shows the $Ag_2S$ surface prior to stamping, the middle panel (B) shows one stamped nanostructure (see structure within the highlighted circle), and the bottom panel (C) three replicated nanostructures.

FIG. 4 shows the results for a process using silver metal and a silver sulfide solid state ionic conductor. A silver microstructure is circled in FIG. 4B. Additional silver microstructures are drawn out of the silver sulfide sample by a charged AFM tip, with three such structures shown in FIG. 4C.

Stamping experiments implement the concept depicted in FIG. 1(f), wherein an electrode with a desired pattern is brought into contact with a metal surface. With an electric field generated between the anode and the cathode and across the solid ionic conductor, repeated metal structures are drawn out of the ionic conductor and deposited on its surface. In an alternate embodiment, a pre-patterned solid state ionic conductor stamp is placed in physical contact with a metal, and electrical potential with the correct polarity applied (e.g. silver having a higher potential than the anode that is connected to the stamp). Under this electrical potential, the metal atoms on the substrate in immediate contact with the stamp are ionized into mobile metal ions that migrate into the stamp and free electrons that move through the remaining metal to the anode. Accordingly, only the portions of the metal in contact with the stamp are etched. The etching process proceeds until substantially all the metal atoms making up the film are oxidized and absorbed into the stamp, revealing an optional underlying chrome film or the process is ended by terminating the applied electric field. Any connection, so long as continued conductivity is maintained during the process, is encompassed by the present invention.

Figure 5:
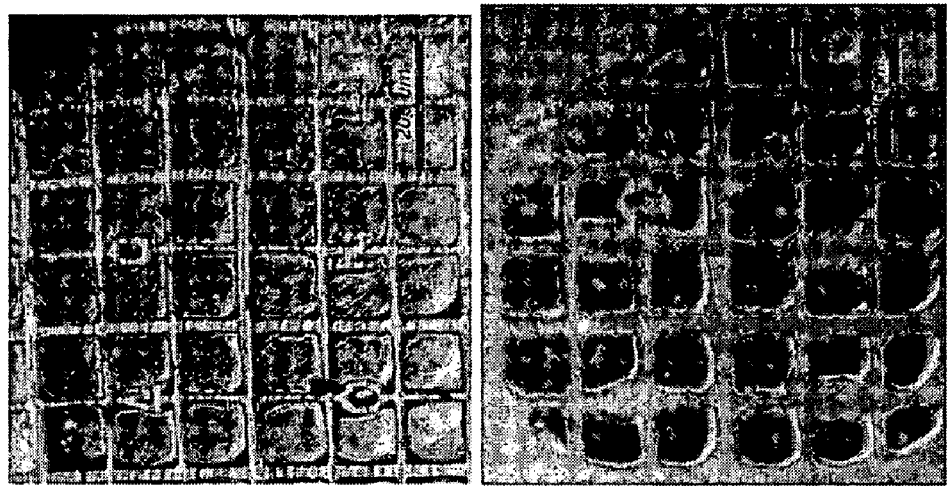
FIG. 5 shows optical images of large-area electrochemical stamping with micrometer resolution. The top panel (A) shows the silver sulfide stamping tool and the bottom panel (B) shows the etched silver film. The bar is 200 μm.

FIG. 5 is an optical microscopy image of one such patterning process. FIG. 5A shows the pattern of the silver sulfide stamp. FIG. 5B is the corresponding pattern etched into the surface of a silver film. The stamp is cut out of a silver sulfide crystal and pressed between two flat parallel surfaces to maximize the contact between the silver film and the stamp. The stamp is pre-patterned with a grating pattern on one side, and secured to a platinum electrode on the other, and mounted on a column. The patterned face of the stamp is brought in contact with a glass substrate having a 100 nm layer of silver deposited over a layer of chrome using a mild pressure and corresponding force. An elastomer material (see element 75 in FIG. 12A) is optionally inserted between the column and the electrode and initially compressed by the pressure between the stamp and the contact. This elastomeric material serves as a compliant mechanism that gradually relaxes to maintain good contact between the stamp and the substrate as the silver layer is etched during the electrochemical process. Application of a constant force or pressure ensures steady contact is maintained between the stamp and the metal thereby maximizing the resolution and repeatability of generated structures. Suitable elastomeric materials including, for example, rubber, are commercially available. Commercially available polymer-based visco-elastic material include, for example, Sorbothane®, and PDMS or other silicone rubbers. In an embodiment, the force actuator comprises an compressible elastomeric material.

Figure 6:
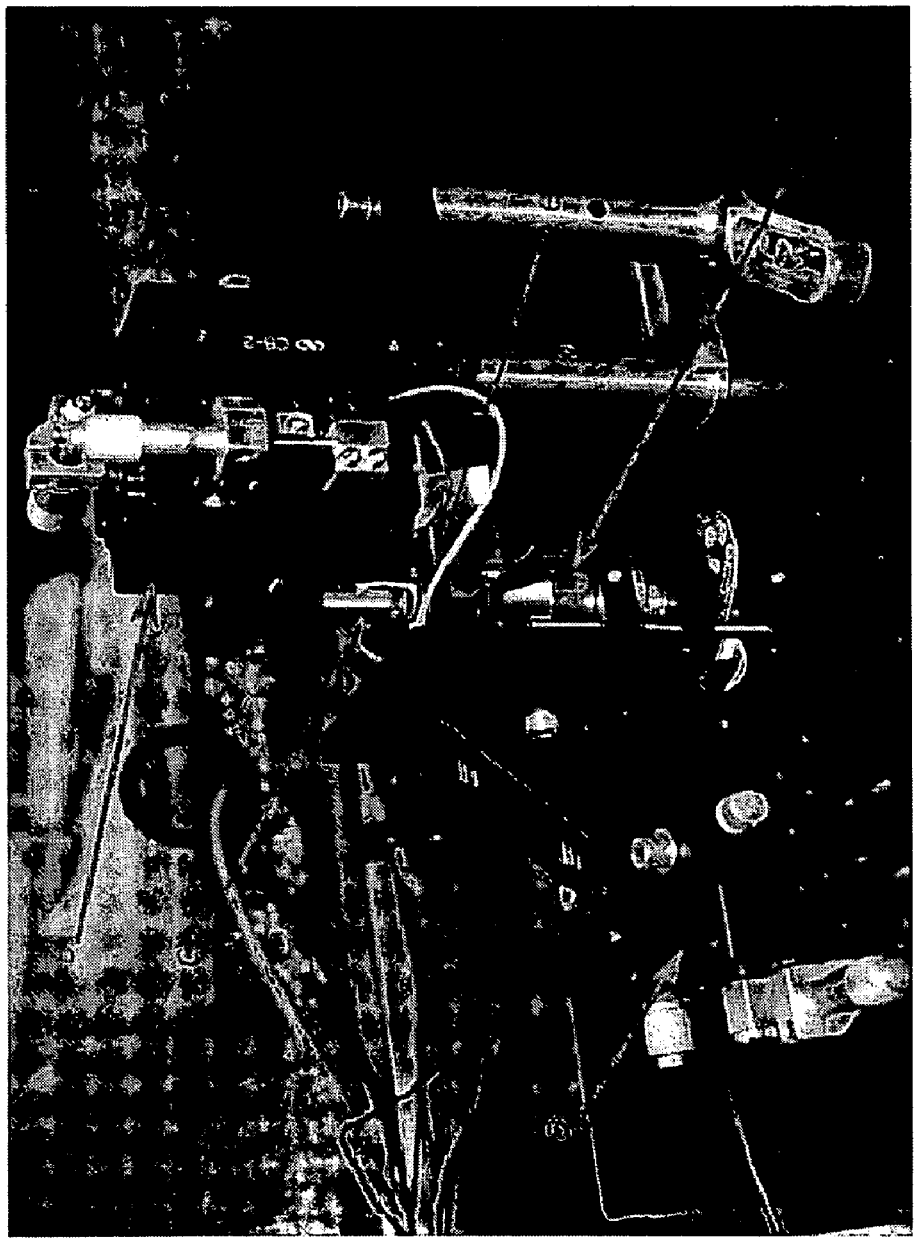
FIG. 6 is a photograph of a system for electrochemical stamping. Positioning stages are labeled (a) and (b). Electrodes are labeled (c) and (e). Optical microscopy for process monitoring is labeled (d).

FIG. 6 shows a system used for an etching procedure. An optical microscope is placed underneath the glass sample stage to image the bottom surface of the glass sample. The entire etching process is monitored by observing the color change of the contact area between the film and the stamp due to the change of the thickness of the silver film. Electric current and time are also monitored and synchronized with the digital video captured through the microscope. This combination of quantitative (current and time) and qualitative data acquisition (video image, color monitoring) allows visual events to be matched with current changes, thereby permitting a more in-depth analysis of the electrochemical process. The color of the area against which the stamp is pressed changes gradually, as observed by the optical microscope, indicating the change of the thickness of the silver film as etching proceeds. The final color when etching is complete is blackish, as shown in FIG. 7.

Figure 7:
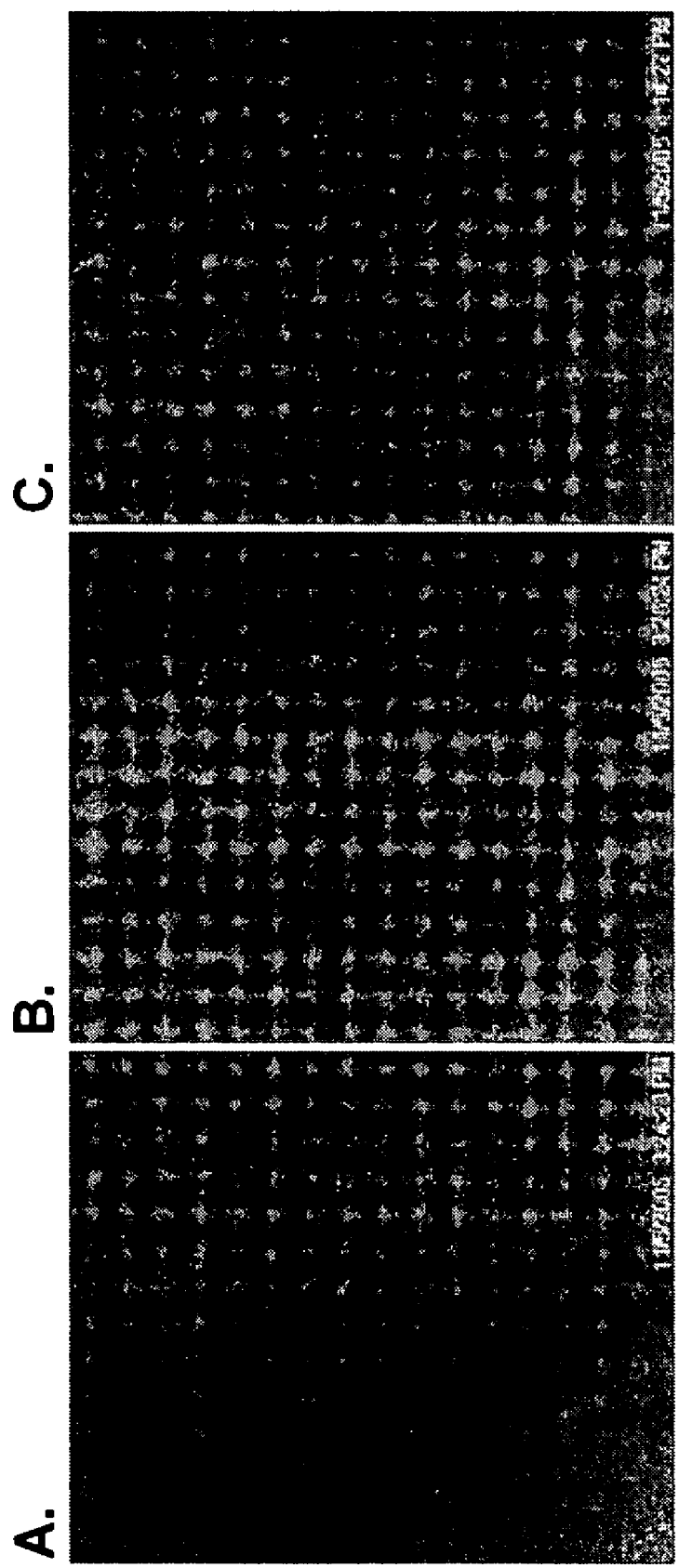
FIG. 7 is a time-lapsed sequenced of optical microscope image of solid-state electrochemical stamping as produced by the system of FIG. 6 using a silver sulfide stamping tool on a Ag surface on chrome on glass. A is prior to stamping; B is an intermediate stage; and C is when stamping is substantially complete.
Figure 8:
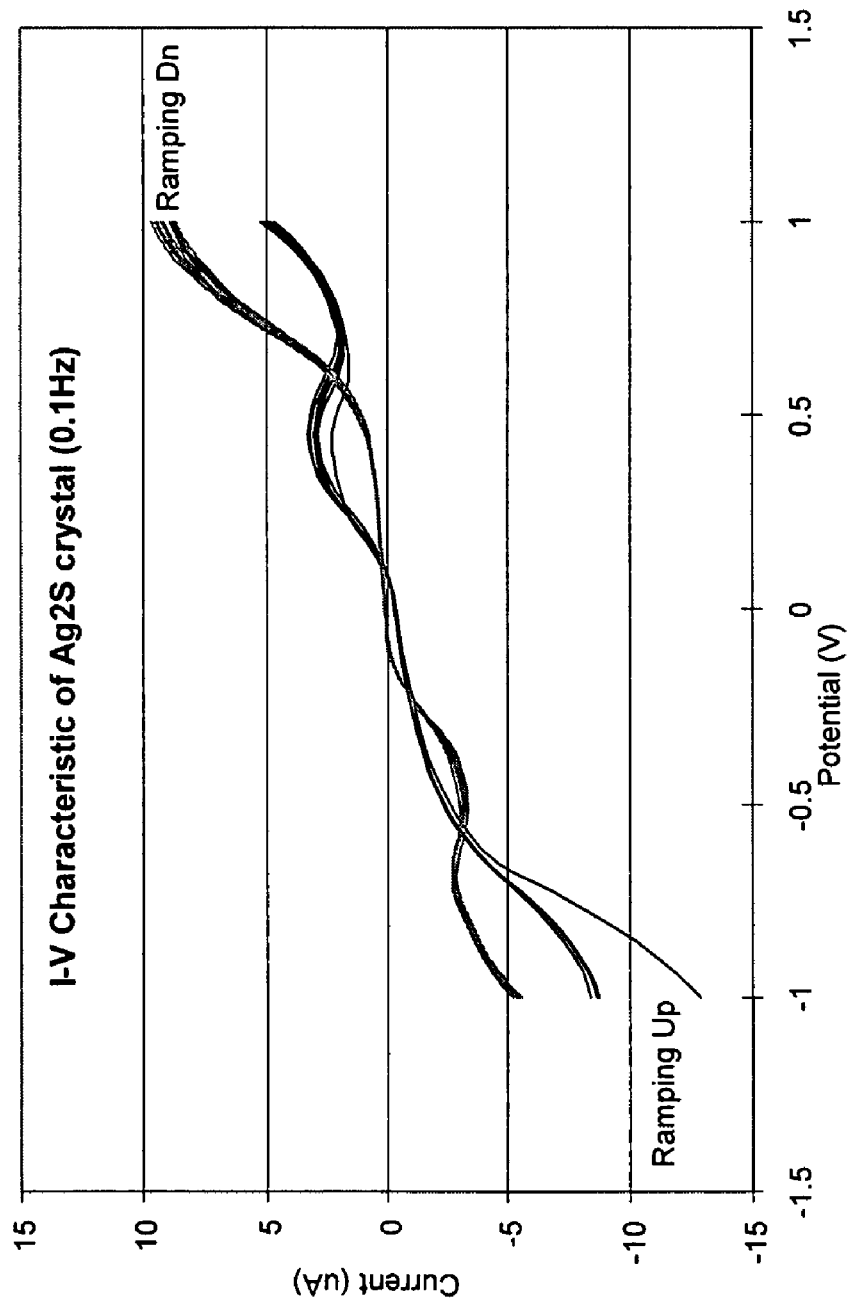
FIG. 8 is a cyclic voltammetry characterization of a silver sulfide stamping tool to determine typical redox potential of $Ag/Ag^+$. The black lines are ramping up and the red lines are ramping down, as indicated in the legend.
Figure 9:
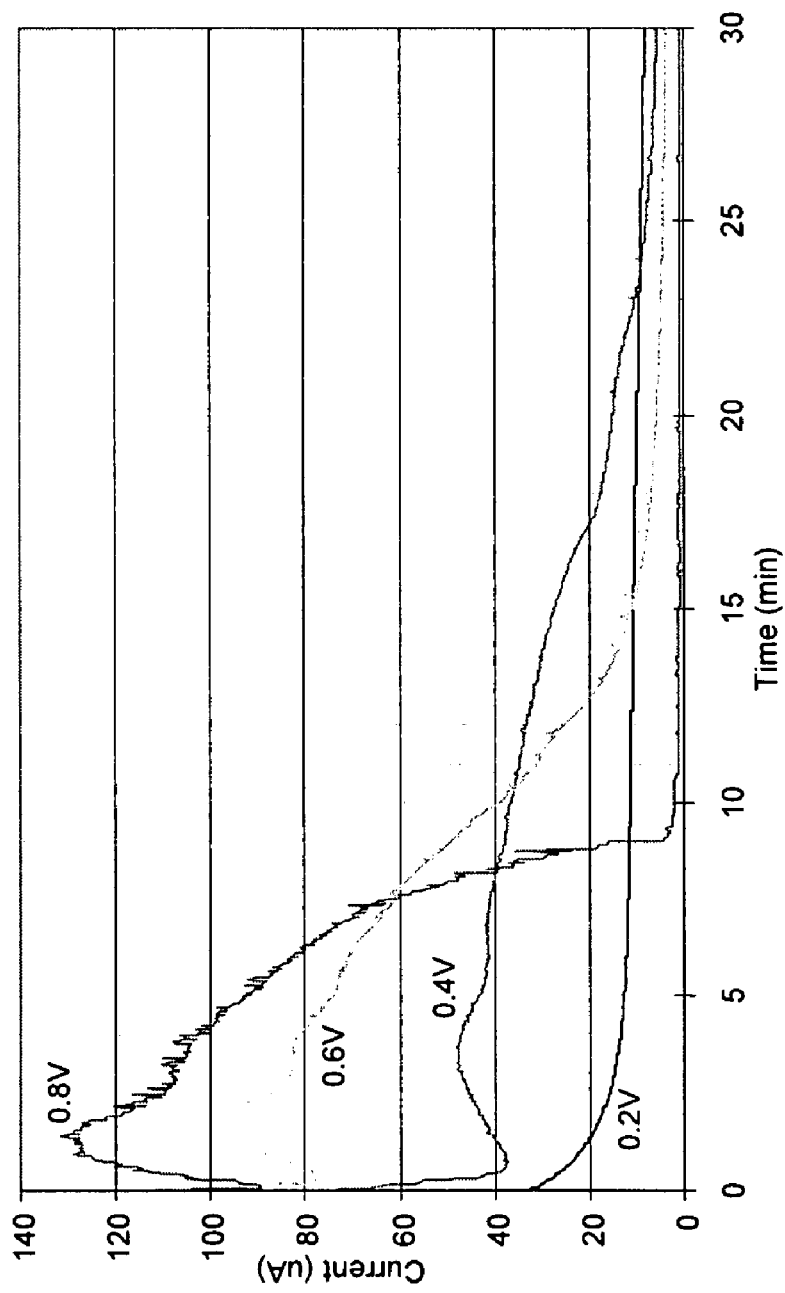
FIG. 9 provides a series of current as a function of time for metal etching with a silver sulfide stamping tool for four different voltages as indicated.

FIG. 7 is a series of time-lapse images of the stamping process. In this experiment, FIG. 7A shows an image immediately prior to etching, FIG. 7B is midway through etching (about 12 minutes) and FIG. 7C when etching is substantially complete (about 50 minutes). Prior to the film etching, a cyclic voltammetry characterization of the silver sulfide stamp is performed, the results of which reflect the typical redox potential of Ag/Ag$^+$ (see FIG. 8). The increase starting at the valley signifies the onset of redox reactions in the contact surfaces between the silver film, stamp, and the electrode. The area under the curve reflects the Gibb's free energy required to propel this etching process. FIG. 9 shows the change in current over time of the stamping process for four different electric potential differences (0.2V, 0.4V, 0.6V and 0.8V). The current drop during the first few seconds reflects generation of a silver concentration gradient in the stamp that increases the resistance to ionic conduction of the silver ions.

These experiments validate the feasibility of transferring a pattern from a stamping tool to the surface of a metal, metal layer or a metal film, using electrochemistry. As discussed hereinbelow, using a programmable pattern generation on a solid ionic conductor substrate permits direct writing of features with nano scale line width and micro-meter length. The invention also is for active growing and dissolution of nanometer structures via controlled electrical potential application.

EXAMPLE 1

Reprogrammable Patterning of Functional Nanostructures Using Superionic Conduction Reprogrammable and reconfigurable active nanostructures and processes influence the functional materials and devices to obtain enhanced energy conversion and chemical sensing. These experiments address outstanding issues in molecular-scale nanofabrication with superionic conduction by: (1) Addressing and explaining the underlying mechanisms of nanoscale charge, mass and energy transport, and reaction kinetics involved in nanostructure formation as a result of ionic conduction in solids; (2) Identifying the factors controlling growth rate and shape fidelity in the grown structures and exploiting this knowledge to develop a highly scalable and reprogrammable, in-parallel transfer stamping process; (3) Exploiting the new capability of programmable and reconfigurable patterning of nanostructures to actively regulate ionic transport and electron flow towards enhanced energy conversion and chemical sensing. The methods disclosed herein utilize reprogrammable nanopatterning. The fundamental understanding of nanostructure growth by ionic conduction and the ability to control it, is further useful for practical design and manufacturing guidelines for compact and efficient energy storage and conversion devices.

Emerging nanotechnology is increasingly focused on the design and manufacture of nanostructures and nanodevices at scales that involve a few molecules to exploit capabilities and functionalities associated with unique physical and chemical properties identified at these length scales. Qualitatively new behavior often emerges in nanostructured materials due to significant confinement and size effects. New modes of transport for electrical current and/or heat can be obtained when the size of a nanoscale structure becomes less than the characteristic length scale for scattering of electrons or phonons (the mean free path). Similarly the emergence of fundamentally new modes of ionic transport is predicted in nanostructures. Such optimism is supported by dramatically enhanced room-temperature ion conductivity in 1D superlattice systems (Sata et al, 2000) with a characteristic thickness comparable to space charge layers. This opens up new routes to electrochemical devices with enhanced energy conversion and storage density.

Besides the development of nanoionic devices, such superionic conduction is useful as the basis of efficient and cost-effective processes to produce nanostructures and patterns. Unlike the inefficient and expensive top-down processes and the low-yield nanoimprint lithography processes, superionic conduction can be used as the basis of a manufacturing platform that is efficient, cheap and reprogrammable.

Figure 10:
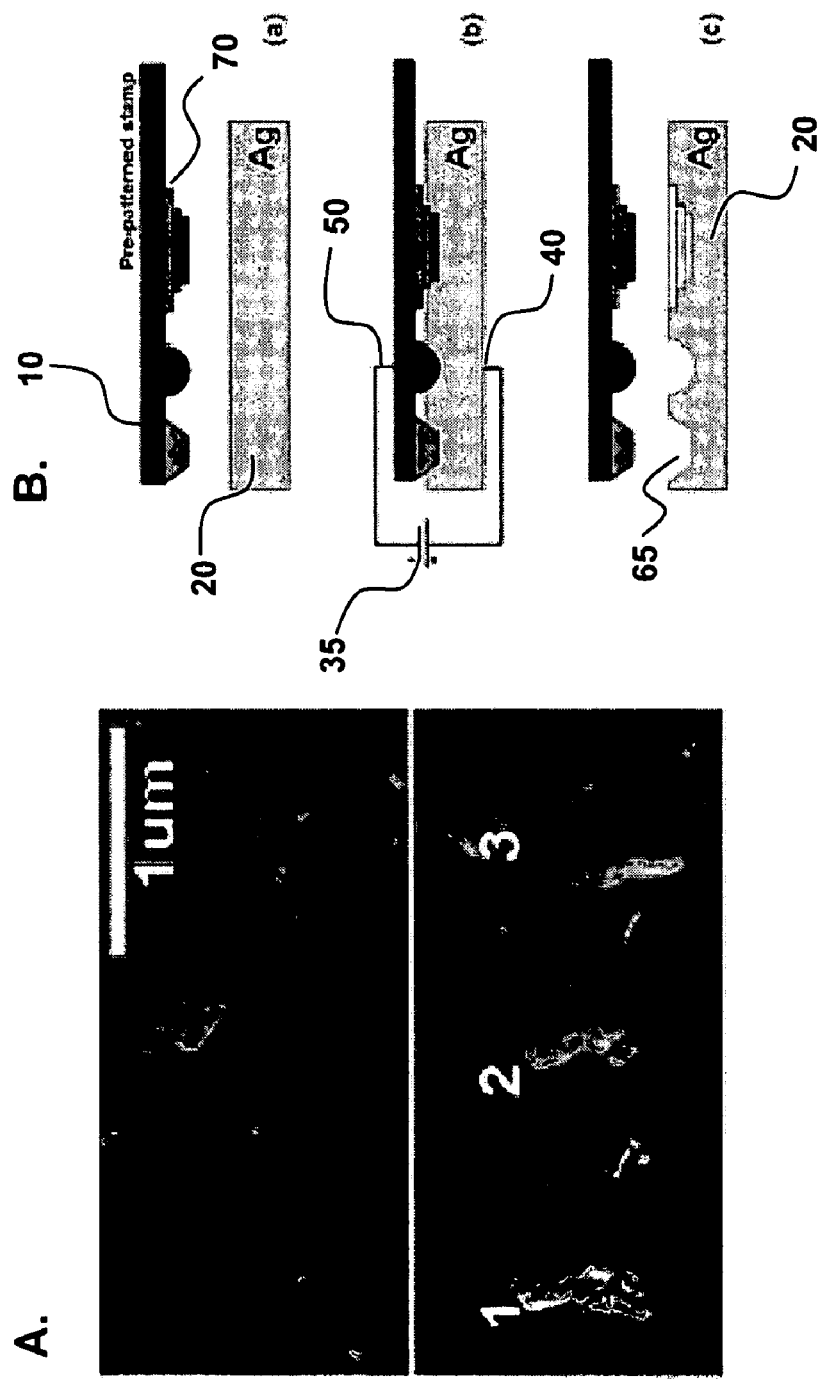
FIG. 10A provides an AFM image of three Ag clusters Ag clusters (identified by number 1, 2 and 3 in the bottom panel) drawn to the surface of a $Ag_2S$ film by means of a charged AFM tip. The three clusters have similar topography. The top panel is the surface of the $Ag_2S$ film before and the bottom panel after application of an electric potential. The bar is 1 μm.
FIG. 10B provides a schematic illustration of a transfer stamping process, where a programmable $Ag_2S$ stamping tool (panel a) is brought into contact with Ag film surface and a potential difference between the cathode and anode applied (panel b) to selectively etch Ag substrate or Ag film to provide a three-dimensional profile on the surface (panel c).

The invention disclosed herein, enables fast and reversible growth and dissolution of metallic (including, but not limited to, silver) nanoclusters, for active and reprogrammable nanopatterning, based on room-temperature solid ionic (superionic) conductors. Superionic conductors used to design a fast switch (Terabe et al, 2005) suggests that superionic conduction may be ideally suited for the development of both nanoscale processes and devices (e.g. see the switch in FIG. 1 of Terabe et al., 2005). Studies disclosed herein indicate that both additive and subtractive nanomanufacturing are possible with the superionic conduction (see, for example, FIGS. 1, 3 and 10).

FIG. 10B schematically summarizes use of a pre-patterned stamp 70 comprising a solid-state ionic conductor 10 to etch metal 20. FIG. 10B illustrates a power supply 35 to energize a cathode 50 and anode 40 to generate an electric field and make recess features 65 on the surface of a metal 20.

A comprehensive understanding of the superionic conduction at the nanoscale is useful for formulating and designing nanostructured materials with tunable and controllable ionic conductivity and ion storage density at room temperatures.

Fabrication and experimental characterization methodology for controllable nanostructure growth/removal with superionic conduction by direct writing of nanopaterns on the superionic conductors. We use an electrochemical atomic force microscope (EC-AFM) to trigger silver growth through ion migration in Ag$_2$S to demonstrate that nanoscale line patterns can be directly written (FIG. 2). We also demonstrate that the patterns are erasable with a reversed polarity of applied bias (FIG. 3). Accordingly, controllable silver nanostructures can be achieved via electrochemical means. To maximize resolution of structures obtained by the methods disclosed herein, superionic conductor substrates preferentially have predictable stoichiometry and low surface roughness. For example, the processes disclosed herein can use superionic conductor substrates comprising single crystal β-Ag$_2$S as a superionic conductor substrate. A wide variety of superionic conductors can be prepared using state-of-the-art crystal growth facilities. Pressing, slip casting, extrusion, and sintering are examples of other methods used to form polycrystalline or composite superionic conductor substrates.

Furthermore, understanding and characterizing growth and removal rates as a function of applied potential, regulated tunneling current and environmental temperature further assists in maximizing the resolution and reproducibility of patterns generated by the processes and devices disclosed herein. Depending on the process utilized (e.g. writing versus stamping) growth mechanisms, such as those that occur when growth patterns transition from controlled cluster growth under the electrode to widespread spontaneous growth distributed on the surface of the superionic conductor, vary.

Many superionic conductors are mixed conductors, conducting both electrons and ions, so that electronic conduction also plays an important role in conduction. To enhance the selectivity of superionic conductors, schemes to limit the electronic current by forming p-n junctions as known in the art can be utilized.

Because solid state etching at nanoscale is a relatively unexplored area, we use the EC-AFM studies to provide insight to the process mechanisms and limiting factors.

Mass and charge transport involved in superionic conduction and the growth/dissolution process. While the field of solid state ionics has been an area of major scientific and technological interest in the past, the experimental techniques have primarily focused on bulk material properties. Only very recently was an enhanced room-temperature ion conductivity (>4 orders of magnitude) in 1D layer-by-layer systems reported (Maier, 2000), indicating the emergence of fundamentally new modes of ionic transports with a characteristic thickness comparable to space charge layers. The success of engineering ionic transport in nanoscale confinement opens up new areas of design and manufacturing nanoionic structures and devices with improved efficiency. The benefit of narrowly spaced interfaces that act as fast pathways for ions or components lies not only in the enhanced effective conductivity but also in the possibility of rapid bulk storage resulting from the reduction of the effective diffusion length.

Figure 11:
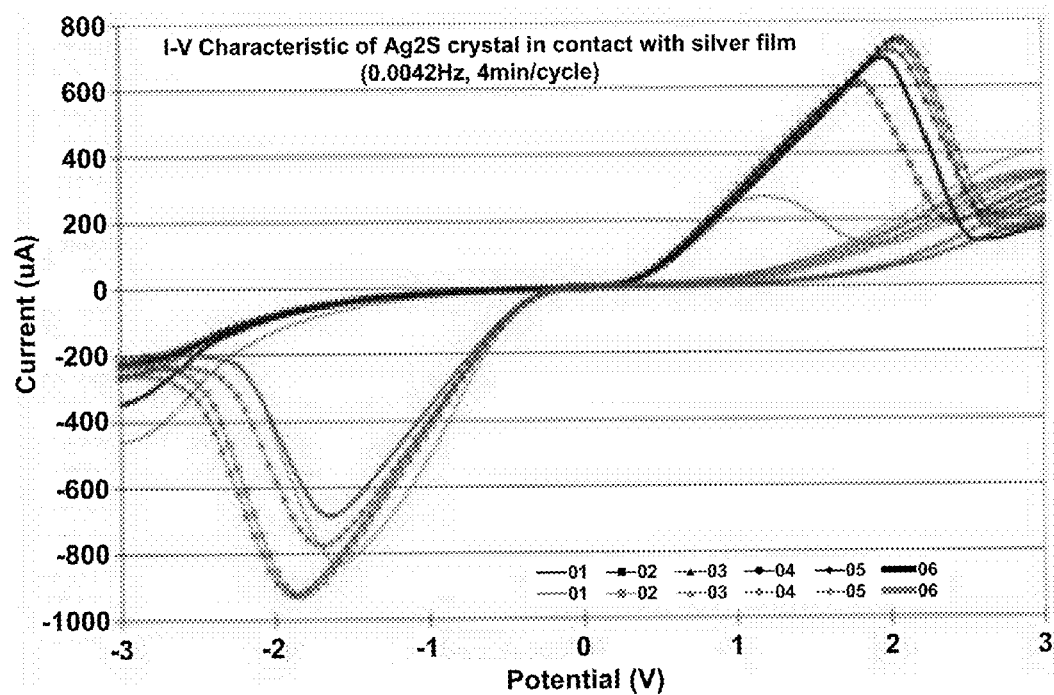
FIG. 11 provides experimental characterization of superionic conduction at nanoscale.
Figure 11:
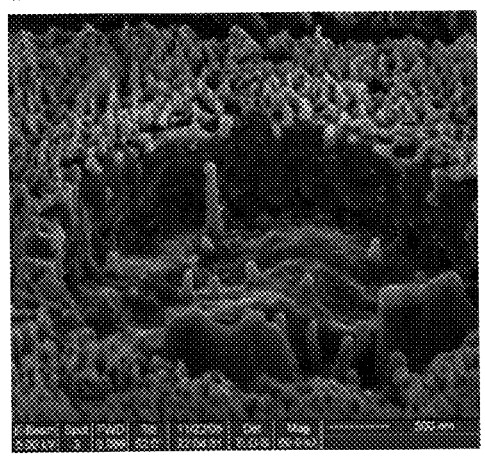

Theory and modeling of combined ionic and electronic transport and growth kinetics at a wide range of dimensional scales plays a critical role in designing and controlling the growth and dissolution of metal (including silver) nanostructures with molecular scale accuracy. Molecular dynamics and embedding multiscale methods combining quantum-mechanical, atomistic and continuum theories for electrically-mediated fluid/ion flow in nanometer channels assist in understanding the fundamental electrochemical kinetics. Atomic-scale kinetic Monte Carlo methods for simulating surface shape evolution in chemically reactive systems, and developing multiscale modeling methods that treat nanoscale manipulation as a design focus further assist in maximizing the resolution and reproducibility of pattern generation methods and devices disclosed herein. Techniques, ranging from ab initio molecular dynamics, kinetic Monte Carlo, continuum and multiscale theories further assist in exploring the underlying fundamental mechanics such as growth, kinetics and transport properties of silver ions and the combined ion and electron transport due to the applied electric field. Such modeling, in combination with empirical data such as those shown in FIG. 11, provides greater insight into the underlying fundamental mechanisms.

Developing reconfigurable and reprogrammable stamping processes with superionic conductors. The coupling of mass and charge transport in ionic conduction leads very naturally to the development of fine resolution etch and deposition processes. The experiments and models disclosed herein provide insight and control of the growth process, upon which reprogrammable stamping tool comprising a superionic conductor is based. FIG. 12A shows a fixed stamp 70 having an $Ag_2S$ 10 nanostructure combined with limited process control (e.g. applying an electric field between electrodes 40 and 50, column 55 containing an optional force actuator and electrode) to successfully generate a transfer patterns by etching through a silver film 20 with sub-micron features such as scratches on the stamp surface showing up on the etched substrate, as well as any number of geometrical features. In an embodiment, an elastic material 75, such as rubber, assists in maintaining uniform pressure between the stamp 70 and metal 20.

Figure 12:
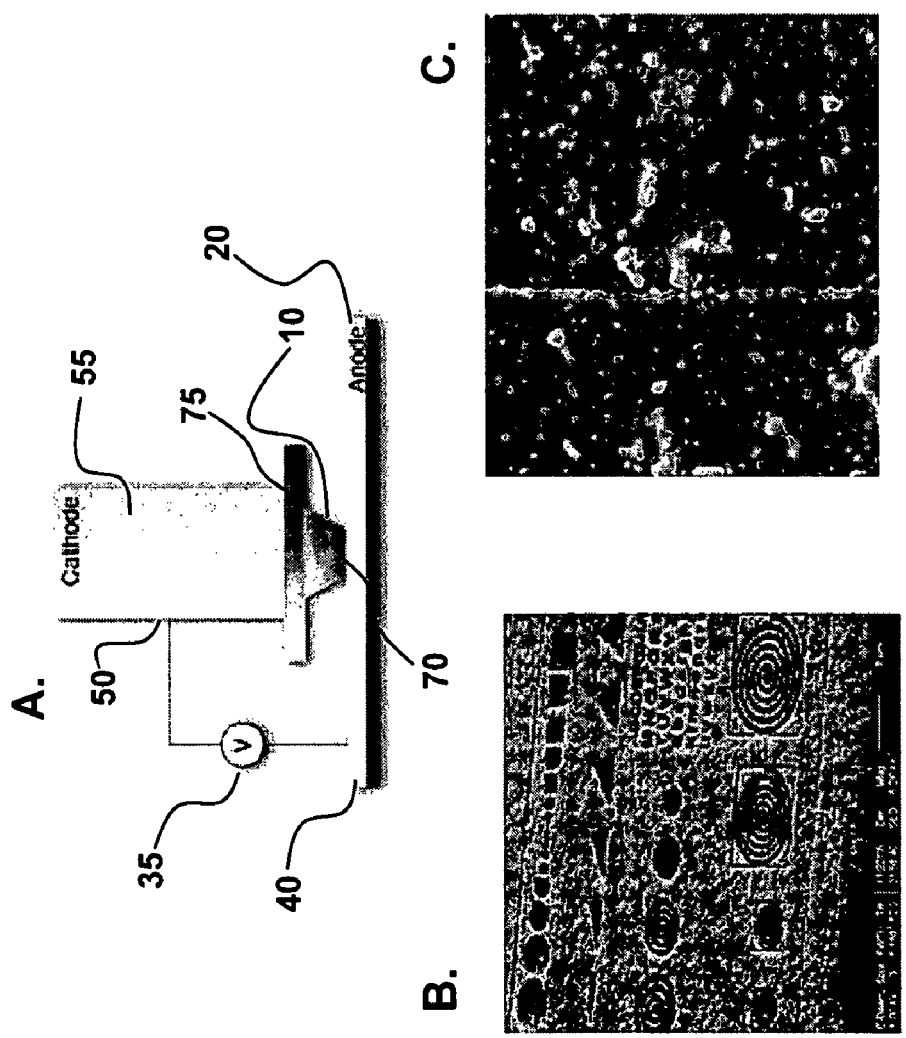
FIG. 12 provides an overview of a stamping process.

Reconfigurable and reprogrammable stamps are particularly useful when coupled with real-time sensing and growth control of pattern generation. For example, embedding very precise electronics into the stamp to estimate growth through changes in conductance between the stamp and the substrate, as well as control strategies to overcome the effects of unevenness of stamps by voltage regulation are two examples where reconfiguragable stamps are useful. By manipulating the substrate surface by various types of surface pre-conditioning, the transfer of metal nanostructures onto a variety of materials is possible, thereby ensuring the process summarized in FIG. 12 are widely applicable.

Figure 13:
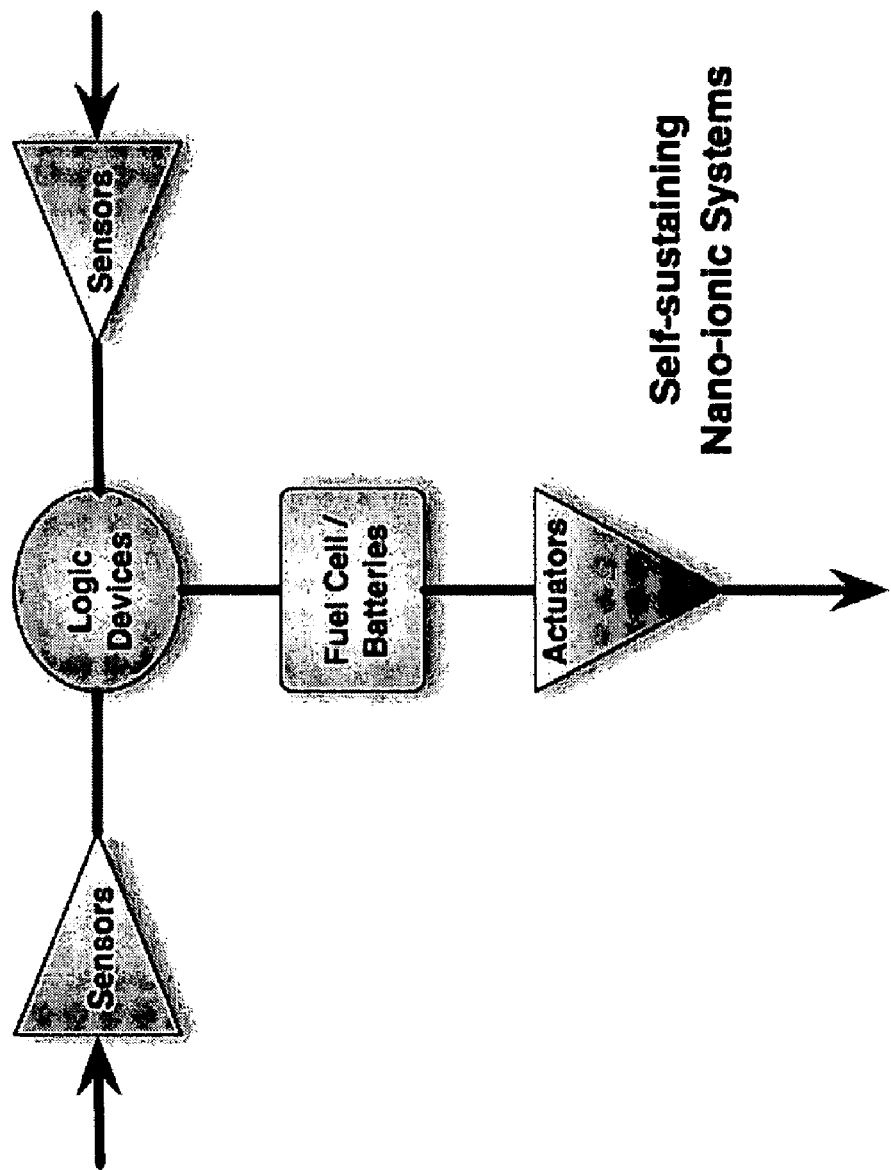
FIG. 13 provides a schematic for a self-sustaining nanoionic system that use patterns made by the methods disclosed herein.

Design of novel active devices using superionic conduction. Active devices can exploit superionic conduction and be fabricated by the methods disclosed herein. As shown by FIG. 13, the superionic nanopatterning technology not only fabricates nanostructured fuel cells and batteries with improved ionic conductivity, but also enables novel electrochemically switchable logic and sensing devices useful in an integrated nanoionic systems that is self sustainable from the chemical energy stored or harvested from environment. Here we take the example of an electrochemically tunable plasmonic switch to show the broad application of nanoionic devices.

Figure 14:
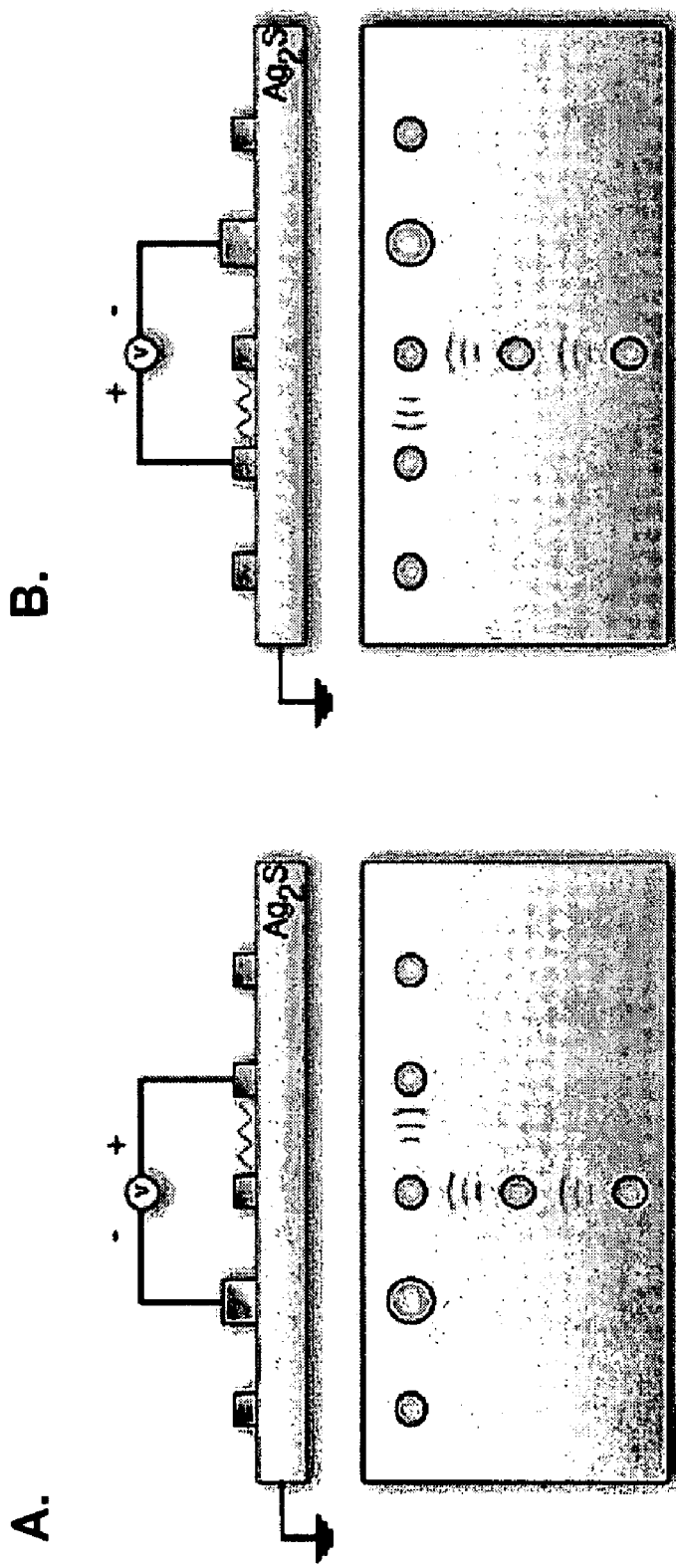
FIG. 14 provides a schematic of an electronically reconfigurable plasmonic switch using growth and dissolution of Ag nanodots. When the polarity of the switch reversed (compare FIGS. 14A and 14B), the optical lightwaves are guided to the corresponding branches, as the overgrowth of nanodots experience a red-shift in wavelength and reject the light signal. The top panel of each of A and B are side views, and the bottom panels are top views.

As the current architectures of high speed nanoelectronics face challenges of power density and heat management, all optical computation using nanophotonics may provide an alternative route towards parallel information processing at high device densities. The nanopatterning of silver with superionics now offers a potential for novel active and reconfigurable plasmonic device. FIG. 14 shows a schematic for an electrochemically tunable plasmonic switch. The silver nanodots form a plasmonic optical waveguide and because the shape and dimension of the dots made them sensitive to the wavelength and polarization, a plasmonic modulator is realized by dissolving or growing the silver dots at the junctions. The fast and reconfigurable plasmonic interconnect enabled by the superionic conduction provides new architectures for the emerging all-optical computation.

Characterization of nanoscale superionic conduction and its exploitation in the development of nanoscale superionic devices provides an integrated platform for devices that deal with energy and information. The ability to inexpensively pattern and process functional materials by the present invention at the nanometer scale is an important asset in designing new-generation fuel cells and batteries with integrated systems for sensing and control, and with increased efficiencies that accrue from the exploitation of fundamental phenomena of nanometer scale solid state mass transport and charge separation in energy science.

Through ionic patterning and switching disclosed herein, understanding of basic mass transport and solid state chemistry at nanometer scales is significantly advanced. This, in turn, assists in optimizing the nanomanufacturing process and tool design, leading to efficient manufacturing and reduced energy consumption. Also, the new manufacturing capabilities, which can ultimately lead to a roll-to-roll type process for nanopatterning, are the basis for new devices and products in photovoltaic and display technology.

Novel processes for generating sub-hundred nanometer features is presented herein, that integrates and extends the concepts of nanoimprint lithography and electrochemical micromachining. Realized by the mass transport property of solid-state ionic conductors and their dimensional integrity, this technique provides simplicity and high throughput of single-step pattern generation while keeping high feature resolution and reproducibility. Solid-state ionic conductor silver sulfide is chosen and made into a stamping tool on which calibration features are defined to verify the lateral resolution capabilities of this technique. Stamping is achieved under various driving potentials and sub-hundred-nanometer lateral resolution is obtained. Even without optimization of the process parameters and environmental factors, this direct patterning technique shows the potential to achieve single-step transfer of sub-hundred nanometer feature with low energy consumption, as well as the flexibility to be integrated with other nano-fabrication techniques for applications such as chemical sensors and photonic structures.

EXAMPLE 2

Direct Nanopatterning with Solid Ionic Stamping

Figure 15:
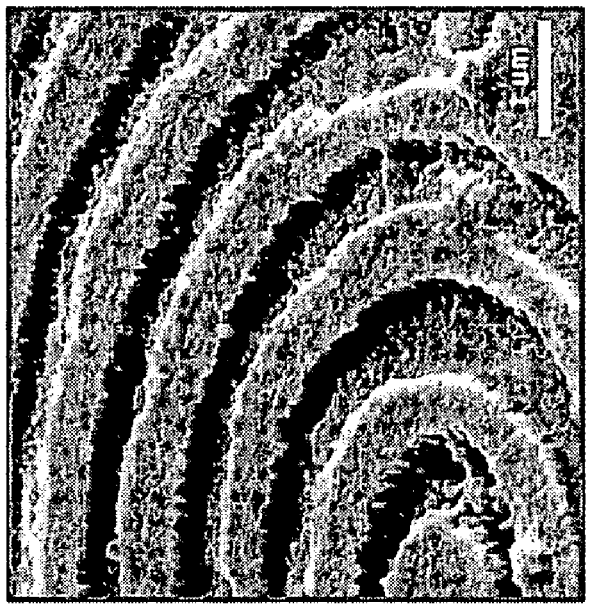
FIG. 15A is an SEM image of a $Ag_2S$ stamping tool of the present invention.
FIG. 15B is an SEM image of the corresponding Ag film electrochemically stamped by the stamping tool of FIG. 15B. The scale bar is 1 um.
Figure 15:
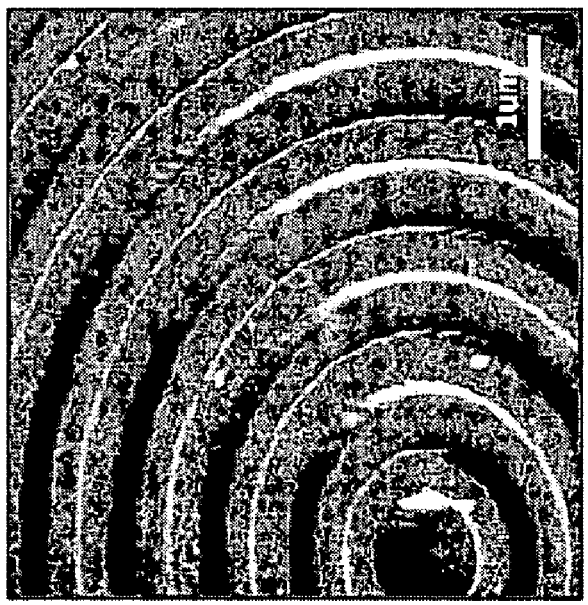

FIG. 15A is an SEM image of an $Ag_2S$ solid state ionic conductor stamp used for electrochemical stamping and FIG. 15B an SEM image of the corresponding pattern etched in Ag metal.

This example discloses an embodiment for generating sub-hundred nanometer features that integrates and extends the concepts of nanoimprint lithography and electrochemical micromachining. Realized by the mass transport property of solid-state ionic conductors and their dimensional integrity, this technique provides simplicity and high throughput of single-step pattern generation while keeping high feature resolution and reproducibility. In an embodiment, the solid-state ionic conductor is silver sulfide and is made into a stamping tool on which calibration features are defined to verify the lateral resolution capabilities of this technique. Stamping is achieved under various driving potentials and sub-hundred-nanometer lateral resolution is obtained. Even without optimization of the process parameters and environmental factors, this direct patterning technique achieves single-step transfer of sub-hundred nanometer feature with low energy consumption, as well as the flexibility to be integrated with other nano-fabrication techniques for applications such as chemical sensors and photonic structures.

Surface micromachining of sub-micron features plays a substantial role in the fabrication of a wide variety of sensor devices and microelectromechanical system (MEMS) components. These techniques realize the generation of such features through either removing material from substrate, top-down etching, or adding materials, bottom-up deposition, to build up the desired features. Among the "top-down" fabrication techniques nanoimprint lithography followed by dry/wet etching, and electrochemical machining (EM) provides features with size down to tens of nanometers. Nanoimprint lithography followed by chemical/physical etching of substrate provides high feature geometrical and dimensional integrity at the expanse of multi-step, complex lithography processes that require stringent process environment control and high-cost equipments.

The novel patterning technique presented herein extends the concepts of state-of-the-art nanoimprint lithography and electrochemical micromachining. The solid ionic stamping demonstrated in this example exploits the mass-transfer property of solid state ionic conductors to produce sub-hundred-nanometer features with high throughput and reproducibility.

Electrochemical machining that utilizes the local dissolution of metallic substrate ions and mass transport in the etching medium by liquid electrolyte, can achieve nanometer feature generation with relatively process simplicity and low cost. The feature-transfer fidelity, however, degrades as feature size reduces. As feature approaches the limits where the necessary replenishment of liquid electrolyte etching medium becomes limited, features like sharp edges and thin lines lose their geometrical and dimensional integrity when transferred from machining tool to substrate surface.

In an embodiment the present invention uses solid ionic stamping. The solid ionic stamping presented herein, in contrast to current electrochemical machining techniques, provides high feature geometrical and dimensional fidelity in generating the desired metallic feature using a relatively simple single-step feature transfer. In addition, the process is low cost while eliminating the need for sophisticated process equipment while maximizing feature-transfer fidelity due to the physical property nature of the etching medium and stamp. The electrochemical stamp using a solid state ionic conductor stamp of the present invention also avoids the need for post-treatment of the etching medium used for metal etching.

Figure 16:
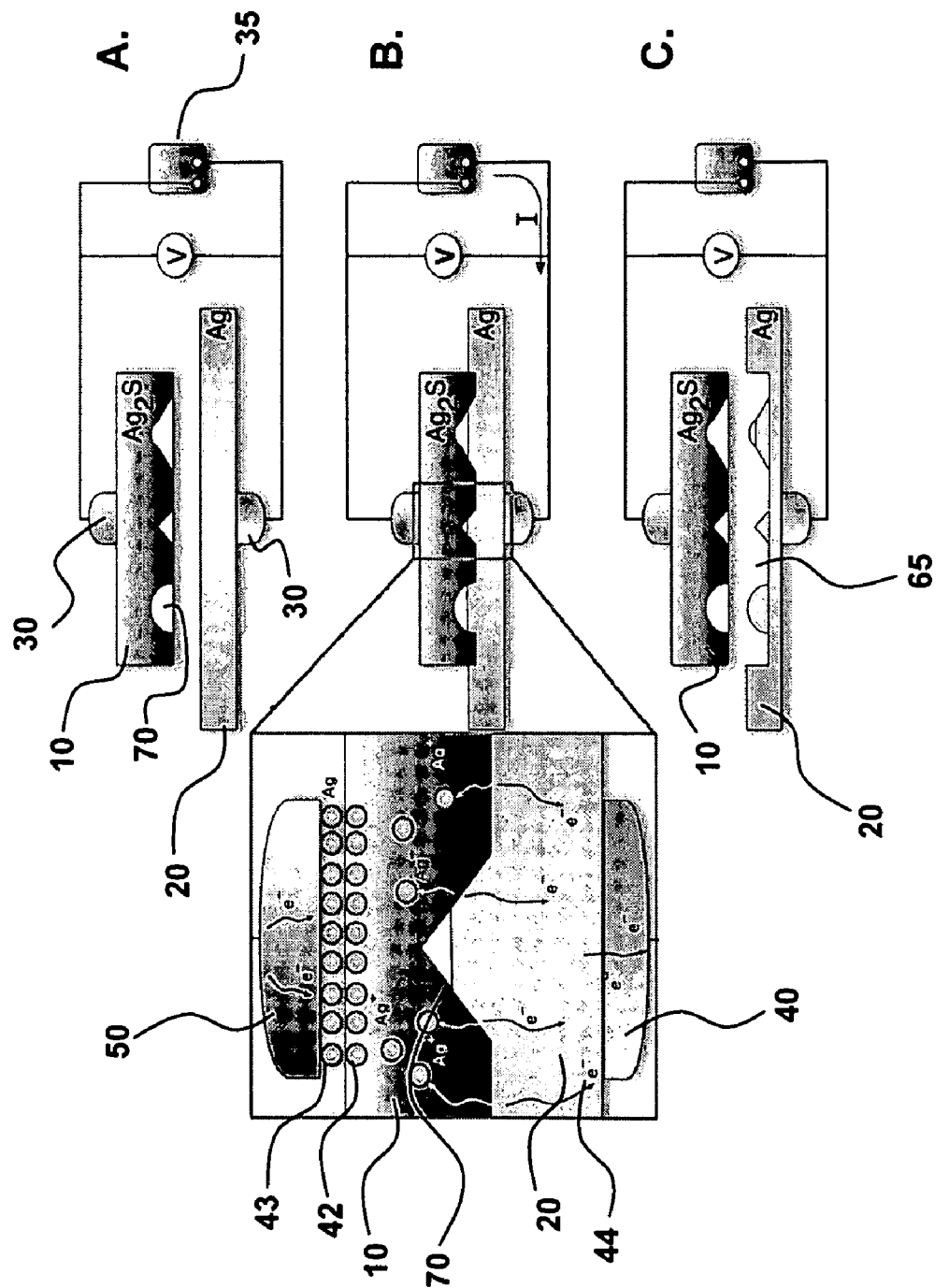
FIG. 16 provides a schematic illustration of etching a metal with an electrochemical stamp or stamping tool.

FIG. 16 is a schematic of an embodiment for ionic migration of silver species in a solid state ionic conductor, silver sulfide. When subjected to an electric field applied across a silver 20-silver sulfide 10 interface through anode 50 and cathode 40 attached to them respectively, silver atoms oxidize into mobile ions 42 and electrons 44. Mobile silver ions 42 move from the interface through the conduction channels formed in the silver sulfide bulk 10, toward the cathode 50. Upon receiving electrons 44 when reaching the cathode surface, silver ions reduce back to atoms 43 and deposit on the interface between the cathode 50 and $Ag_2S$ 10. The oxidation reaction at the interface between metal 20 (e.g. anode) and $Ag_2S$ 10 is used as a tool for surface micromachining. The advantage of using solid state ionic conductors is that mass transport only occurs at the surfaces of film metal anode and solid ionic conductor where physical contact exists, making it an ideal tool for pattern transfer. In this work, silver sulfide is synthesized and formed into a tool having a patterned surface, including nano-scale dimensions, for use as a stamp 70 to perform surface micromachining on a silver substrate. The stamp 70 etches metal 20 resulting in a pattern of etched recess feature 65 (FIG. 16C).

Mass transport coupled with ionic migration in electrolyte subjected to electrical field, have been used to develop patterning techniques and devices. A quantized conductance atomic switch that has been developed wherein silver mobile atoms bridge and open a tunneling gap between Pt and silver sulfide wires when driven by a gate potential. Such a switch is reported to be capable of operating at 1 MHz with low a driving voltage of 0.6V, adding another nano-scale switch operating at high frequency yet low energy consumption. With the same ionic mass transport concept, nanopatterning techniques have been developed to achieve sub-hundred nanometer line writing and dot deposition with scanning probe microscopy. These techniques utilize the electric potential applied across a scanning probe and desired substrate surface and the migration of metal ions from a solid-state ionic conductor forming either the substrate or scanning tip to realize the generation of single line writing or metal dots deposition. The practicality of this direct pattern writing is limited by the low throughput and high complexity and cost of the instrumentation involved. With the aid of a high strength tool material like Tungsten, the resolution of electrochemical machining has been pushed to the sub-hundred nanometer regime. The pattern dimension fidelity and pattern geometry of the transferred feature, however, is limited by the current density distribution in the liquid-state electrolyte and its physical properties.

Lithographic processes followed by chemical/physical etching of metal have been developed to a point where the cost is minimized and process standardized to maximize the yield. Those processes remain expensive, however, as skilled personal and chemical handling and waste treatment are essential to the operation of the multi-step processes.

The present invention described herein extends the application of mass transport properties of electrolyte to far beyond the generation of simple geometrical pattern generation with complex scanning microscopy systems. Instead, the patterns created are intricate two and three-dimensional patterns in the sub-hundred nanometer scale within a single-step, high throughput process.

Silver sulfide synthesis/stamp preparation. An electrochemical cell is designed to perform the synthesis of silver sulfide crystals. The cell is composed of a 6 mm-ID quartz tube with both ends open. In the tube a silver iodide pellet pressed from powder is placed in contact with a silver pellet on one side which allows the transport of silver ions from silver across silver iodide, and the other side exposed to sulfur which allows silver ions to react with sulfur. A cell potential of 800 mV is then applied through two electrodes attached to the free surfaces of silver and silver iodide pellets when the cell reached a reaction temperature of 360 degrees centigrade. At these reaction conditions silver ions then migrated through silver iodide layer to cathode and reacted with sulfur, forming a silver sulfide pellet of a few millimeters thick. The reaction proceeded until the cell current dropped to a steady value, indicating the end of reaction, and was then cooled to room temperature.

Another method is also employed for silver sulfide synthesis. A glass tube is filled with sulfur and pressed against a silver pellet sitting in a glass test tube. The tube is then heated to 400 degrees centigrade to allow silver-sulfur reaction. The glass tube pressed against the silver pellet prevents further growth of the porous silver sulfide layer closer to the silver side in the formation of silver sulfide layer, and promotes the desired dense silver sulfide near the sulfur side to further increase thickness. The synthesized silver sulfide can be as thick as centimeters, depending on the amount of silver and sulfur available. The synthesized silver sulfide pellet is then shaped and patterned with focused ion beam to be used in the subsequent solid ionic stamping. Calibration features are made such that the resolution limits are explored. Silver substrate is prepared with a 250 nm-thick silver film deposited with electron beam evaporation on a 300-μm thick glass cover slip. The silver substrate is electrically connected to an electrode through physical contact with a copper electrode. The surface area of the metal substrate facing the solid state ionic conductor can have any value, including a range from about 100 μm$^2$ to about 5 mm$^2$.

Silver sulfide stamp characterization. Before patterning with FIB, the synthesized silver sulfide stamp is characterized with x-ray diffraction ("XRD") for composition and cyclic voltammetry for electrochemical response. The XRD is conducted on a Rigaku D-Max system with a scanning range (2-theta) from 0 to 60 degrees and a scan rate of 1.5 degrees per minute. XRD diffractogram are overlaid and compared with standard peaks from powder form silver sulfide. The results confirm the composition of synthesized silver sulfide. The silver sulfide stamp is then characterized with cyclic voltammetry running at 0.5 Hz with a range from positive 2 volts to negative 2 volts. Characteristic histeresis confirm the electrochemical behavior of synthesized silver sulfide.

Solid state electrochemical etching. Solid-state etching is performed at room temperature at 1 atmospheric pressure. The prepared silver sulfide stamp is attached to a platinum electrode which is fixed to a micro-stage for positioning. On another micro-stage silver substrate is fixed onto a quartz window with a platinum electrode attached to it. An optical microscope is built and placed on the back side of the quartz window for positioning and process monitoring. Solid ionic stamping is performed by bringing the stamp in contact with the silver substrate and the polarity of the electric field is chosen such that silver is the anode and the Ag$_2$S side electrode is cathode. Different electrical potentials ranging from 0.2 V to 0.8 V with an interval of 0.2 V are applied and current monitored with a Potentialstat. The processes are also optically monitored with an optical microscope observing from the back side of the quartz window upon which the silver substrate resides. The silver film thickness decreased as stamping proceeded, leading to a continued chromatic change in the optical image of the film. After stamping, the silver substrate is then characterized with Atomic Force Microscopy (AFM) and Scanning Electron Microscope (SEM).

Solid-State Electrochemical Etching: Etch Kinetics.

Figure 17:
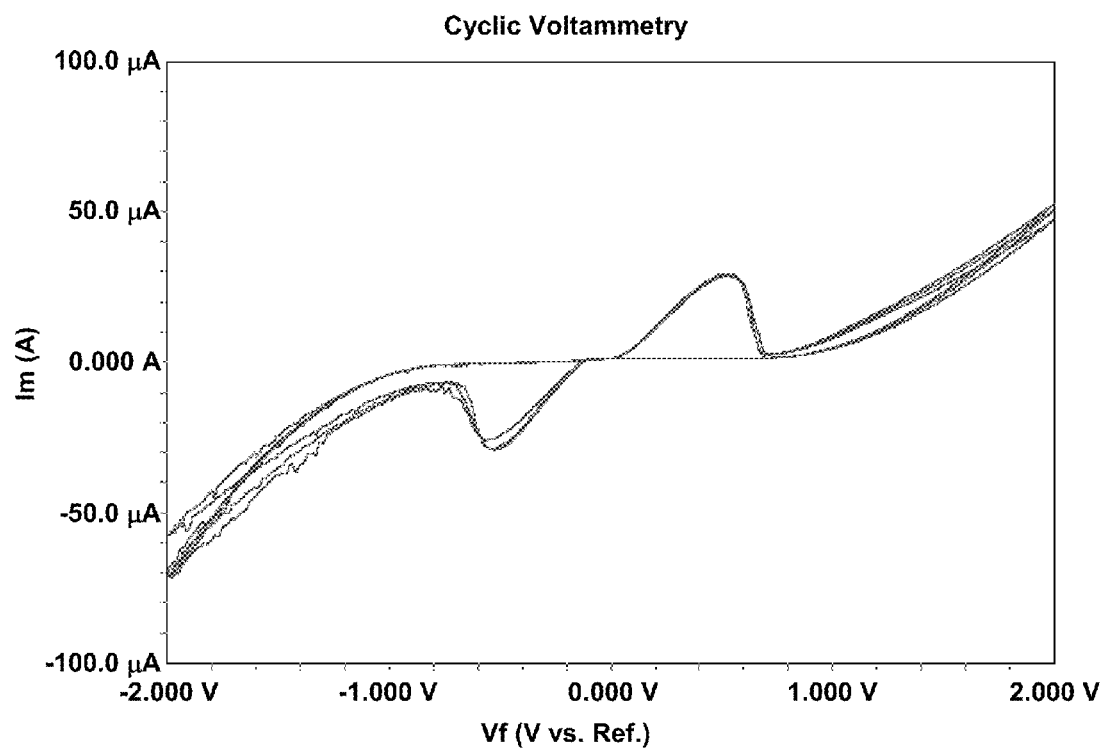
FIG. 17 provides cyclic voltammetry plots of the silver sulfide stamp measured between two silver electrodes.

It is known that the ionic conduction of silver sulfide is a contribution from solubility of silver in silver sulfide. Shown in FIG. 17 is the cyclic voltammetry of the silver sulfide stamp measured between two platinum electrodes. The two humps on the ramp-up and ramp-down curves correspond to the increase in overall conductivity induced by the migration of excessive silver in silver sulfide, confirming the electrochemical behavior of synthesized Ag$_2$S. When a potential field is built up across the silver sulfide stamp, the migration of the excessive silver in the stamp along the direction of the field and the polarization effect resulting from the silver concentration gradient due to silver migration start to take place. These two effects counteract each other—as more silver ions become mobile charge carriers and move from the anode side to the cathode side of the silver sulfide stamp, the concentration of silver in silver sulfide reduces while the concentration on the cathode side increases. This concentration gradient then builds up a polarization effect within the stamp which acts as a resistive force to the migration of silver ions. As potential keeps increasing, the polarization effect also keeps growing to the point where the ionic current is completely blocked, resulting the current drop on the CV diagram. For this reason, it is thought that the maximum ionic mass transport efficiency occurs at the potential where the corresponding current peaks out.

Figure 18:
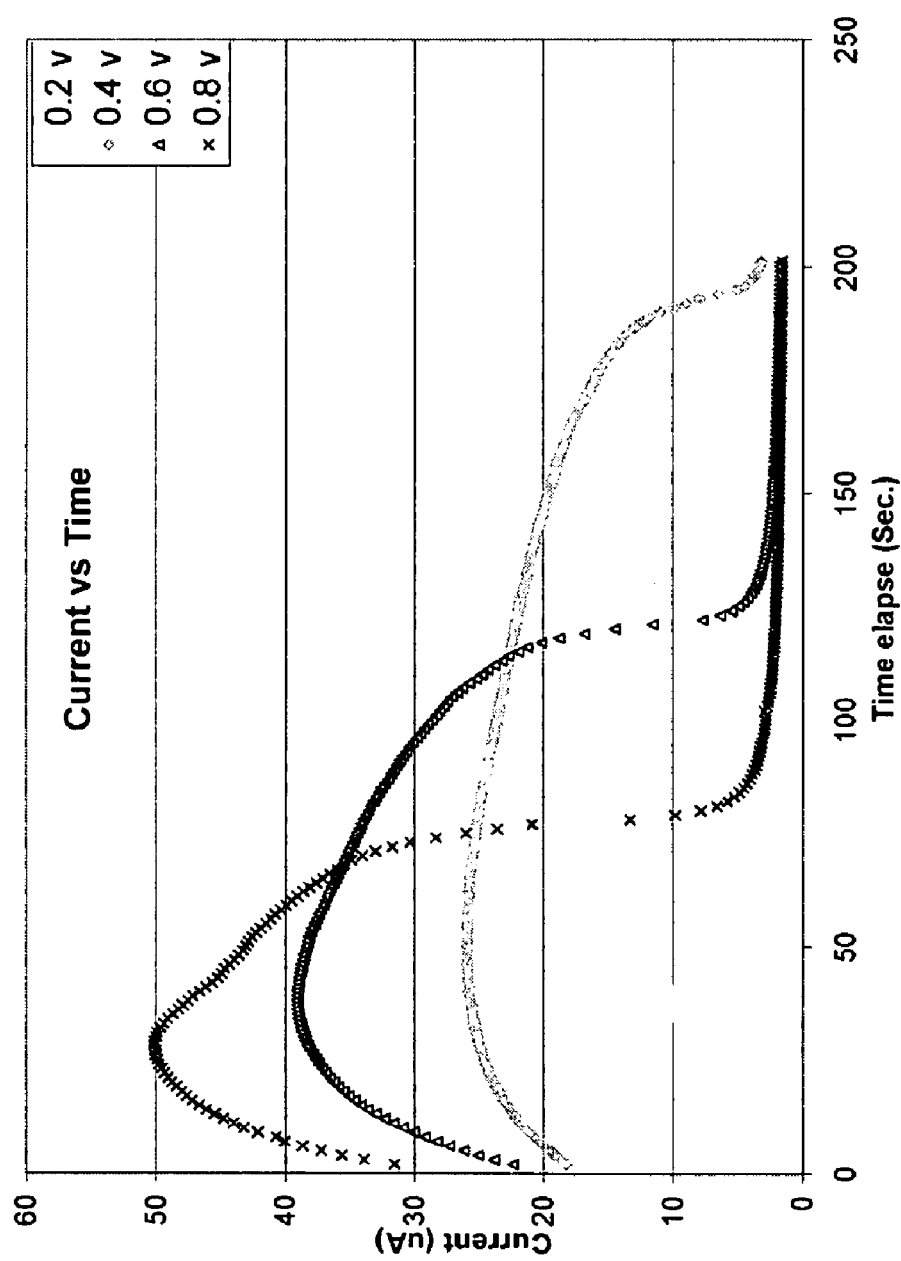
FIG. 18 provides plots of current as a function of time for various driving potentials during an etching process.

FIG. 18 shows the current monitored over etching time for different driving potentials. The currents monitored in this experimental setup are the combined effects of ionic and electrical current, due to the mixed-conduction nature of silver sulfide. Currents for different voltage level follow the same trend—they reach their highest value within the first stage of etching, slope down to lower values in the second stage, and then at the last stage drop to a steady-low value, indicating the end of etching. The three-stage behavior can be explained in a similar manner as is in explaining the CV diagram: During the first and the second stage, three effects play different roles that contribute to the overall current output. The increase in silver concentration due to the dissolved silver from silver substrate into the silver sulfide stamp increases the ionic current. At the same time, the growing polarization effect gradually increases, thereby reducing the mobility of silver ions, contributing an increasing reduction in the ionic current. As the concentration reaches the solubility limits of silver in silver sulfide, a steady-state is reached where further dissolution of silver into silver sulfide from the anode results in a reduction of silver ion to silver atoms depositing on the cathode, facilitating the advance of negative stamping. At the start of the last stage, the depletion of silver on the anode side results in the reduction and eventually the elimination of ionic current, leaving the current pure electrical. This is a good indication of the end of etching.

Resolution: Depth of Features & Sidewall Angles.

Figure 19:
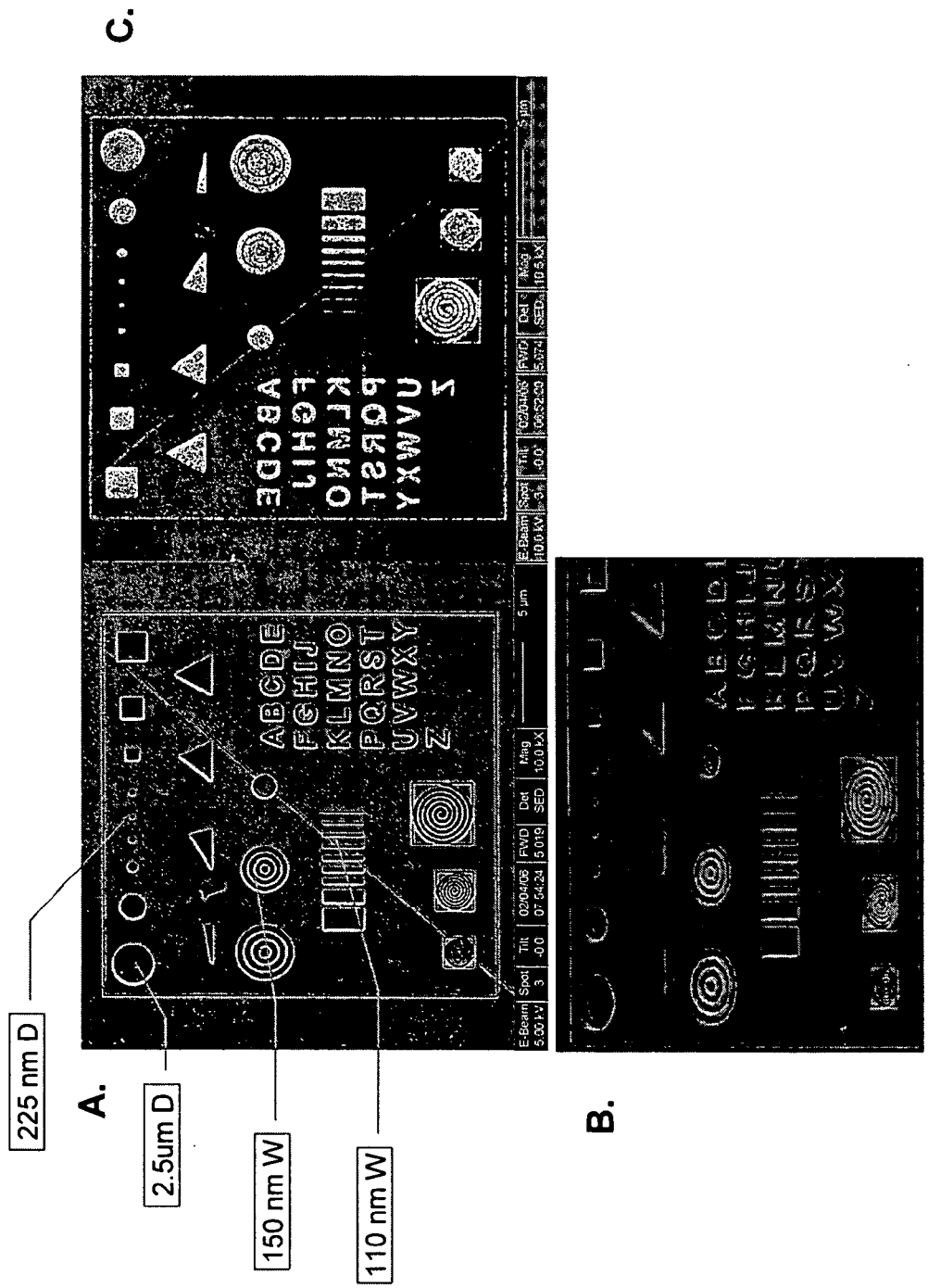
FIG. 19 is a pair of SEM images showing a silver sulfide stamp (A top view; B perspective view) and the corresponding produced silver feature (C) etched from a silver film.

FIG. 19 is a side by side comparison of the silver sulfide stamp and the produced silver feature. As seen in FIGS. 19A and 19B (the stamp) and 19C (the etched substrate), all the geometrical features are successfully transferred—part of the silver film is removed through contact with the flat surface area on the silver sulfide stamp, leaving behind the structures corresponding to the recess area made on silver sulfide tool. The lateral resolution achieved is 90 nm on a straight line, calibrated with AFM. The height of the silver features remains at 250 nm, the silver film thickness prior to etch, confirming that the bottom surface of the recess features on silver sulfide is not in contact with the silver substrate during the process.

Figure 20:
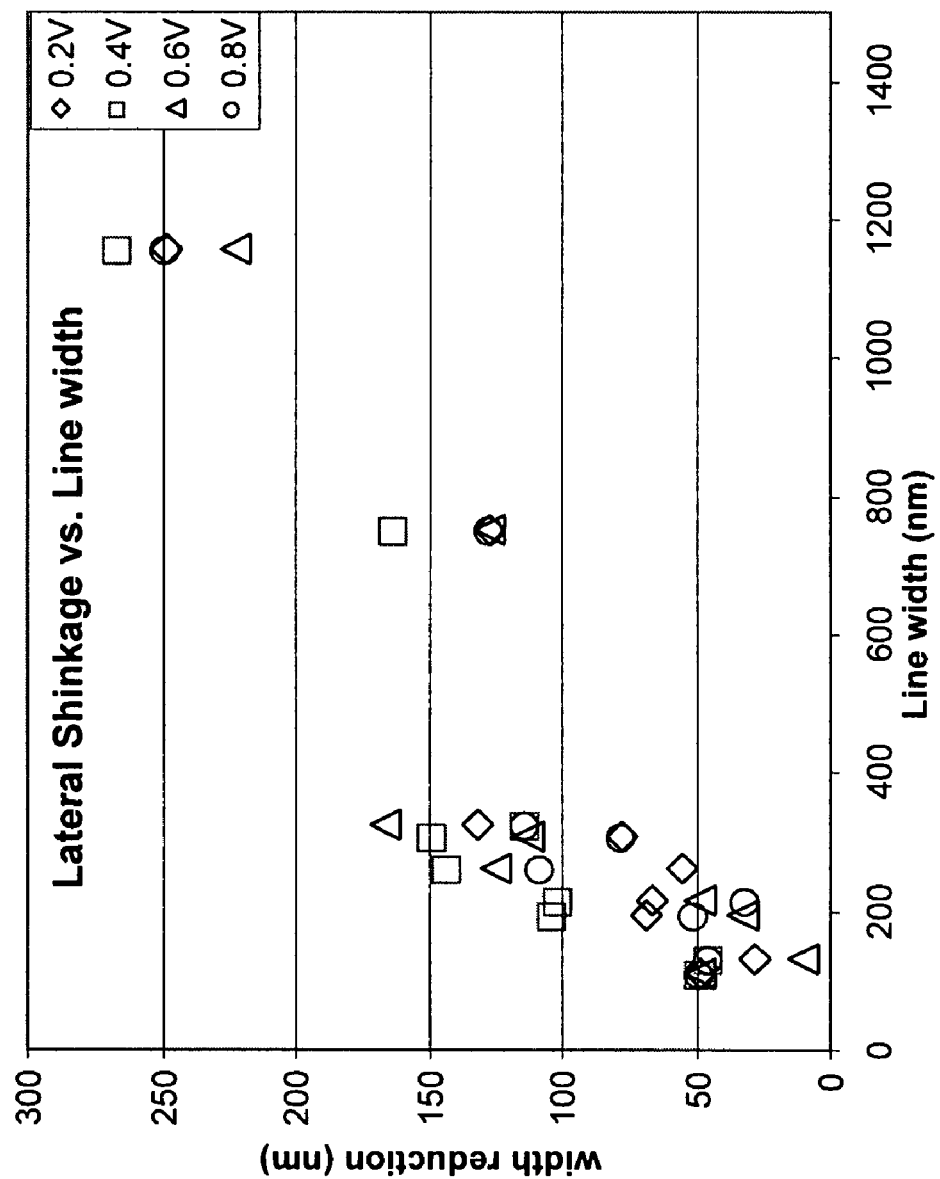
FIG. 20 is a plot of lateral width reduction as a function of line width for four driving potentials indicating that for the smallest line width stamp (110 nm), a driving potential of 0.6V provides the lowest lateral width reduction so that the feature is reduced by 13% (e.g. 95 nm width).

Line widths of the recess feature on the silver sulfide stamp and the finished silver pattern are calibrated with AFM and recorded. The generated feature on the etched pattern has a lateral shrinkage as compared to the designed feature size on the silver sulfide stamp. The etched feature has a tendency to have a smaller dimension than that expected from stamp. FIG. 20 shows the lateral shrinkage for different line widths. For the four driving potential tested, 0.6V has the lowest lateral shrinkage over the entire size range while 0.2V and 0.4V have higher lateral dimension reduction. For the smallest designed line width, 110 nm, the feature comes out to be 95 nm, a 13% reduction, for 0.6V; whereas the lateral reductions for 0.2V and 0.4V are 21% and 34% respectively. Without wishing to be bound to any particular theory, this effect is believed to be caused by the electrostatic force between stamp pattern side walls and the resulting silver features, which pulls silver grains out of the silver feature across the gap that is formed as stamping proceeds. As the gap increases to the size where the electrostatic force is small enough to be balanced by the bind force between silver grains, the remaining silver stays stable. Generating plots such as those shown in FIG. 20, allows for compensation in the stamp size lines so as to obtain lines in the etched material of a given dimension.

Stamping cycle time. As shown in FIG. 18, the current drops to a steady lower value when all the excess silver dissolved in silver sulfide and the silver film in contact with silver sulfide stamp is depleted, indicating the end of etching process. The etch rate is calculated at different driving potentials and presented in FIG. 21. The etch rate ranges from 0.7 nm per second at 0.2V to 2.2 nm per second at 0.8V, comparable to conventional dry etching of silver. The power consumption of this solid ionic stamping, however, is orders of magnitude less then those dry etching techniques.

Figure 21:
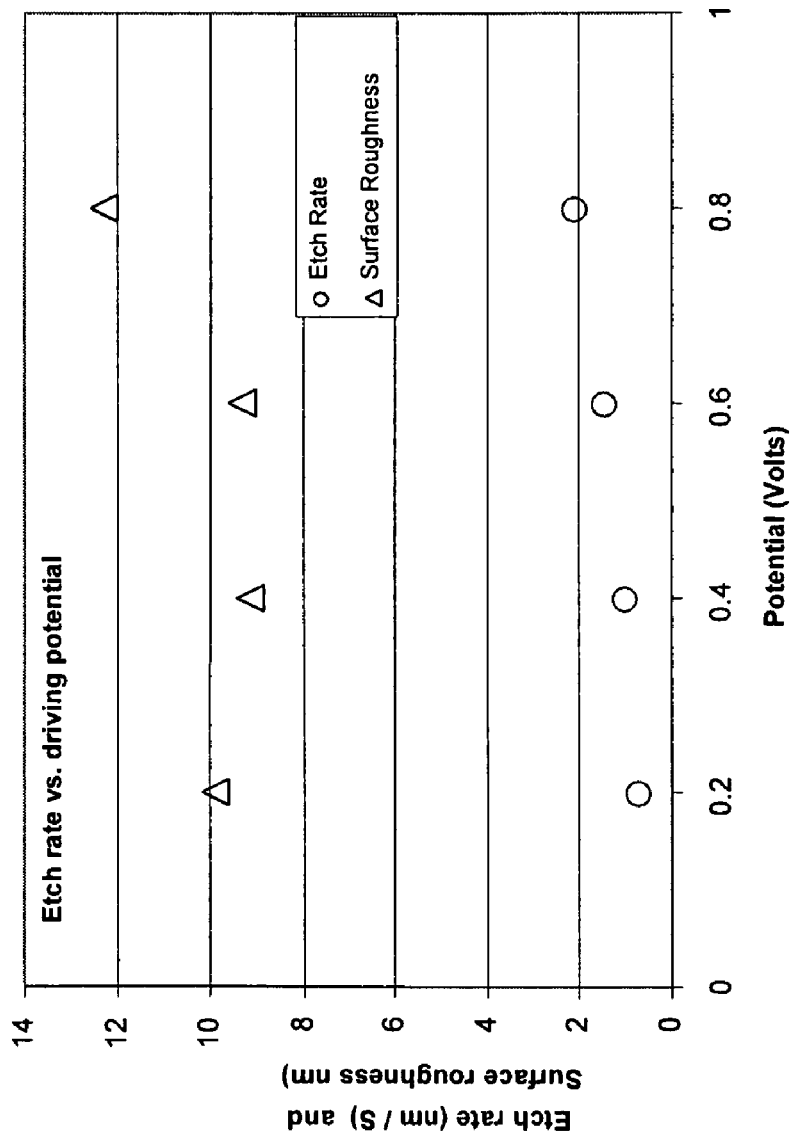
FIG. 21 is a plot of etch rate (nm/s) and surface roughness (nm) as a function of the driving potential (volts).

Surface roughness and resolution. Also shown in FIG. 21 is the surface roughness of the resulting etched silver structure for different driving potentials. The surface roughness is measured by AFM in 1 micron square. Although the process driving potential does not have strong effect on the roughness of the etched surface, at 0.4V and 0.6V the resulting silver surface is relatively less rough.

Effect of reusing the stamp. Reusing the stamp causes the features of 50 nanometer lines to collapse. This effect is believed to be caused by the repeated mechanical contact of the silver sulfide stamp and silver surface and the force when the two surfaces are engaged. The force is regulated by setting a fix position to which the stage controlling the stamp moves in every run of experiment. Reuse of the stamp does not show strong effects on the roughness of the stamp; it remains the same after the stamp has been use for 8000 seconds on actual etching time.

EXAMPLE 3

Electrochemical Stamping

Figure 22:
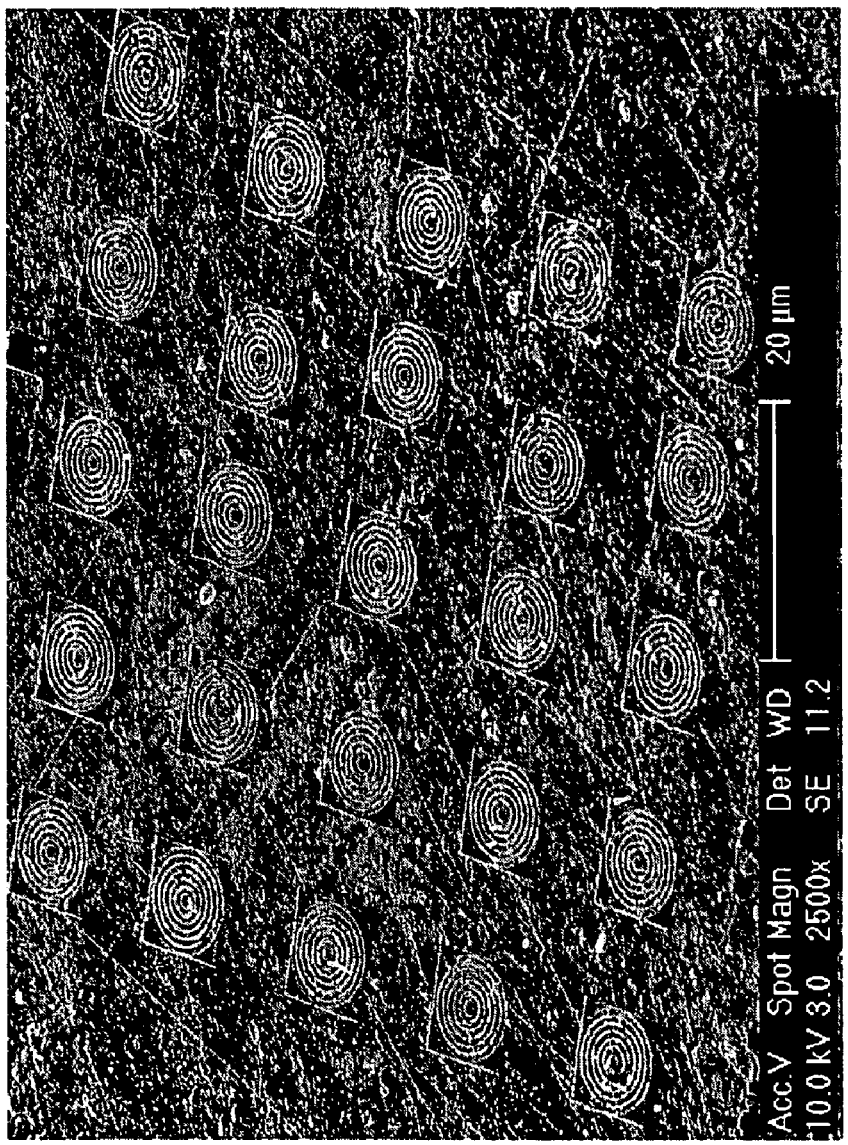
FIG. 22 is an SEM photograph of an etched silver metal made with an electrochemical $Ag_2S$ stamping tool patterned with a 5×5 plasmonic array.
Figure 23:
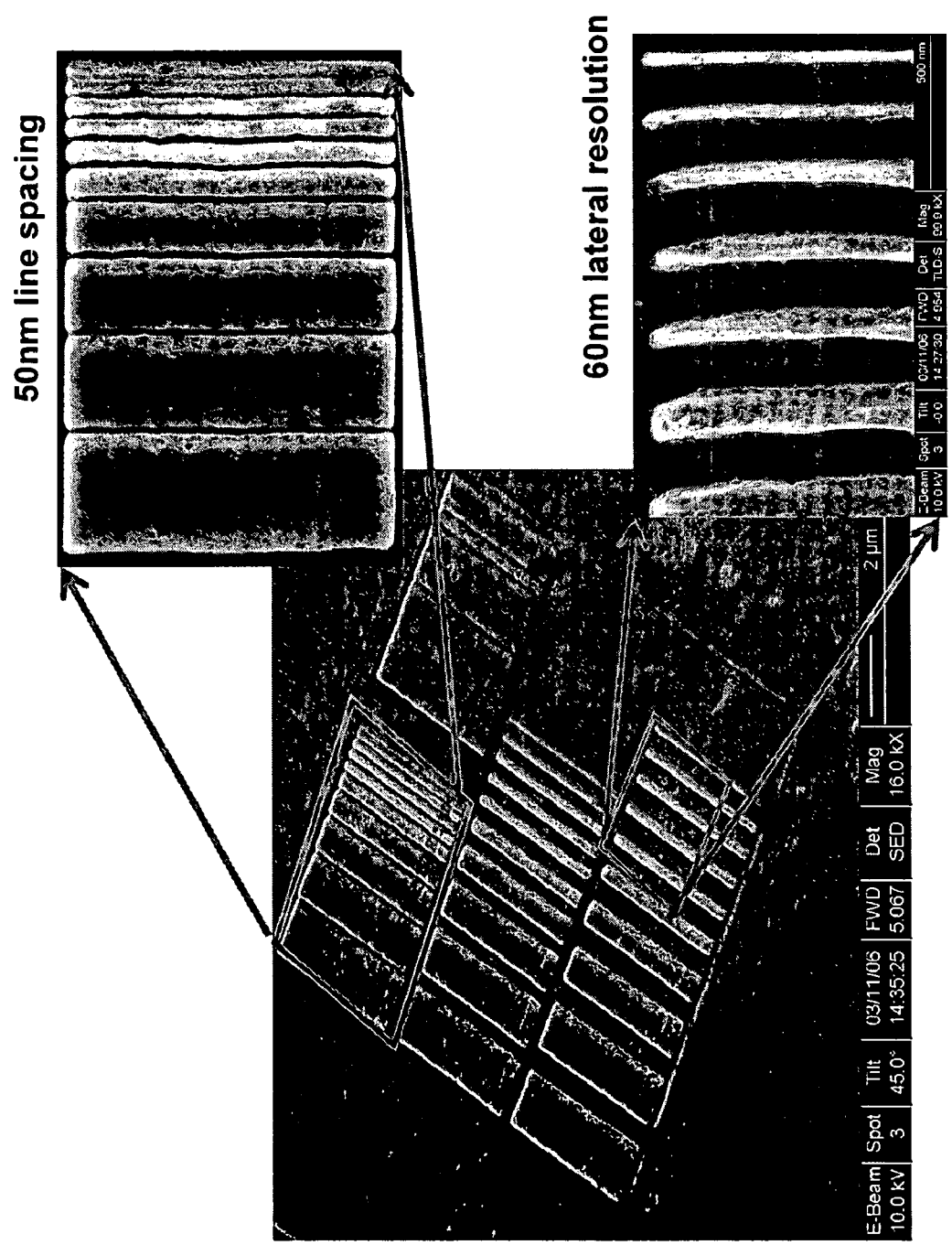
FIG. 23 provides SEM images showing the resolution of patterns etched into silver metal using an $Ag_2S$ electrochemical stamping tool of the present invention. Two regions of the etched surface are expanded to show the invention provides for pattern creation with line spacing of 50 nm and lower and lateral resolution of 60 nm and better.

The invention disclosed herein provides a unique and new capability to pattern metals with sub-100 nm resolution in a high-through put stamping process. For example, FIG. 22 shows arrays of patterns can be etched in metal. Depending on manufacturing considerations, such a 5×5 array may be created using single step electrochemical stamping, or alternatively, the metal may be repeatedly stamped to obtain the array. FIG. 23 shows the stamps of the present invention provide structures having sub-100 nm resolution. For example, multiple distinct lines or channels are generated that are separated by 50 nm and the lateral resolution is 60 nm. In an embodiment, the process is a solid-state, room temperature process that is highly compatible with a large variety of process technologies. Although the examples provided herein utilize silver, different ionic crystals for other materials, including but not limited to copper, and gold, can be similarly used, to obtain patterns composed of these other materials.

EXAMPLE 4

Substitutional Etching and Copper Etching

Because of its excellent electrical, mechanical and chemical properties, copper is a widely used metal for micro electronics and multi-layer circuit interconnects. Copper is a very practical and useful metal for patterning by the systems and processes disclosed herein, as Cu is widely used in the semiconductor industry for contacts, interconnects and vias (contact holes). Present copper patterning and manufacturing techniques suffer from severe limitations. For example, the damascene process is widely used by the semiconductor industry to deposit copper interconnects electrochemically into the trenches of patterned dielectrics, and uses chemical mechanical polishing to remove excess metal. That system, however, is an expensive, complex, multi-step process that requires stringent process environmental control and costly equipment. Nanopatterning of copper by the methods and devices of the present invention provides resolutions better than those obtained in state of the art Cu patterning processes, such as the damscene process. In addition, the present invention facilitates single step processing, unlike the multi-step processes currently used.

Figure 25:
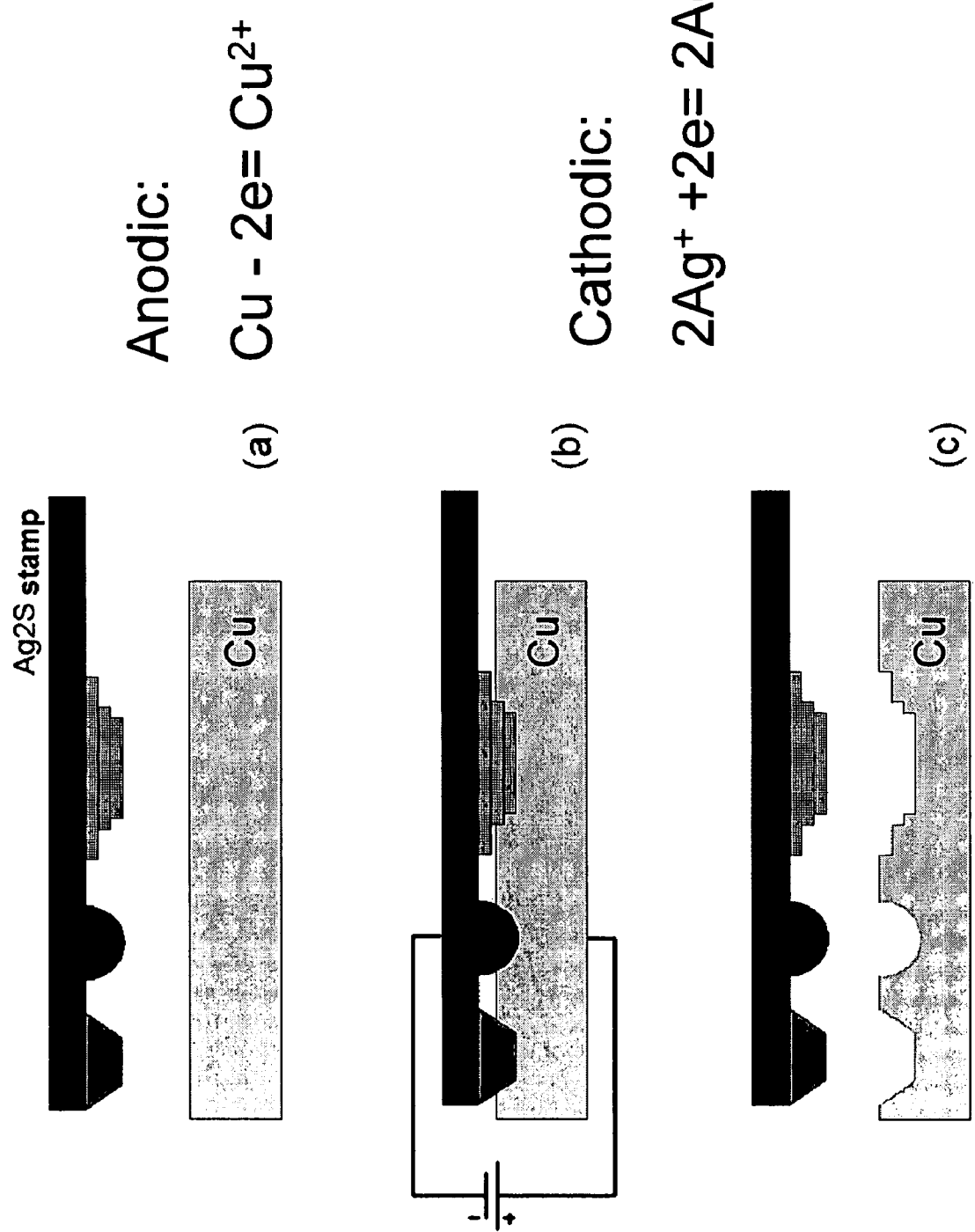
FIG. 25 schematically illustrates one example of substitutional stamping, wherein an $Ag_2S$ stamp having a pattern is used to pattern Cu metal (A). Electrical contact is established between the stamp and metal (B). The stamp is removed from the metal surface after sufficient time to provide a patterned metal surface that corresponds to the stamp pattern (C). Redox reactions at the anode and cathode are shown for this example.
Figure 26:
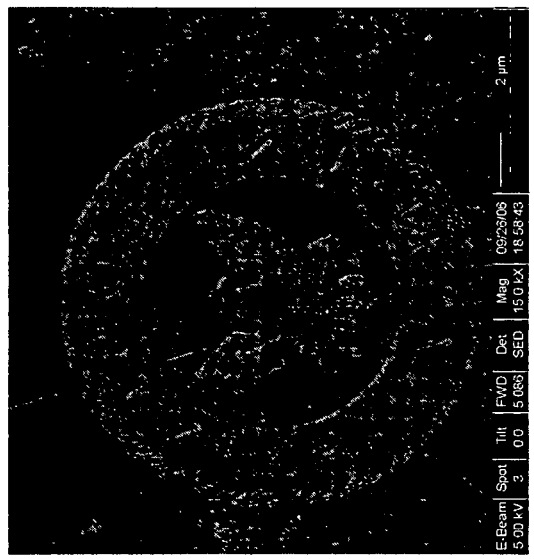
FIG. 26 illustrates stamps and corresponding pattern generation using a $Ag_2S$ stamp on copper metal. A shows copper patterned with an $Ag_2S$ Navy Seal stamp (scale bar is 2 μm). B shows etched Cu lines having a linewidth less than 1 μm (scale bar is 10 μm). C shows etched Cu pads (1.5 μm by 1.5 μm for each grid) (scale bar is 2 μm).
Figure 26:
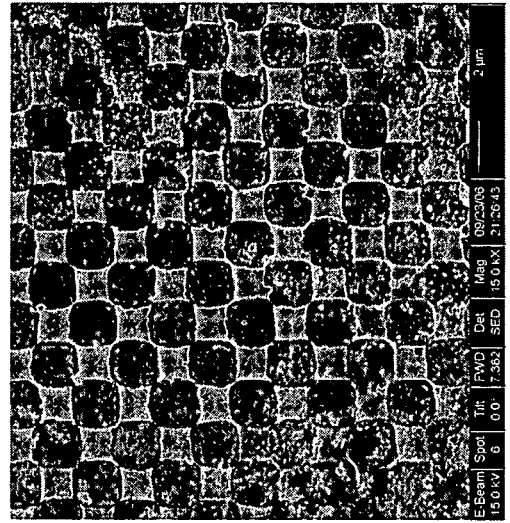
Figure 26:
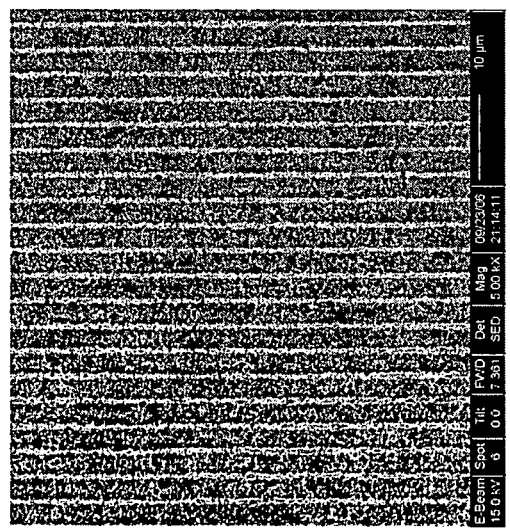

"Substitutional stamping" or "substitutional etching" refers to a system having an ionic conductor that is different than the metal species. A $Cu:Cu_2S$ system (e.g., not substitutional etching) and process suffers significant limitations because $Cu_2S$ is not a good ionic conductor, and so the patterning process is often required to be run under high temperatures (e.g., 120° C.-150° C.). In addition, $Cu_2S$ is relatively brittle making it difficult to shape to obtain a stamp of a desired pattern. A stamp made from $Ag_2S$ that etches Cu metal, in contrast, has a consistency that is easy to work with such that desired stamps and patterns can be made quickly and room temperature etching is readily performed. In the $Ag_2S$ (stamp):Cu (metal) system, copper is etched, resulting in copper displacing silver to form a CuAgS compound. Such a substitutional patterning system provides the ability to pattern a useful material (e.g., copper) with a stamp having physical properties that make the stamp more amenable for shaping and easier to work with. An example, shown in FIG. 25, is an $Ag_2S$ stamp that etches copper metal. FIG. 26 shows results of copper patterning by a correspondingly shaped $Ag_2S$ stamp. The resolution in such a system can be better than 300 nm.

Figure 24:
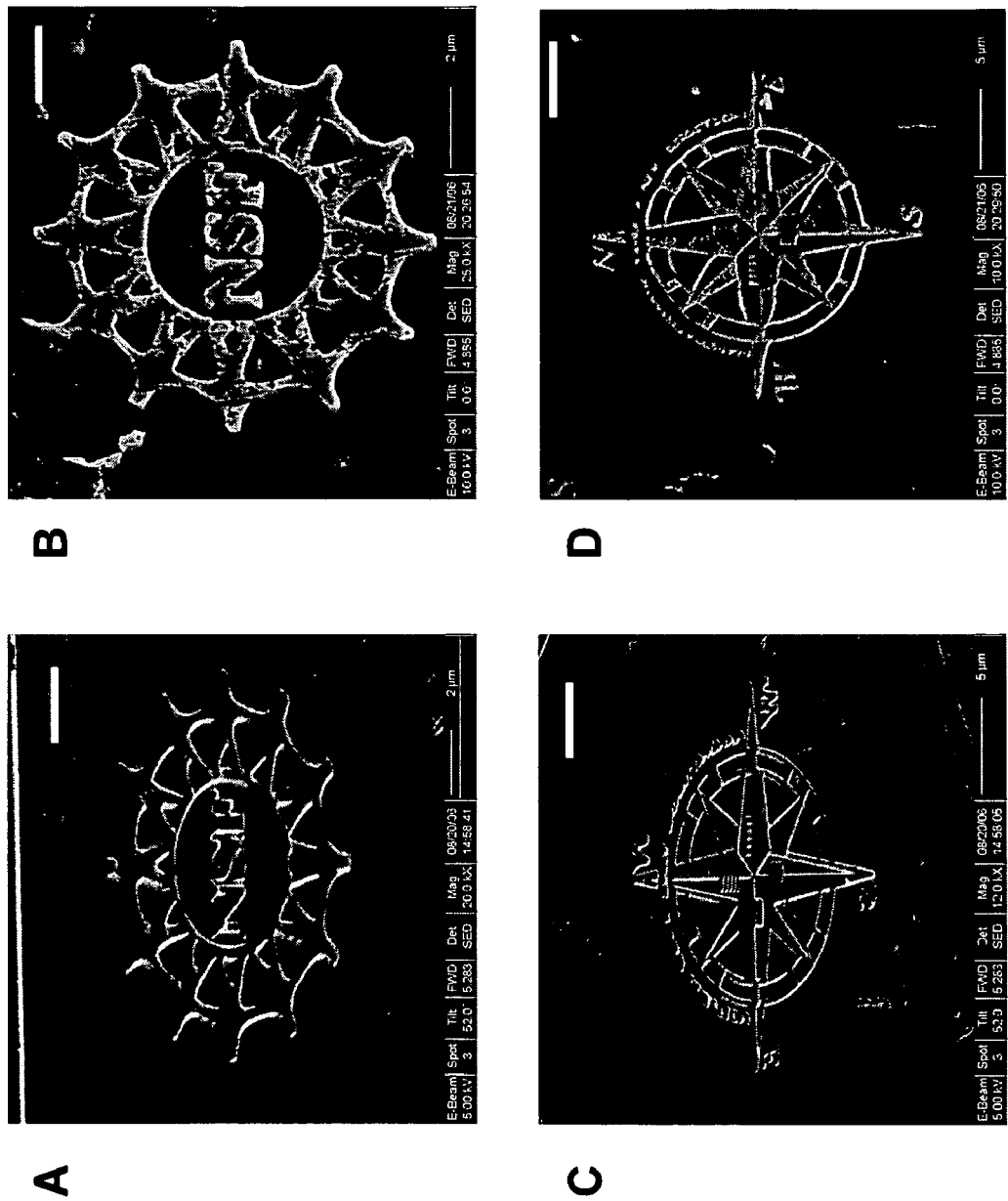
FIG. 24 illustrate stamps and corresponding pattern generation using a cuprous sulphide ($Cu_2S$) stamp on copper metal. FIGS. A and C illustrate the stamp that is an NSF symbol (A) and compass rose (C) etched into $Cu_2S$.

$Cu_2S$ crystals are grown in a manner, similar to $Ag_2S$ crystals. A pure Cu pellet is reacted with S at 400° C. for a total of 7 hours, (1 h 20-400° C., 4 h at 400° C., and 2 h from 400-20° C.). The patterns are etched through 300 nm of Cu coated on glass, at an elevated hot plate temperature of 200° C., with a constant potential of 0.05V. Results comparable to those obtained in silver nanopatterning with $Ag_2S$ are observed (see FIG. 24). The blemishes on the etched pattern are due to the poor quality of the film and are avoided by using high quality Cu film, as known in the art. Once begun, the process is completed within 50 seconds, indicating that rates comparable to those observed for silver are expected. The process is further improved by empirically and/or computationally assessing optimal activation temperature, voltage, and stamping pressure.

EXAMPLE 5

Tunable Nanowire Resonator

High speed opto-electronic interconnects are not available in state-of-the-art semiconductor electronics. To develop such interconnects, terahertz and optical nanowire-based devices are manufactured in accordance with the methods and systems disclosed herein. The present invention permits manufacture of structured arrays of nanowires with a density on the order of 50,000 nanowires/cm$^2$. As used herein, "nanowire" refers to wires having at least one cross-section dimension of about 100 nm or less, or about 40 nm to about 100 nm, or about 50 nm to 100 nm. "Nanowire density" refers to the number of individual nanowires within a given region, and can be expressed as a number per unit area. The corresponding wire length can be on the order of microns and greater, such as lengths between about 10 μm and on the order of millimeters, or 10 μm and 15 μm. Optionally, the nanowires of the present invention are tunable to different bands within a desired frequency range. As used herein, "tunable" refers to the capability of adjusting the length of a nanowire, thereby changing the resonant frequency of the nanowire. Muhlschlegel et al. (2004) show resonant metallic nanowire antenna having full length between 190 nm-400 nm, width of 45 nm, thickness of 40 nm, and gaps ranging between 20-50 nm. Those antennae are proposed to nonlinearly enhance the absorption of illumination wave as half-wavelength dipoles. In an aspect, the present invention provides an ability to combine, scale-up, and control such nanowires to obtain programmable THz plasmonic antenna arrays by any of the superionic processes, systems and strategies recited herein.

Nanowire devices and systems useful as terahertz antennae and resonators for on-chip opto-electronic interconnection. The ability to pattern by deposition and etching facilitates implementation of reprogrammable and tunable nanowire devices. Through artificial plasmonic effects generated out of metallic nanowires with ionically tunable impedance, the nanowire antennae and resonators can overcome the speed limitation of semiconductor electronics, thereby generating a needed high-speed opto-electronic link.

Figure 27:
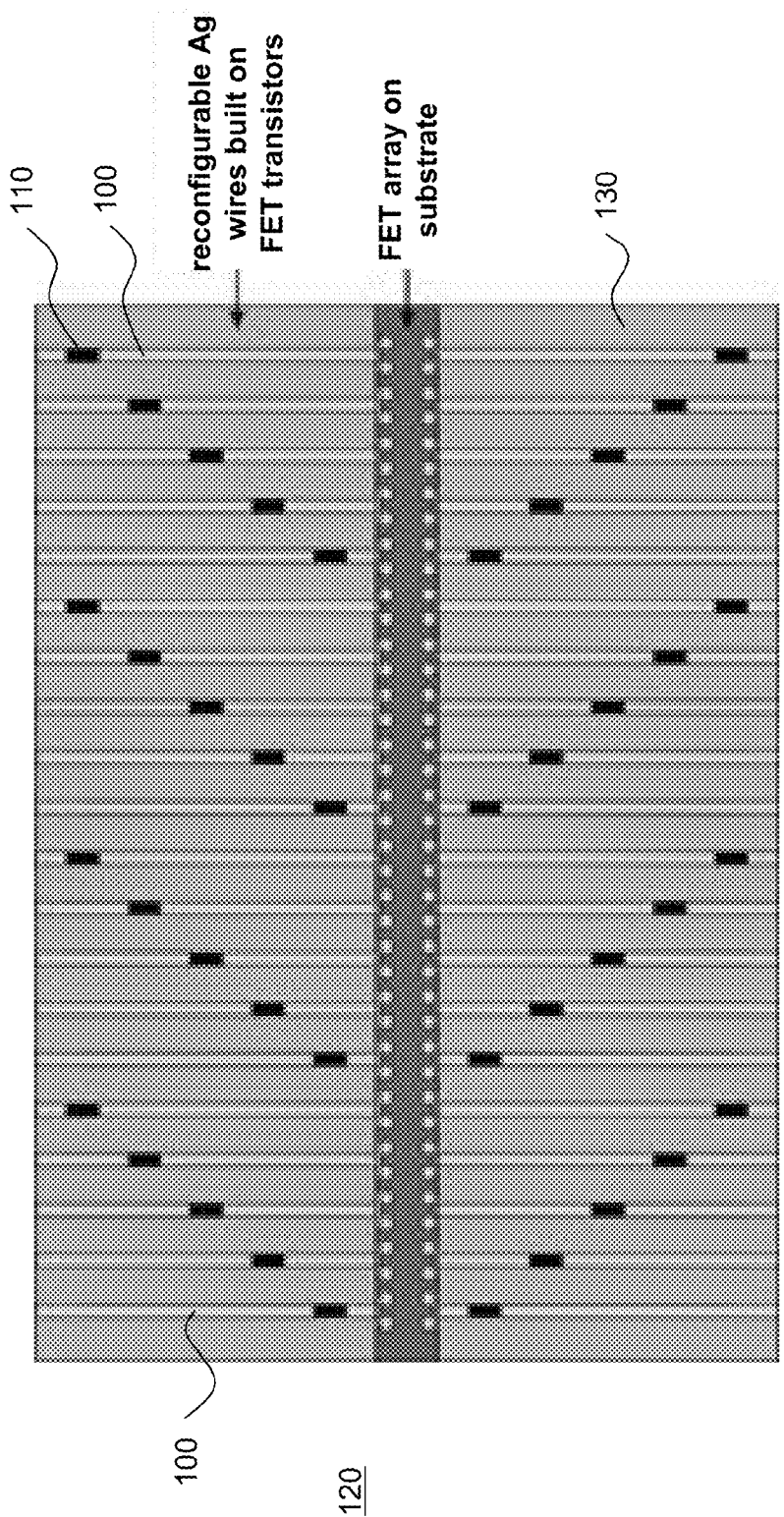
FIG. 27 Schematic of a high-density Terahertz nanowire antenna based on $S^4$ (solid-state superionic stamping) process. The patterned parallel Ag nanowires are connected to rectifying circuitry. Repositioning of the superionic conductor segments (represented as dark segments within each nanowire, and made of $Ag_2S$) by the $S^4$ process modulate the effective length of each wire allowing for tunable band programming of the antenna.

FIG. 27 illustrates a high density multifunctional THz antenna array 120 made of silver nanowires 100. In the figure the dark segments 110 in each wire are superionic conductors that are electronically insulating (especially at high frequencies). The antenna array shown in FIG. 27 is an innovative blend of a 'metallic microwave stripe-line' and a 'surface plasmon waveguide', a concept used for semiconductor lasers that produce radiation in the mid-infrared range [Kaeriyama et al, 2005]. Each Ag nanowire 100 is effective as a monopole antenna for radiation at:

$$\lambda = 4l/\sqrt{\in}$$

where l as the length of nanowire. Accordingly, changing the effective length of the nanowire by manipulating the position of the superionic conductor bridge 110 provides the capability to precisely tune λ. For example a 10.6 μm long silver nano-wire embedded in ∈=2 dielectric medium is effective for 10 THz radiation. This device can serve as a Yagi antenna array with highly directional radiation parallel to the substrate surface [Maier et al, 2002]. Using the S$^4$ process facilitates further study of the effect of nanowire shape and size on the propagation of THz waves on-chip. These tunable nanowires are promising for on-chip optical interconnect because Wang et al. [2004] report that the propagation losses in the THz metallic waveguides in transverse electromagnetic (TEM) modes are better than 0.03 cm$^{-1}$—that is, a reduction of 3 dB for 33 cm of distance traveled.

Figure 28A:
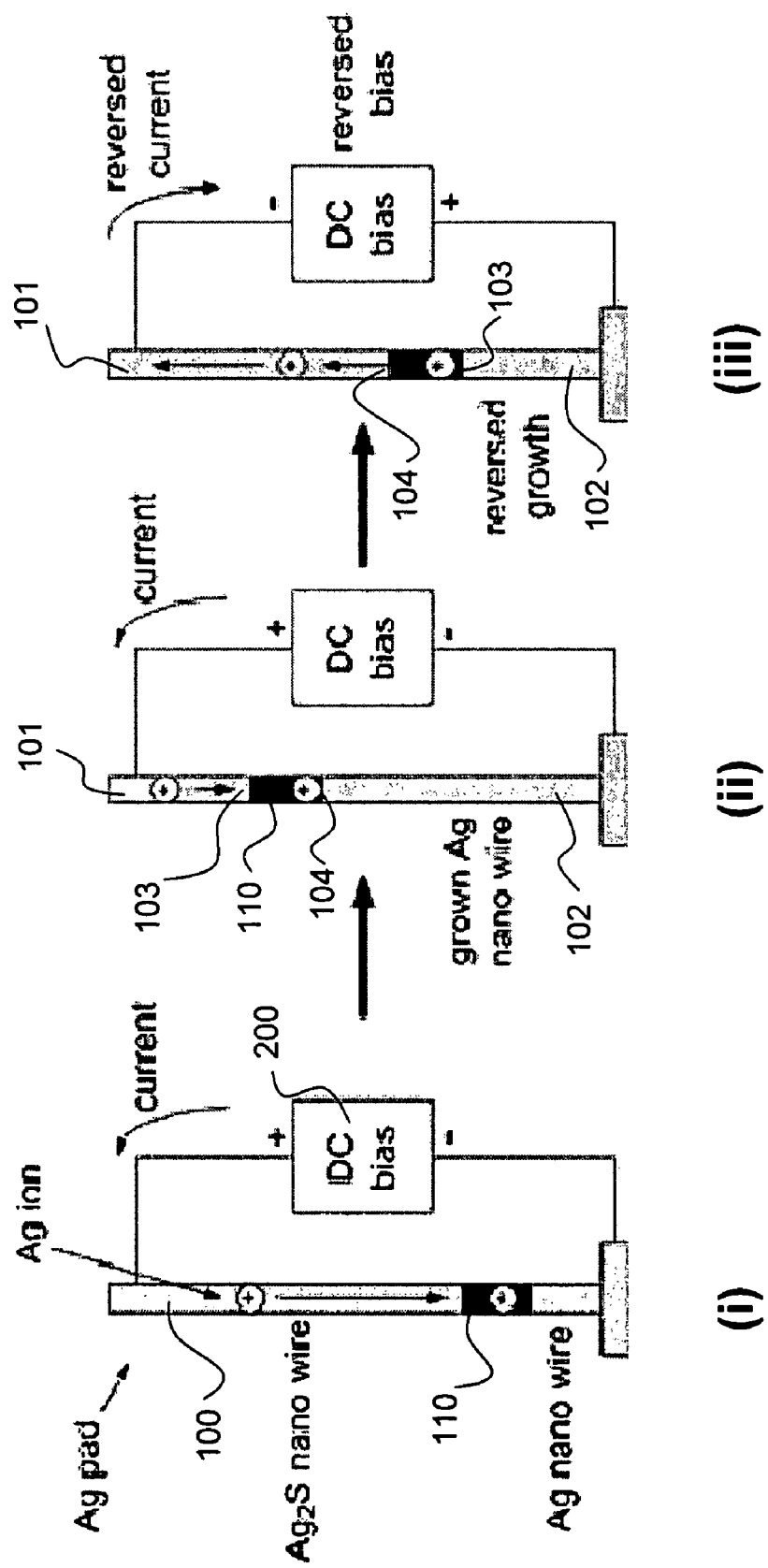
FIG. 28 A. Schematic of how the electrically driven mobility of silver in silver sulfide is used to modulate the effective length of a nanowire. B. Micrograph showing the spontaneous formation of silver nanowires when a sharp probe (AFM tip) with an electrical bias is moved close to the surface of an $Ag_2S$ substrate (the scale bar is 5 μm); C. Schematic of process steps for fabricating a dense two-dimensional array of nanowires whose effective length can be ionically programmed. D. Shows a flow-process of the steps used to make a tunable THz resonator/antenna.
Figure 28B:
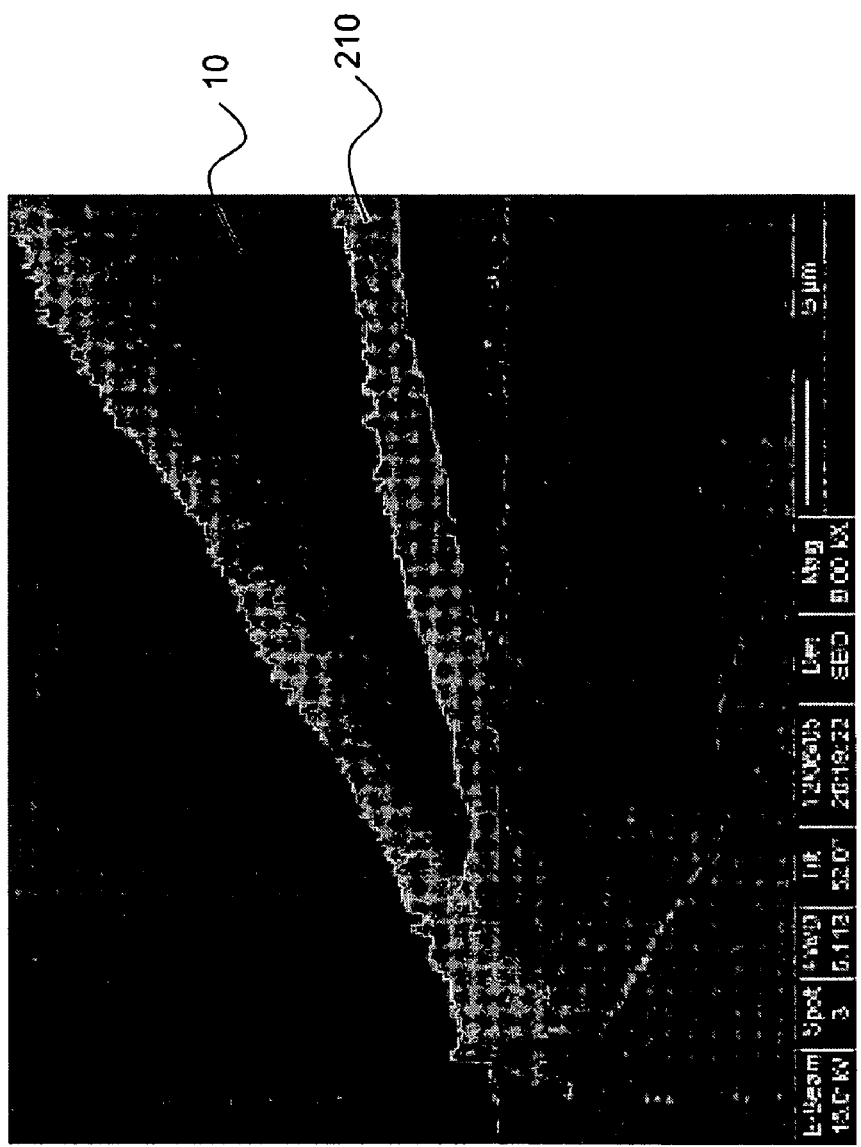
Figure 28C:
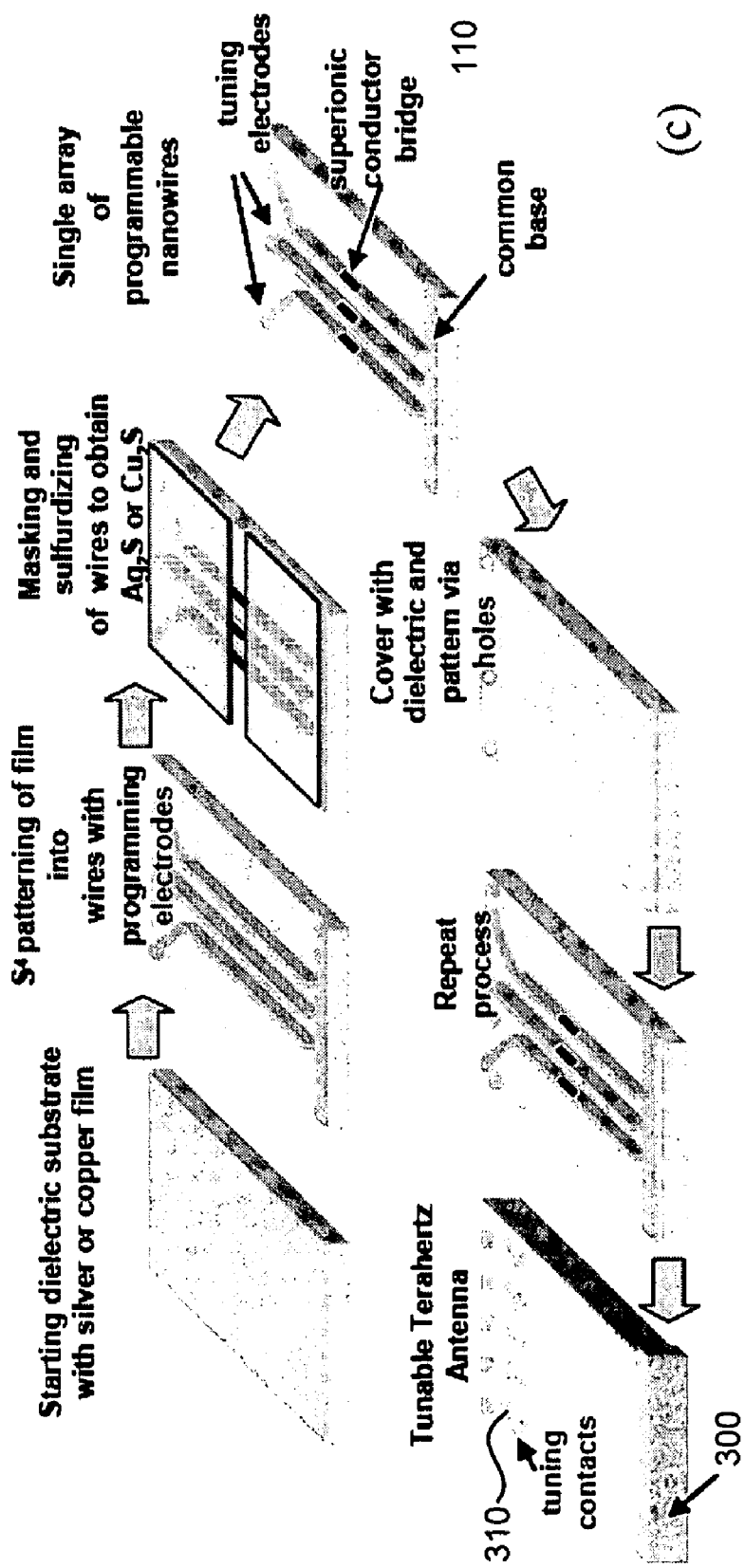
Figure 28D:
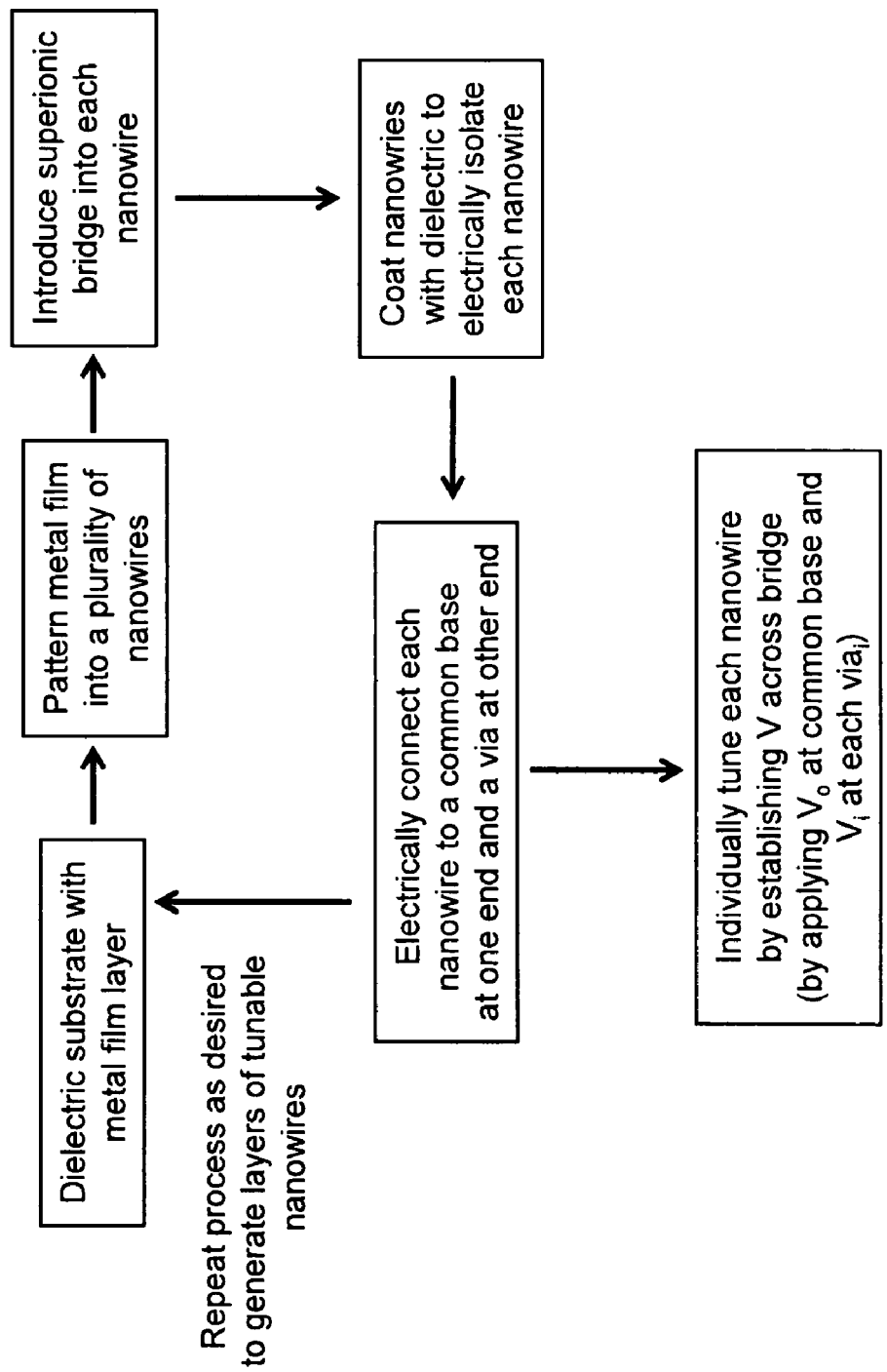

The nanowire resonators are tuned or programmed to different frequency bands by changing the effective length of the nanowires by using ionic transport across a superionic material segment in the wire. FIG. 28A shows a schematic of reversible growth of an Ag nanowire 100 by electrochemical bridging. As a bias or electric potential difference 200 is applied across the short segment of an Ag$_2$S bridge 110 between two silver nanowires 101 and 102, constrained by the template, one end 103 of the nanowire 101 will dissolve into the Ag$_2$S bridge 110 and the opposite end 104 of silver wire 102 grows up steadily. The overall effect generated by silver ion migration is the axial migration of Ag$_2$S (e.g., the gap or bridge 110) along the nanowires, repartitioning the nanowire 100 while keeping the overall length unaffected at equilibrium (compare FIG. 28A(i) with 28A(ii)). The ability to perform direct writing (Ag nanowire growth and dissolution rate at nearly 100 um/s with 2 volt bias) with silver sulfide micro wires and others [Terabe et al, 2002] provides further evidence of efficient transport of silver ions across a short Ag$_2$S bridge. FIG. 28A depicts the schematic for programming wire length. Reversing the bias or potential 200 reverses the direction of travel of bridge 110. FIG. 28B provides evidence of rapid transport of silver ions out of an Ag$_2$S substrate when a charged tip 210 is drawn near to the substrate 10. FIG. 28C is a schematic of an approach that employs an S$^4$ process to produce a dense array of ionically-tunable nanowires. For fabrication purposes, in-plane linear arrays of nano-wires are produced by the S$^4$ devices and methods of the present invention. Masking and sulfurization (using a process similar to Terabe et. al 2002) produces a superionic bridge in the wires. Each layer is embedded in a dielectric polymer matrix. This can be achieved by conventional flash-type imprint lithography using a flat mold with only posts for the via contacts between layers (a process that can be performed on our current S$^4$ equipment). Finally, repeated layering of such wires attached to a common base and a set of tuning contacts produces an ionically-tunable nano-wire terahertz antenna. FIG. 28D provides a flow-process diagram of the process, wherein any number of tunable nanowires layers are manufactured. Not shown is the electrode assembly for generating an electric potential across the superionic bridge. Specifically, one electrode is electrically connected to the common base 300 and another electrode is electrically connected to a tuning contact (e.g., via 310), thereby providing an ability to generate a controllable, variable and reversible electric potential difference across the bridge to provide the capability to controllably position the location of bridge 110. Individually addressing each via 310 with individually controllable electrode, provides more flexible tuning capability.

EXAMPLE 6

Active Sensors and Waveguides

Very-large-scale integration (VLSI) of photonic/optical devices requires cost-effective and reliable manufacturing of optical switches and interconnects. Plasmonic devices known in the art such as channel Plasmon polaritions (CPPs) (Bozhevolnyi et al. 2006) can operate as low loss sub-wavelength guides. Those plasmonic devices are essentially patterns of V-shaped grooves in thin metal films on dielectric substrates. Alternatively, noble metal nano-particle chains that couple Plasmon-polariton modes (Maier et al. 2002) are candidates for efficient sub-wavelength waveguides. In both those systems, however, there exist no economically viable technologies for fabricating the metallic structures with the dimensional uniformity and fidelity required for reliable end-device function.

The solid-state superionic stamping systems and methods disclosed herein are capable of patterning metallic structures with high dimensional uniformity to generate working waveguide structures that operate as low loss sub-wavelength guides. In addition, the process and systems of the present invention provide the ability to fine tune structure dimensions, thereby permitting multiplexed information channels at Y-junctions.

Other devices, including but not limited to ring resonators, interferometers and bulls eye-type plasmonic lenses can be used in photonic circuits, as well as facilitating a wide variety of sensor technologies such as biological and/or biochemical sensors.

Active plasmonic components of the invention circumvent the diffraction limit of light, which hinders the miniaturization and high-density integration of optical circuits. Our approach relies on surface plasmons that can laterally confine the light wave using patterned metal structures [Bozhevolnyi et al, 2006].

Figure 29:
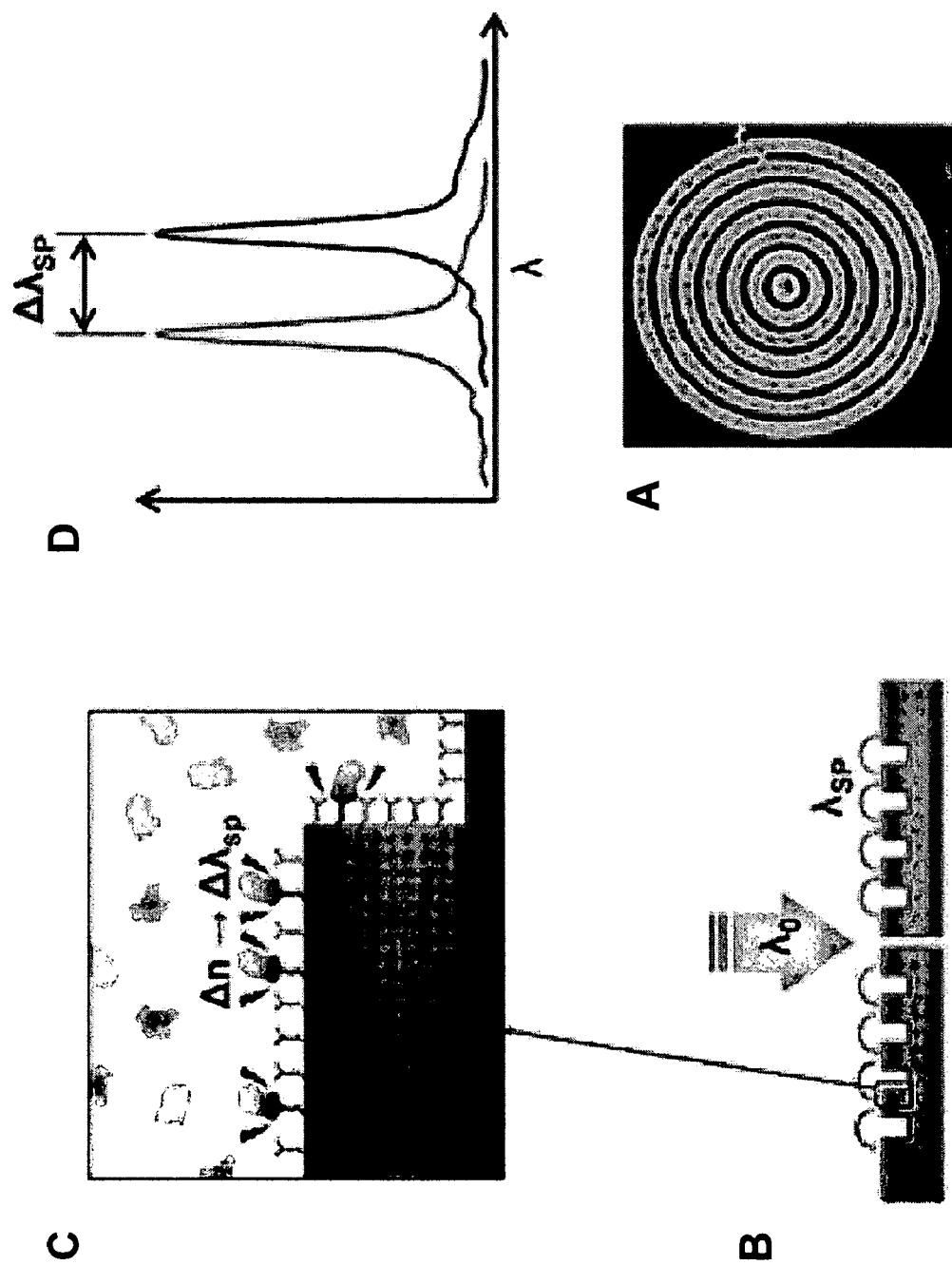
FIG. 29 illustrates a resonant plasmonic sensor that detects binding events, and therefore, presence or absence of analyte and analyte concentration.
Figure 30:
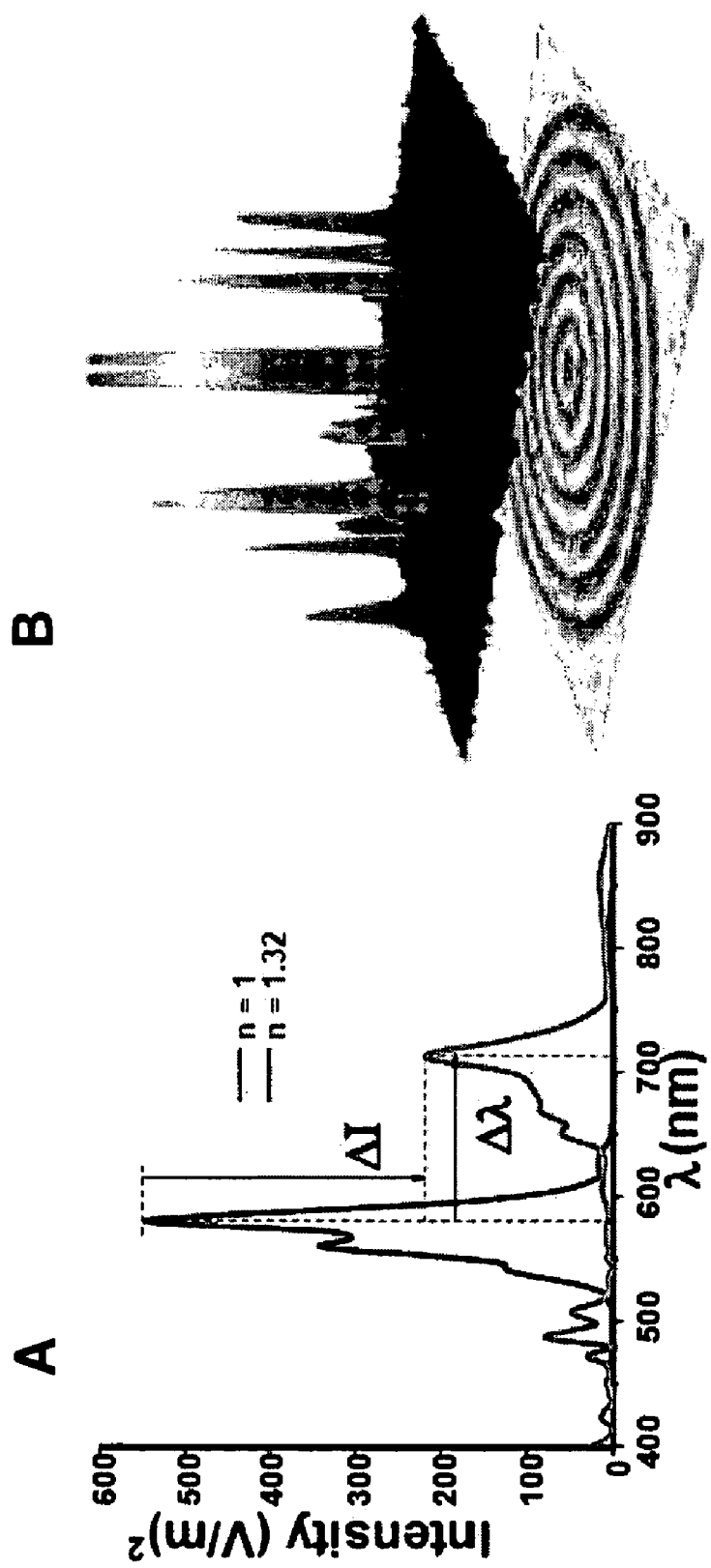
FIG. 30 summarizes: A. the numerical simulation indicating the high sensitivity achievable with a small footprint plasmonic sensor. The wavelength shift to index variation ratio ($\Delta\lambda/\Delta n$) ~418 nm/RIU. B. Topographic and optical near-field characterization of the plasmonic sensor (illumination wavelength 633 nm).

The surface plasmon resonance condition is highly dependent on the optical properties of the metal and the surrounding medium. This inherent sensitivity to the environment makes surface plasmon devices an ideal candidate for sensing applications. A resonant plasmonic sensor based on the above principle for detecting the binding events of unlabeled molecules is illustrated in FIG. 29. When the incident radiation wavelength matches the resonant wavelength of the structure, the "bulls' eye" structure creates a highly enhanced near field. When the aperture is bound with the specific chemical species (e.g., an analyte), the 'effective refractive index' of the surrounding medium changes, giving rise to a change in the resonance wavelength and beaming angle. This shift in the resonant wavelength is used to optically detect very low concentrations of analytes. FIG. 29 depicts the chemical sensing scheme. Numerical calculations (by CST microwave studio) suggest a wavelength shift of about 150 nm in the visible spectrum when refractive index changes from 1 to 1.32, or a sensitivity of 418 nm/RIU (refractive index unit). Preliminary experimental characterization (FIG. 30) of the Bull's eye plasmonic sensor with a near field scanning optical microscope indicates an enhanced transmission over 30 times through the center aperture.

As shown in FIG. 29, sensors are made using the $S^4$ process. Depending on operating conditions and required sensitivity, the sensor is fine-tuned and refined. The sensors are capable of being designed to be a highly compact sub-wavelength near-field sensor with surface plasmon controlled beaming for small footprint ranging from small-scale (e.g. micrometer scale) sensors to large-scale (e.g., millimeter and centimeter scale) and larger chemical sensors, including chemical sensors for microfluidic devices. Further, because of the sensitivity of the resonance conditions to small dimensional errors, we conduct spectroscopic experiments with tunable sources. In an aspect, the invention provides a plasmonic sensor that has a small footprint, including a footprint that is in the submicrometer range, with a femtoliter sensitivity that rivals that of state-of-the-art commercial planar surface plasmon sensors. This makes it valuable for applications requiring integration of sensors for detection of molecular species in microfluidic channels. The development of this unique class of resonant surface plasmon sensor arrays is useful for combinatorial biochemical screening and drug development.

Figure 31:
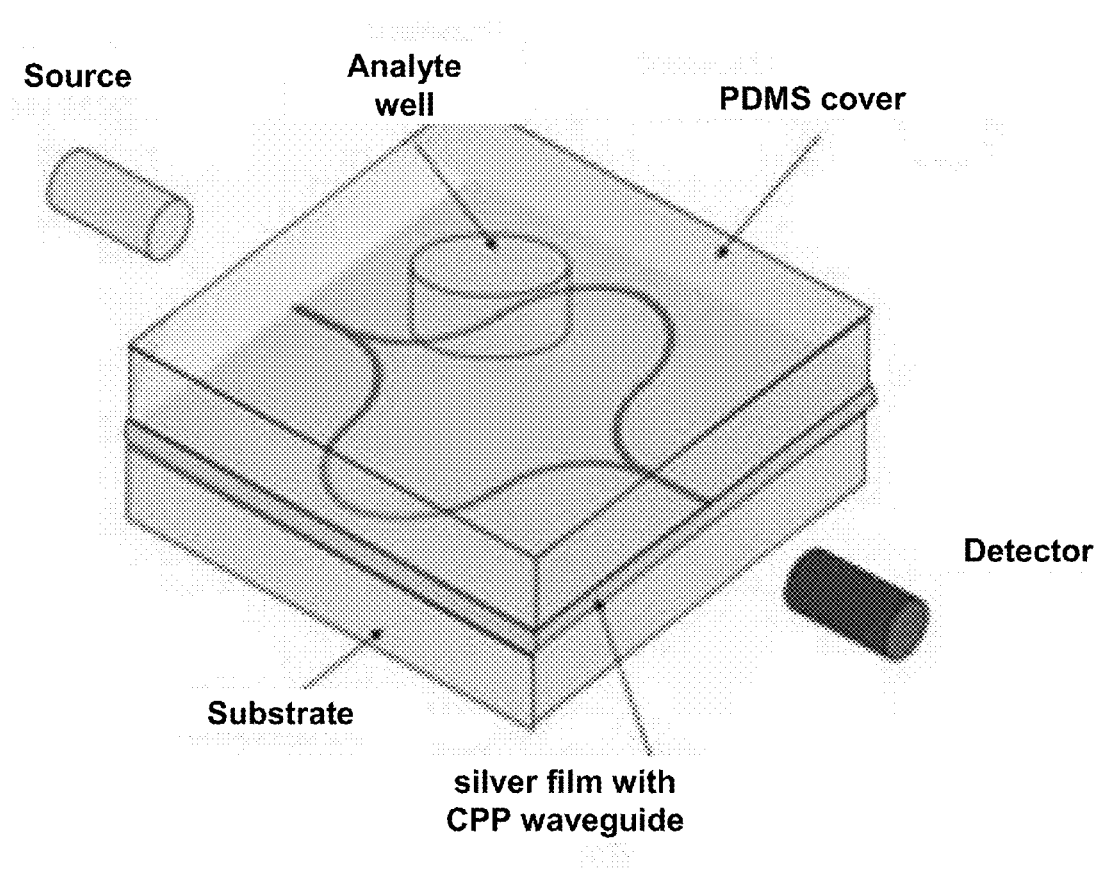
FIG. 31 is a schematic illustration of a CPP Mach-Zehender interferometer used in configuring a chemical sensor.

Besides plasmonic enhancement of optical coupling across a substrate with a propagation direction perpendicular to the substrate, sub-wavelength plasmonic structures for in-plane waveguides are produced and tested. For example, FIG. 31 shows a schematic of a CPP (Channel-Plansmon-Polariton) [Bozhevolnyi, 2006] that is used as a chemical sensor. From a manufacturing perspective, this CPP waveguide is patterned directly in a silver film on glass using the $S^4$ process. A challenging part is the creation of the stamp for imprinting. For the initial effort, we directly pattern the $Ag_2S$ stamp using FIB milling. When the dimensions and design is verified, a master in silicon is created and used for direct embossing on $Ag_2S$ to create the stamp for the $S^4$ process.

Figure 32:
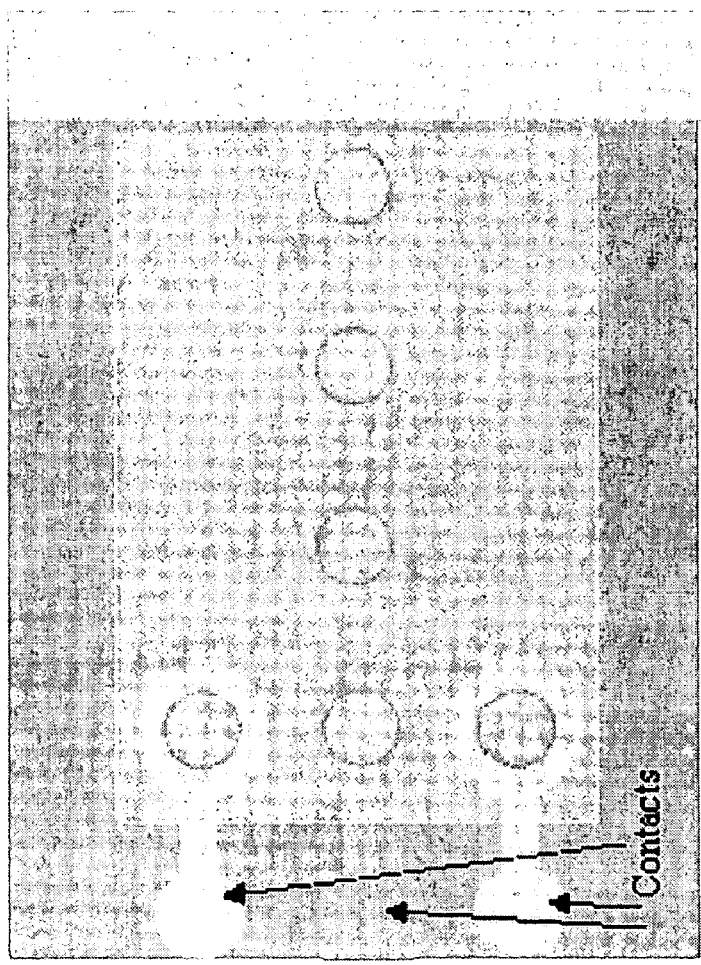
FIG. 32 Schematic layout of the tunable plasmonic Y junction.
Figure 32:
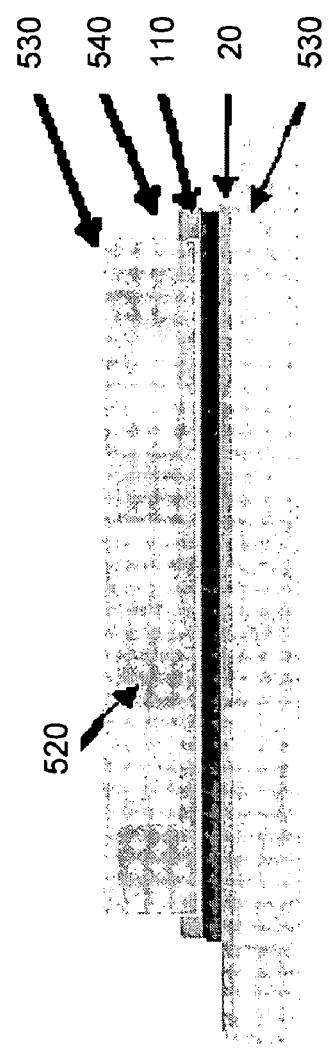

Another embodiment of the invention is a switchable Y-junction using nano-particle chain coupled plasmon-polariton waveguide [Maier 2002]. This plasmonic waveguide or switch is created by growing and shrinking a silver nano-rod at the junction by ionically transporting silver ions into and out of it. The dependence of resonance conditions on particle size causes the polariton to pick one path over the other. A schematic of this electronically tunable plasmonic switch for on-chip optical communication is shown in FIGS. 3, 14 and 32. The creation of an electrochemical cell in which the two nano-particles form the electrodes bridged by a superionic conductor causes the anode to shrink and the cathode to grow, following a similar mechanism to modulate the particle sizes, as in the electrochemical switches by Terabe et al [2005]. Further, using an electrochemical atomic force microscope (EC-AFM) to trigger the silver growth through ion migration in $Ag_2S$, it is confirmed that nanoscale silver clusters can be grown or dissolved by reversing the polarity of applied bias (FIG. 3). The fast and reconfigurable plasmonic interconnect enabled by the superionic conduction facilitates development of new architectures required for all-optical computation devices. FIG. 32 shows the detailed layout of such a Y junction in the plasmonic waveguide depicted in FIG. 14. Referring to FIG. 32, the $Ag_2S$ 110 forms a bridge between a silver film 20 and the nanorod 520. Every rod 520 is capable of being dissolved or regrown inside the polymer encapsulation 530, thereby controlling light path direction. The fabrication of the system includes depositing a relatively thick (around 500 nm) layer of silver film 20 on to a substrate 530 (plastic or glass). Using a mask, the silver surface is sulfurdized to create a thin layer of $Ag_2S$. A dielectric 540 is deposited and patterned. Another layer of silver is deposited and patterned into rod using the $S^4$ process and the system is encapsulated in a dielectric polymer 540 spun over the rods.

EXAMPLE 7

Actuators

The underlying basis of the present invention, e.g., ionic migration of the metallic species in a superionic conductor and resultant spatial concentration gradient, can be harnessed to generate stresses and resultant strains in the system to generate controlled structure deformations. In particular, nanoscale and microscale actuators require lower voltages than piezoelectric actuators. In addition, the response times of the actuators of the present invention can be faster because of higher ion mobilities than electroactive polymers known in the art (e.g., see Shahinpoor et al. 2004).

Figure 33:
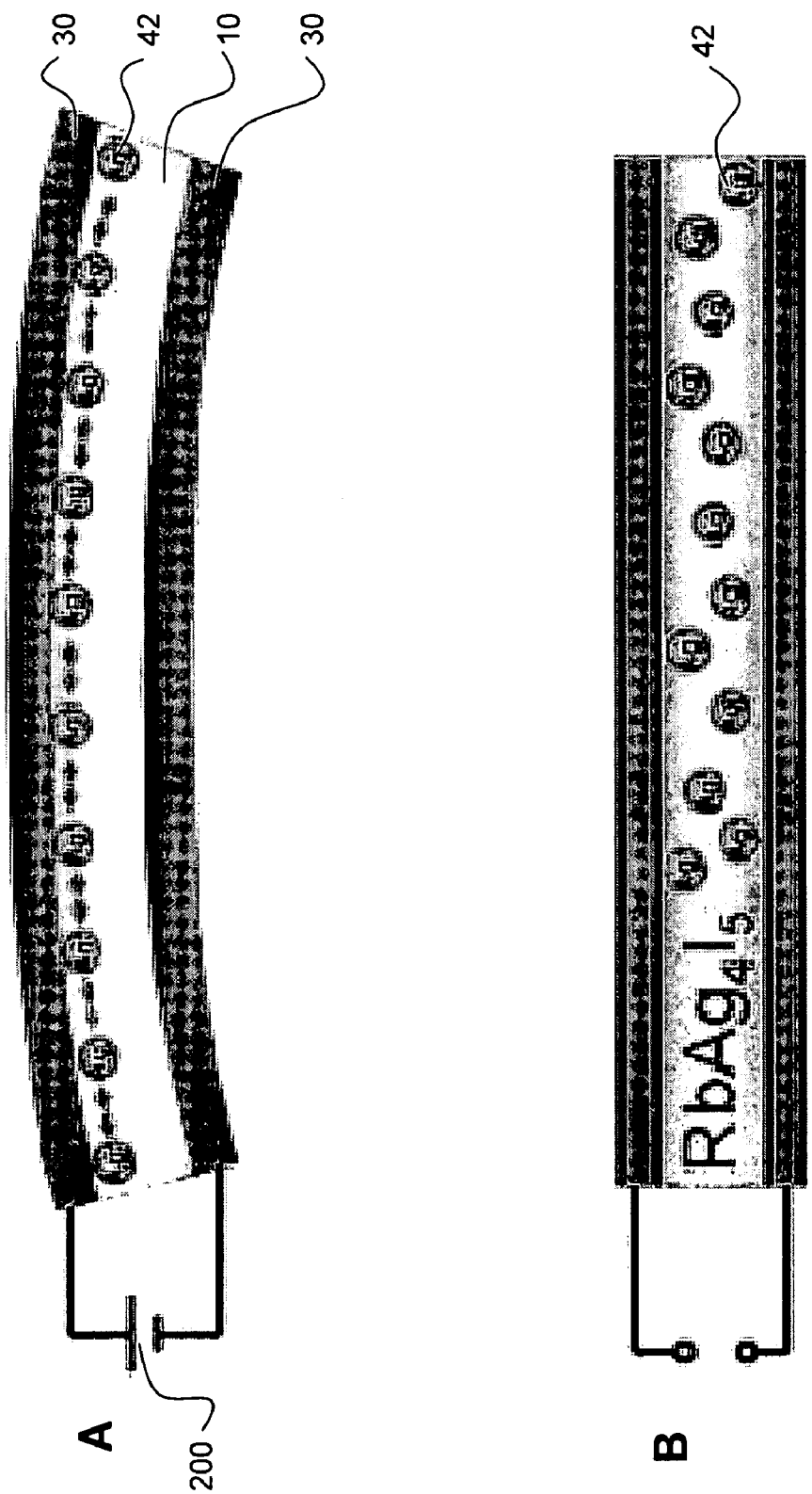
FIG. 33 is a schematic of a superionic artificial muscle (e.g., actuator) that is based on charge-induced strain at the metal/solid electrolyte interface.
Figure 34:
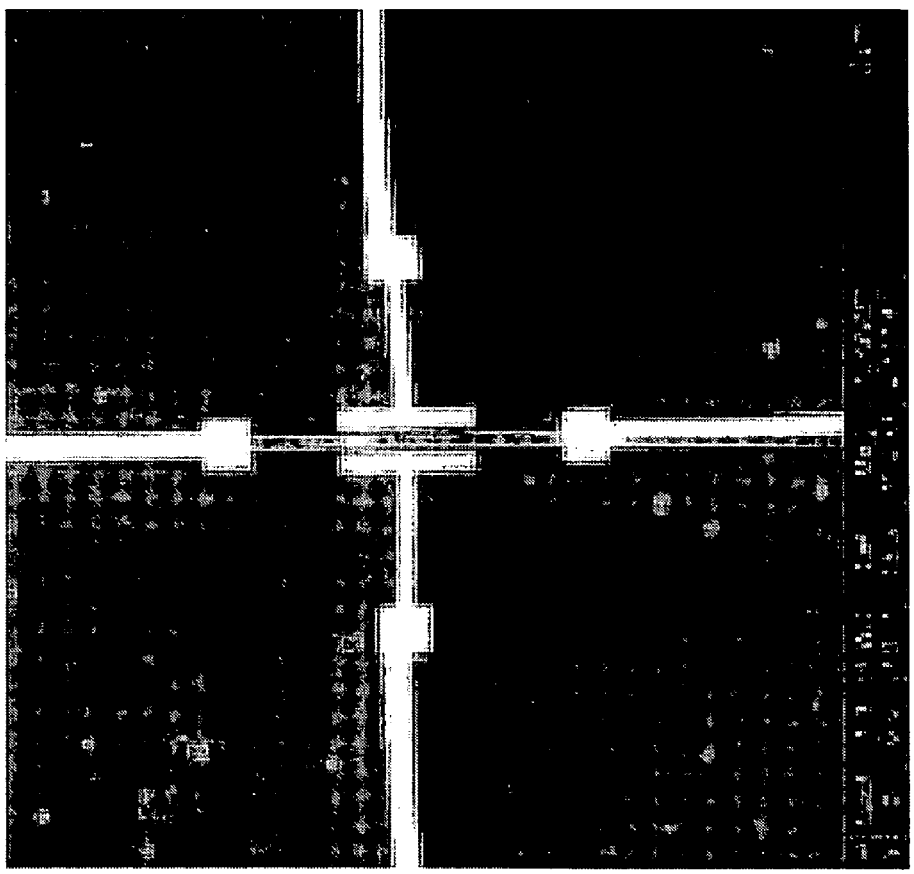
FIG. 34 is a high-resolution nanoelectrode (40 nm width) patterned by an $S^4$ process offering excellent surface to volume ratio.
Figure 35:
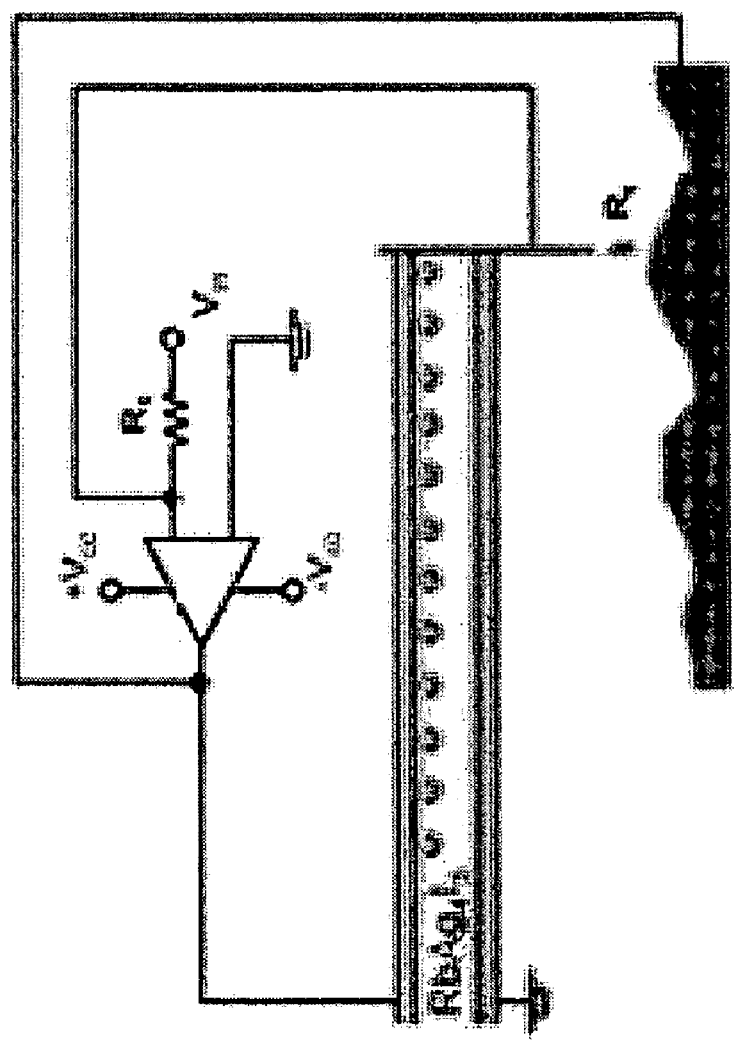
FIG. 35 is a schematic of a high-bandwidth active scanning probe powered by a superionic artificial muscle capable of real-time observation of biological and chemical processes at nanoscale level.

Strain is produced based on one of two mechanisms. The first class of actuators has strain produced within the superionic conductor by applying a field across it, using non-reacting metallic electrodes. The second class of actuator has strain produced in metallic films located on a superionic conductor through anodic dissolution or cathode deposition of a mobile metallic species. A schematic illustration of an actuator of the present invention is provided in FIG. 33. Under an applied electric potential 200 (FIG. 33A) ion 42 migration within the solid state ionic conductor 10 generates a strain-induced deformation. When ions 42 are uniformly distributed in the solid state ionic conductor 10 (FIG. 34B), the actuator does not undergo any deformation, such as when there is no applied electric potential.

In an aspect, the invention is a nanomechanical actuator (e.g., a superionic artificial muscle based on the conversion of electrochemical energy to mechanical strains). In analogy to the concept of electro-active polymer actuators, the superionic actuator operates by accumulation of a thin skin of highly concentrated ions near the interface due to an applied bias. This thin skin of spaced charged layer carries a capacitance, equivalent to a parallel plate capacitor. The repulsion of the highly concentrated ions causes a significant compressive surface stress, which in turn bends an actuator, such as a cantilever-shaped or other-shaped actuator The actuators of the present invention generate useful forces and deflections, as demonstrated by electrochemical actuators in Weissmuller et al [2003] in which a porous assembly of compacted Pt nanoparticles is immersed in liquid electrolyte. Application of a potential of only a few volts generates a maximum observed actuation strain (which determines the actuator stroke) of ~0.15% for the platinum electrode. This actuation strain is about the same as for commercially-used ferroelectric ceramics. The required voltage, however, is much lower compared to piezoelectric actuators, which typically require on the order of 100 Volts.

To achieve high actuator strains at low voltages, we use high capacitance per weight of actuator electrode. This is important because capacitance is the derivative of stored charge with respect to potential, and actuator strains increase with increasing charge per electrode weight. The actuators of the present invention satisfy this requirement as the space charge layer can be atomically thin in the superionic materials having high ionic conductivity, and the surface area to volume ratio of the patterned nanoelectrodes using $S^4$ process can be dramatically increased compared to bulk metal contacts.

Although the actuation mechanism of our superionic actuator or "artificial muscle" devices are functionally similar to those of nanoparticles or carbon nanotube electrodes in liquid electrolytes, the present invention actuators having superionic conductors are advantageous based on: (1) The actuation rate can be remarkably fast due to high ionic mobility (up to 0.24 cm$^2$/s in Ag$_2$S and exponentially increases with elevated temperature); (2) The actuator-generated strain can be increased by using solid electrolyte with a wide redox stability; (3) The actuator can operate at vacuum and elevated temperature, making them more amenable to harsh environmental conditions such as in deserts compared to commonly used actuators.

Theory and modeling of ionic transport and electro-mechanical coupling is pursued based on experiments with artificial muscle devices. Our simple estimate of the surface stress $\sigma_s$ induced by the space charged layer capacitance upon applied voltage V, gives:

$$\sigma_s = \frac{1}{2}\frac{\varepsilon}{\delta}V^2$$

where $\varepsilon$ denotes the permittivity of the space charge layer and $\delta$ denotes the space charge layer thickness (in nm range). As a result, the estimated maximum displacement $\delta d$ at the tip of the artificial muscle, based on bulk material properties, can be appreciated from Stoney formula:

$$\delta d = \frac{3(1-\upsilon)L^2}{Et^2}$$

or:

$$\delta d = \frac{3(1-\upsilon)L^2\varepsilon}{2Et^2\delta}V^2$$

where E and v are the effective modulus and Poisson ratio of the cantilever, and L and t are the corresponding length and thickness of the cantilever, respectively. A first order estimate using V=0.6V, L=20 micron and t=100 nm gives a maximum deflection larger than 100 nm, indicating large strains are feasible with the actuators of the present invention. Similarly, the actuation rate is proportional to the diffusion rate across the space charge layer, and our estimate gives a operating frequency higher than 100 kHz, which is in good agreement with the switching frequency of 10 MHz observed in Terabe's work on QCAS [Terabe, 2005].

The actuators of the present invention are capable of fast response times and have low voltage requirements and are well suited for incorporation into atomic force probes as superionic cantilevers. The standoff height of the fast scanning probe, for example in the form of tunneling current, is optionally used as a feedback signal to drive the superionic artificial muscle powered cantilever, achieving high-speed surface imaging. This is essential for real-time observation of biological and chemical processes that take place within a fraction of second. Those studies are far beyond the reach of commercial AFM systems based on piezoelectric stacks or tubes, commonly with a characteristic bandwidth in 100 s Hz.

Figure 36:
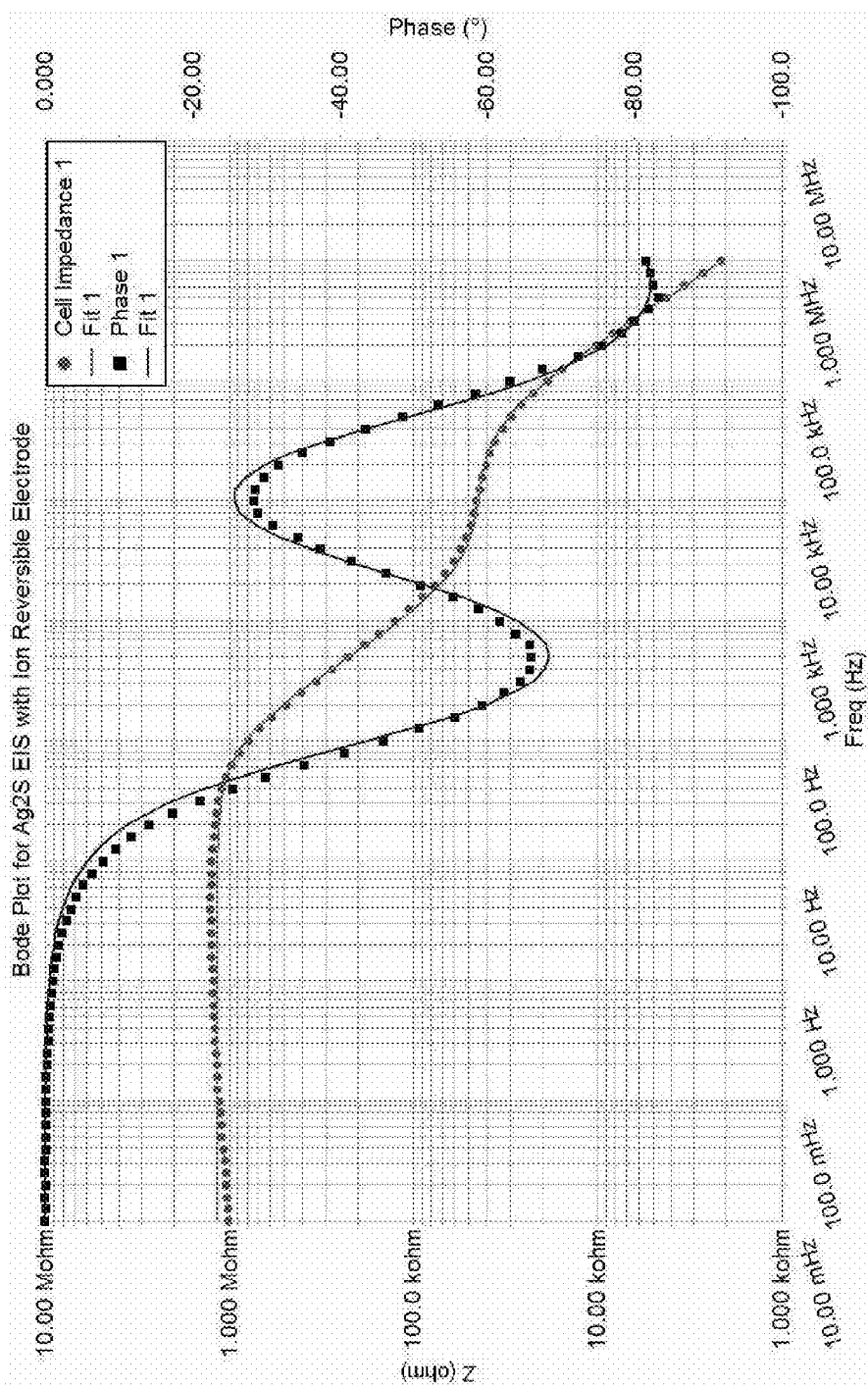
FIG. 36 is an electronic impedance spectroscopy plot of the $Ag_2S$ stamp.
Figure 37:
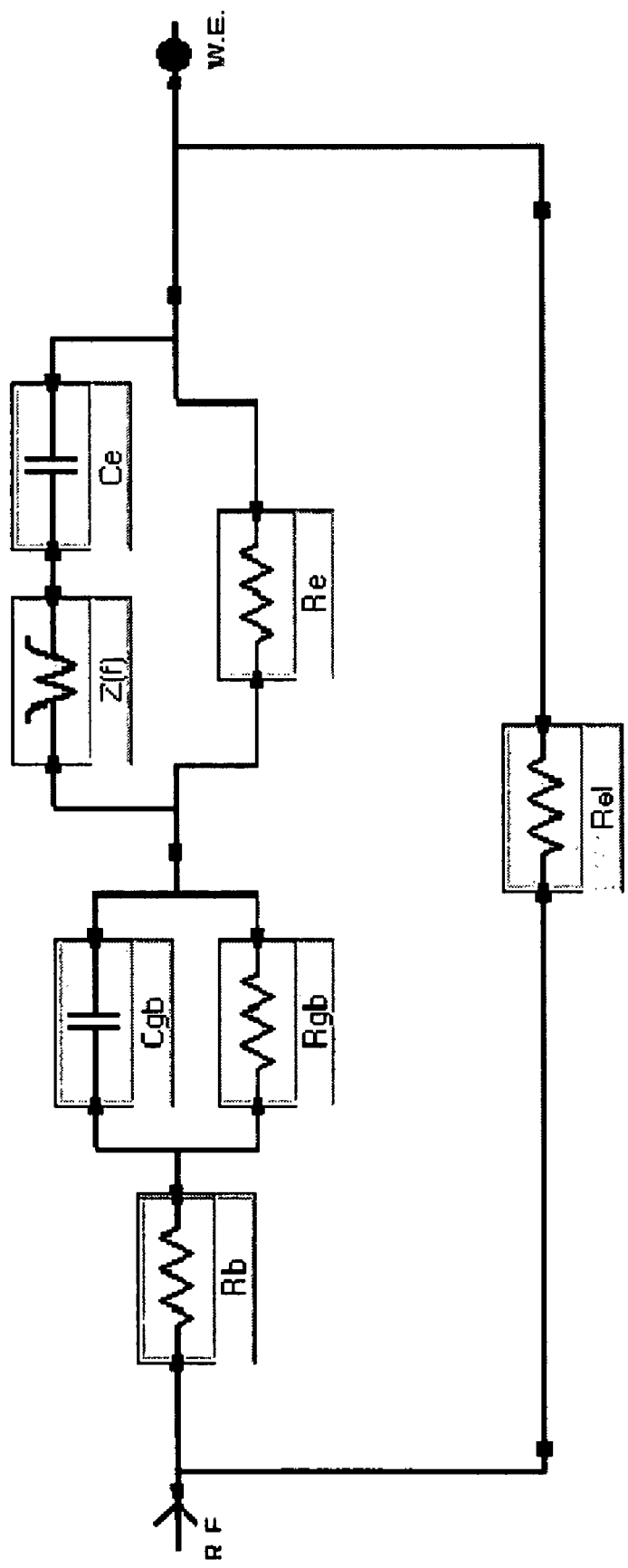
FIG. 37 is the effective circuit of the spectral measurement of FIG. 36, indicating the contribution of grain boundary scattering and interface reactivity at the stamping contact.

Modeling and Characterization of ion transport and induced strain in superionic and mixed conductors. Ion transport is central for active modulation of the metallic structures outlined in each of the previous examples. To study the manufacturing process and for elaborating the device physics, it becomes necessary to include the large class of solid state ionic conductors. To understand the combined ion and electron conduction, growth and dissolution mechanism, and to further optimize the performance and design of the superionic conductor for both process and device demonstration, we develop and use computational methods based on self-consistent Poisson-Nernst-Planck models. At the micro and nanometer level, the mobility and transport depends on defect density, available interstitial pathways, local electrostatic fields (that may depend on locally non-stoichiometric mixtures of ions, and geometry), etc. Experimental work is performed to develop electrochemical cells (for example, electrochemical impedance spectroscopy (EIS) of the stamping process in FIG. 36) and to characterize the stamp materials and estimate values for the input parameters of the computational models (FIG. 37).

Techniques to dissect stamps and measure local values (electronic conductivity, ion concentrations, etc.) verify the computational models and also estimate important process variables such as the life of the stamp. The geometric and compositional properties of the interface between the stamp and the substrate play a central role in efficiency of the process. Approaches to understand both computational modeling and experimentally studying the interface (as with the use of EIS) assist in further understanding the underlying processes associated with superionic conductors and their use in the devices disclosed herein.

EXAMPLE 8

Figure 38:
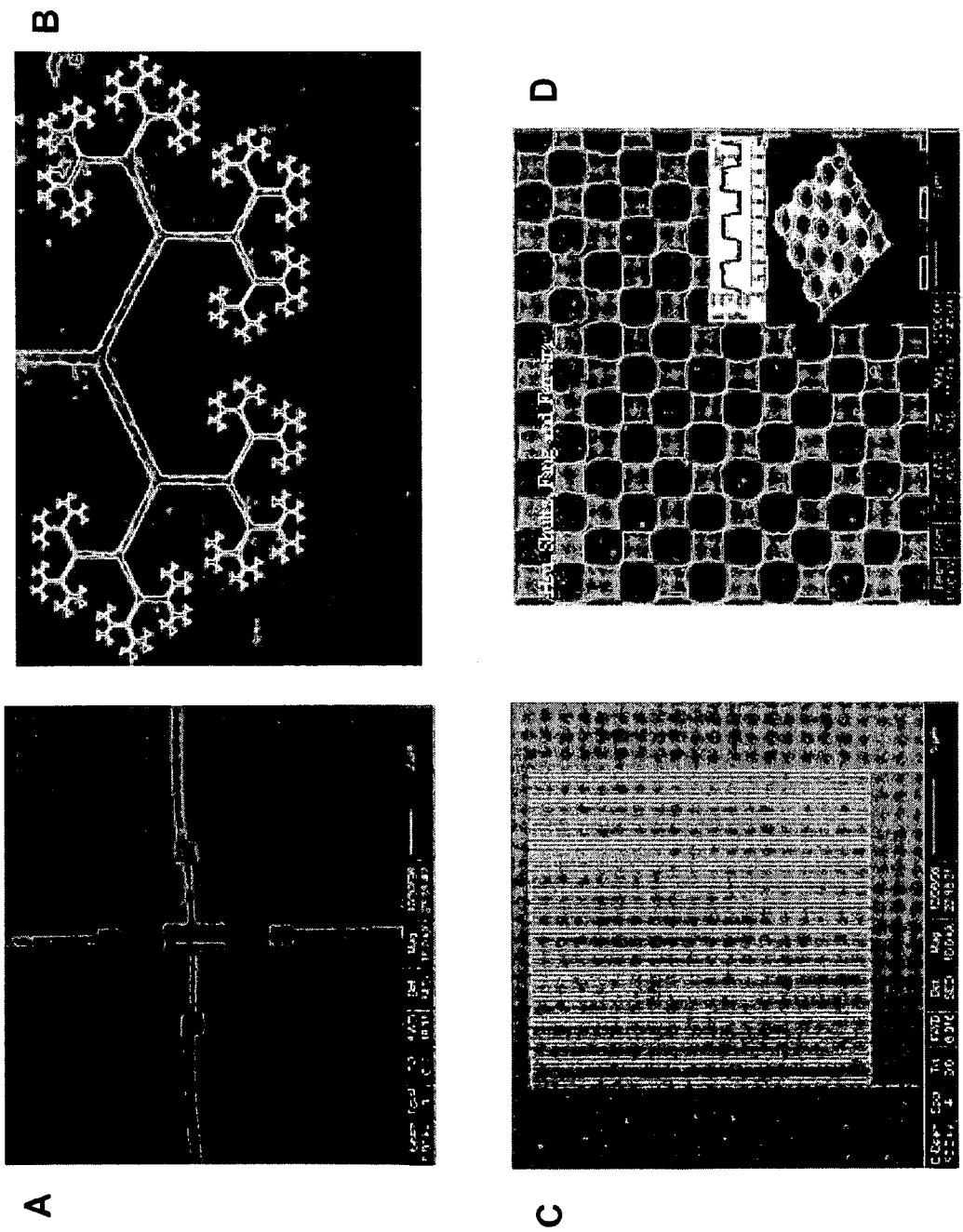
FIG. 38 Patterning results from S4. (a) A chemical sensor with a 40 nm silver wire on silicon nitride, (b) A fractal antenna with 100 nm features made of silver on silicon nitride, (c) A 70 nm copper nanowire that is 1.35 mm long on silicon and, (d) A periodic pattern of copper on glass.
Figure 39:
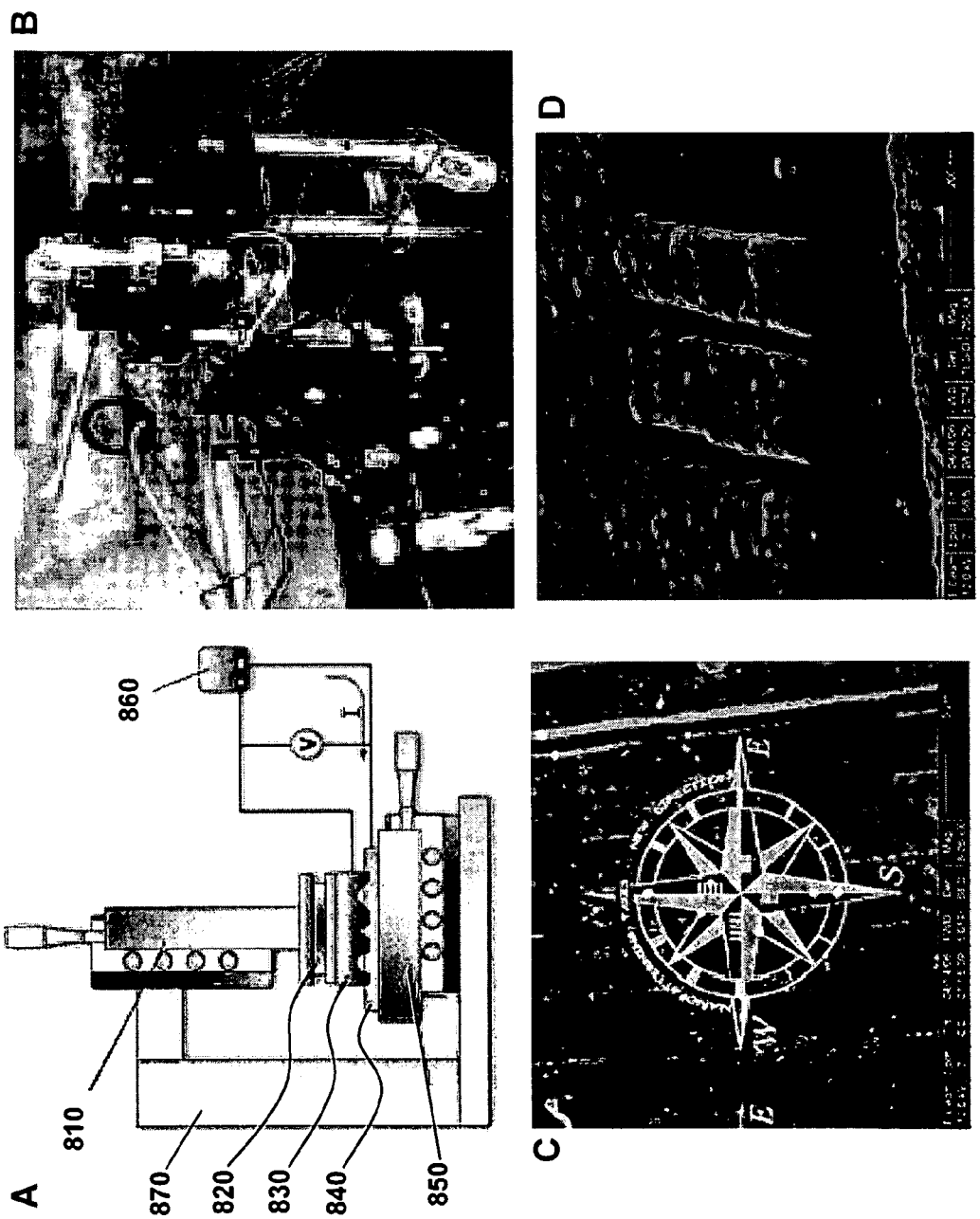
FIG. 39 (A) A schematic drawing of the solid-state superionic stamping set up. Kinematic microstages 810, 850 for positioning and alignment of stamp and workpiece, Viscoelastic material 820, superionic stamp 830, workpiece 840, potentiostat 860. (B) Photograph of the laboratory step up for the process (see also FIG. 6) (C) A pattern stamped by the process (D) A close up view of a feature in the pattern produced by the stamp after 9 repetitions showing 50 nm features transferred to the substrate with high fidelity.

Applications, Systems and Processes for Direct Patterning of Nanoscale Metal Structures The electrochemical patterning process that directly (in a single step) patterns metal films with nanometer scale resolution in less than 3 minutes under normal environmental conditions is disclosed herein [see also, U.S. patent application Ser. No. 11/376,908 and Hsu et al, NanoLetters 2007, 7(2), 446-451]. This electrochemical manufacturing process, called Solid State Superionic Stamping (S4) is fully compatible with existing electrochemical manufacturing processes and patterns metal in a single step, without use of liquids or strong mechanical forces. As a result, it is capable of precision in the tens of nanometers, does not contaminate the surface, and has very high process repeatability. The process has the potential for large-area, high-throughput, economical manufacturing of micro and nanoscale metallic structures. FIG. 38 shows a small collection of the types of structures produced by the S4 process. That we have been able to routinely achieve sub-50 nm resolution without process optimization, on conventional laboratory equipment and at ambient conditions attests to the robustness of the S4 process. Further, as indicated in FIG. 38, we have successfully patterned silver and copper, two materials that find applications in electronic and plasmonic structures. As recently reported [Hsu et al, Nano-Letters 2007], this process exploits fast ion conduction in to superionic conductors to directly pattern copper and silver with resolutions better than 50 nanometers. It involves bringing a patterned stamp made of a suitable ionically conducting material in contact with a matched metallic film. Anodic dissolution of the metallic film at the contact interface results in the pattern being transferred from the stamp to the film. FIG. 39 shows a schematic and a photograph of the experimental set up with which we pattern areas as large as 3 mm with 50 to 100 nm resolutions. In this example, we use mixed (electronic and ionic) conductors, $Ag_2S$ and $Cu_2S$ as stamp materials to successfully pattern the silver and copper structures. Given the dearth of dry etch processes for copper, this process is very relevant to a number of steps in the semiconductor and other industries.

The aforementioned technique has application to direct patterning of metal masks and interconnects. For example, the development and use of this process makes it possible to pattern metal masks for ion implantation and optical lithography with nanoscale resolution without limitations of the often-used lift-off process [Madou, CRC Press, 2002]. Given such direct patterning abilities, the resolution and economics of metal-on-polymer mask technology [Tennant, J. Vac. Sci. Technol. B 1(2), April-June 1983 ] can be dramatically altered. Such economically produced metal-on-polymer masks can be used for enhancing the patterning resolution of optical lithography by exploiting various near field optical phenomena (e.g., superlensing, phaseshifting, etc.).

Figure 40:
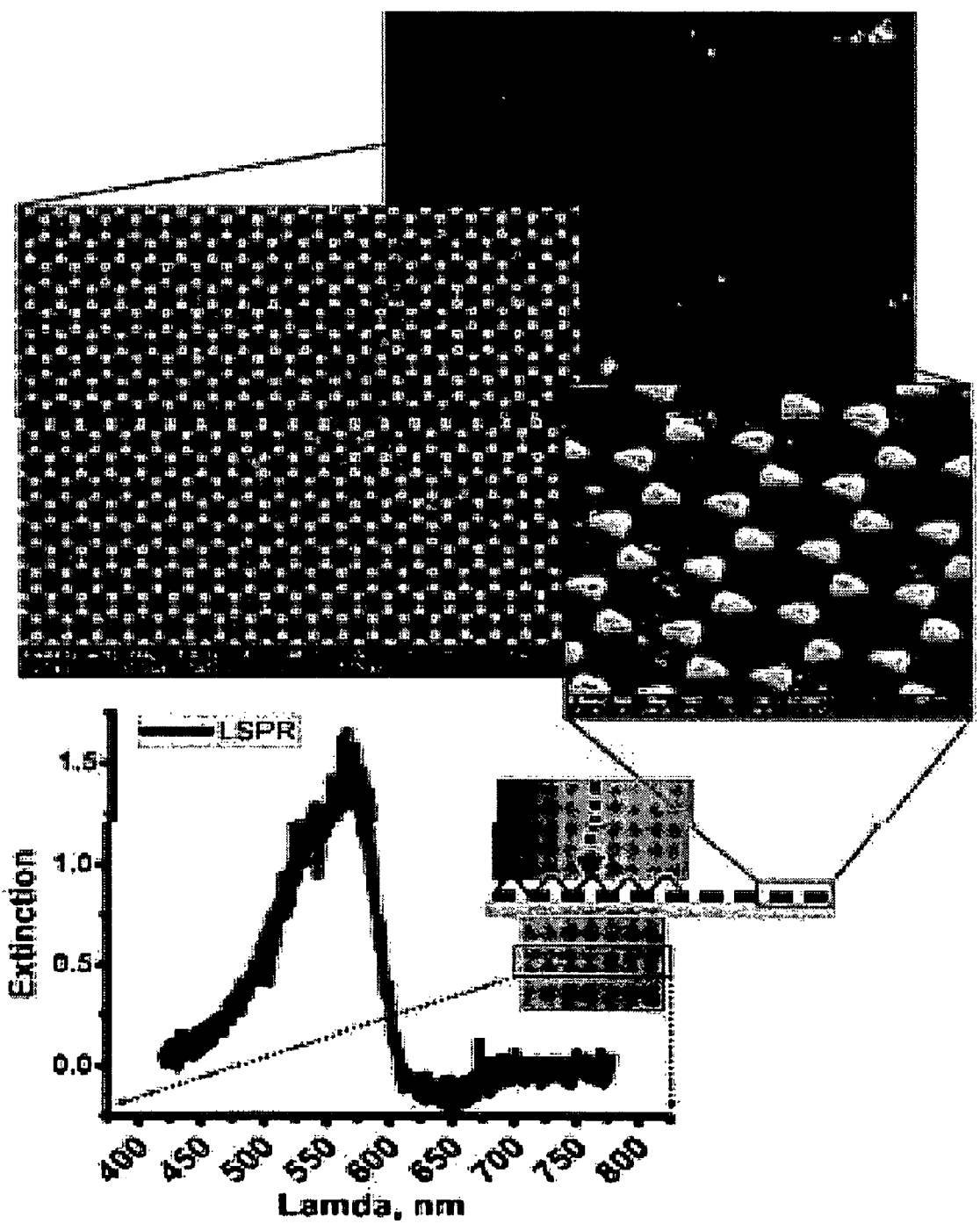
FIG. 40 A silver-on-glass LSPR substrate along with its extinction spectrum.

The direct metal nanopatterning technique is relevant to a number of applications. The underlying mechanisms involved in such an electrochemical imprint process can be applied to metal-on-polymer masks for implantation processes and interconnect metal patterning. Further understanding of the process of anodic dissolution for metal (e.g., copper) patterning provides further detail as to how the process and input parameters such as bias voltage, contact pressure, patterning temperature, substrate film deposition method and surface preparation, stamp fabrication method and prior stamp use influence the process output variables such as patterning speed and resolution and stamp life. Both experimental and computational studies are conducted to provide a better characterization of the abilities of this process to pattern copper along with the associated process economics. For example, we characterize the process with respect to silver nano-patterning for the production of SERS and LSPR substrates for spectroscopy applications (See FIG. 40). The work that further characterizes the processes for copper patterning leverages much of the knowledge and experience we have gained from this work.

Development of a small-scale patterning tool to study the potential and limitations of the process as the patterning area, through put and stamp usage increases. The setup shown in FIG. 39 is adequate for process development and some basic studies. However, to assess and demonstrate the ability of the process as the pattern area, through put and stamp usage increase, we develop a small but precise electrochemical imprinting tool. This allows us to study the influence of pattern area on uniformity of the pattern transferred and the effects of stamp-substrate misalignment. Further, we are able to conduct large-scale stamp life characterization experiments. To develop such a small-scale tool, we undertake the following:

Integrate the process on a dual-actuated high-precision stage. Referring to FIG. 39, two levels of actuation are provided via a dual stage actuation system 870. One is a precision stepper 810 to address a large area (e.g. 4" per side in this example) wafer for a step-and-repeat type operation. The second is a flexure-base actuation system 850 to achieve sub-100 nm overlay accuracy. Both high precision staging and flexures provides an ability to achieve high and reliable pattern fidelity. Expertise in plasmonic sensing and registration are relevant for producing high overlay accuracy. Compliant elastomer 820 facilitates uniform contact pressure between the solid state ionic conductor 830 and the corresponding metal layer 840. Each of 830 and 840 are in electrical contact to an electrode, with the electrode pair having a bias voltage as indicated by V. A power regulator 860 provides bias voltage V between the anode and cathode electrode pair. Means for adjusting bias voltage refers to any system capable of supplying a potential that is controllable, from simple manually-controlled resistors electrically connected between the power supply and the electrode to computer controlled power supplies that can supply constant voltage or constant current as desired and can be programmed to provide time varying voltage profiles or voltage profiles depending on a feedback signal from the electrochemical patterning process. Means for providing motion of the stamping tool relative to the metal refers to motors or positioners that drive either the stamp or the metal, thereby providing controllable motion of the metal and stamping tool relative to each other.

Development of a stamping head: Currently, stamp alignment with respect to the substrate is achieved with a compliant elastomer. This is adequate for relatively small stamps. For high-rate, large-area stamping, we use 1" square stamps and hence integrate into the printing system an automated system for wedge compensation 820 between the stamp and the substrate.

Closed-loop Electrochemical Stamping: The electrical system (FIG. 39) for driving the electrochemical imprinting operation is very robust. However, for high-throughput operation, the process control loop is automated. Such automation may be accomplished by a closed-loop system 860 where the ionic current is used as a signal to servo the motion of the stamp into the metal substrate.

In summary, this set-up permits further study the behavior of the process in conditions that approach large-scale (e.g., industrial) implementation.

Exploration of material systems relevant to superionic stamping of copper. While the copper system is relatively rich in ionic conducting compounds (for example, many of the copper halides display ionic conduction), the levels of ionic conductivity that are required for a reasonably fast stamping process are observed at elevated temperatures. Further, for fabricating stamps, it is important to have good mechanical workability for operations such as planarization of the stamp surface and embossing of the pattern on the stamp. In this segment of the work, we explore various formulations of copper ion conducting polymer composites that further optimize both the mechanical and electrical properties for stamps for this process.

The methods and devices provide the capacity to directly (in a single step) pattern a metal such as copper in the sub-50 nm resolution range. In addition, these experiments provide further process capability characterization as well as optimization of process parameter ranges. The process tools and systems demonstrate the working of the superionic stamping process in conditions that approach industrial applications. Superionic stamp material are selected for patterning metal (e.g., copper) with different patterning characteristics with respect to speed, resolution and patterning area.

EXAMPLE 9

Nanoscale Patterning of Metals with a Polymer Electrolyte

Electrochemical micromachining (see, e.g., Schuster et al. Phys. Rev. Lett. 80:5599 (1998); Schuster et al. Science 289: 98 (2000); Trimmer et al. App. Phys. Lett. 82:3327 (2003)), which works by local dissolution of a conducting substrate (metals, semiconductors) under an applied anodic bias in solution, shows promise in fabricating 3D micro and nanoscale structures and devices, since it requires relatively simple equipment and offers rapid etching compared to conventional techniques such as ion beam milling and laser ablation. However, a liquid electrolyte is difficult to handle and control. Further, transport is difficult to control resulting in accelerated etching at sharp edges and corners. Thus, the resolution of such an approach is limited. This challenge is overcome herein by the use of solid state ionic conductors.

Figure 41:
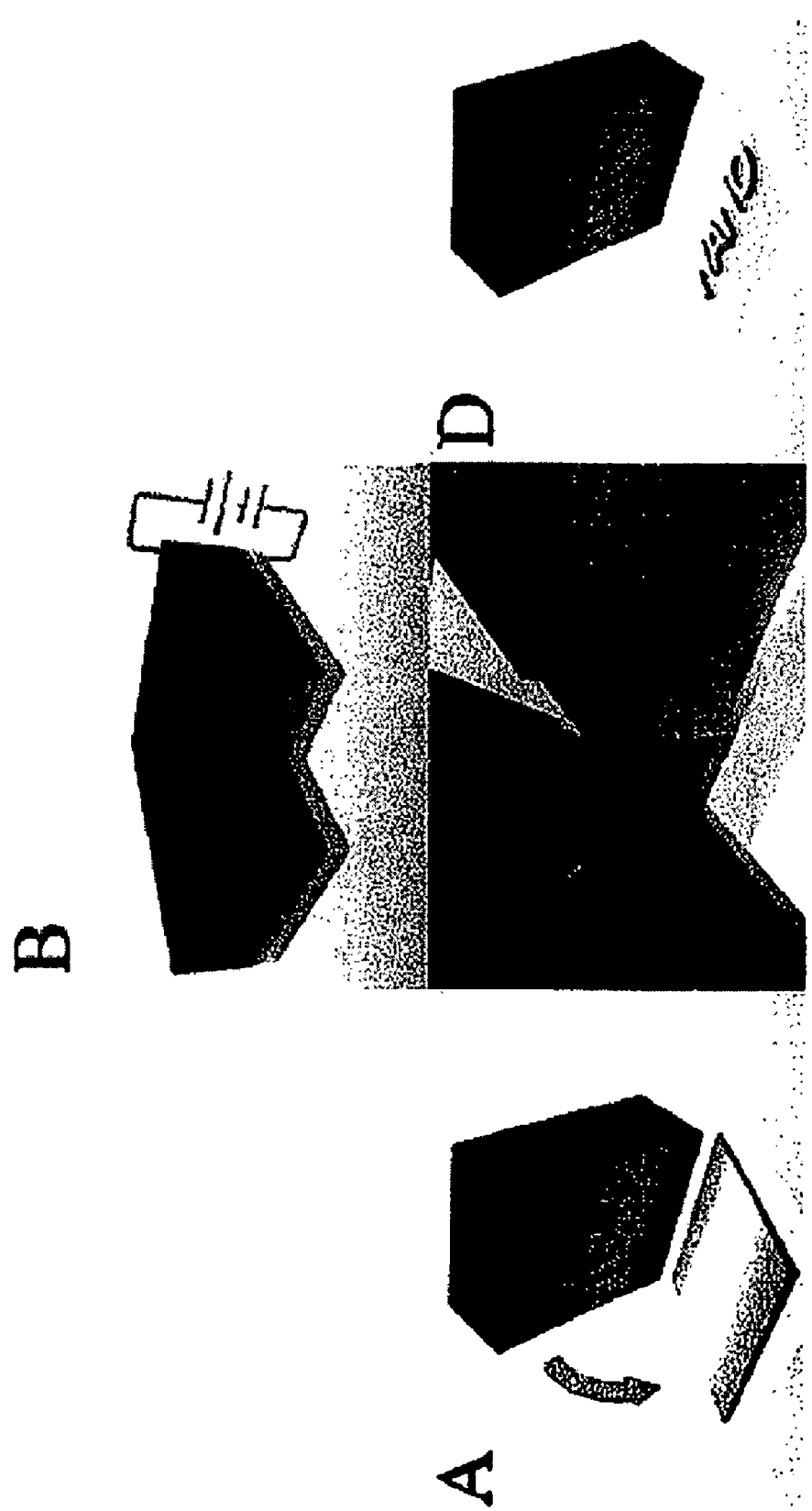
FIG. 41 S4 process overview. A The solid electrolyte or ionic/mixed conductor is patterned as desired; B The ionic stamp having a patterned face is placed in contact with a thin film substrate and a bias voltage placed across the system to drive the electrochemical reaction; C At the interface, metal atoms (in this example copper) are split into ions and electrons which migrate through the substrate and stamp. D The stamp is removed to reveal a pattern in the substrate corresponding to the pattern on the stamp.

As discussed, solid-state ionic conductors are capable of providing nanoscale pattern transfer by exploiting highly localized electrochemical reactions at the point of contact between the conductor and a metal substrate. Under the influence of an electronic bias between an ionic conductor (stamp) and a metal surface (anode), metal ions migrate through the bulk of the ionic conductor towards the counter electrode (FIG. 41). Because this process is highly localized to the contact at the ionic conductor interface, high fidelity pattern transfer is achieved.

"Polymeric electrolyte" or "polymer electrolyte" refers to a solid state ionic conductor that is a metal ion conducting polymeric material. Polymeric electrolytes are useful in that they are compatible with presently available soft lithographic processes and equipment. Their use also provides good resolution, in the micron and sub-micron range, over large surface areas for patterning of a wide range of metals and metal-containing materials. This example provides examples of patterns imprinted into a number of different metals using a polymeric electrolyte. In addition to being compatible with a number of different metals, high precision pattern generation is readily achieved by casting or embossing high precision polymer stamps that support large-area stamping and high-throughput production.

Figure 42:
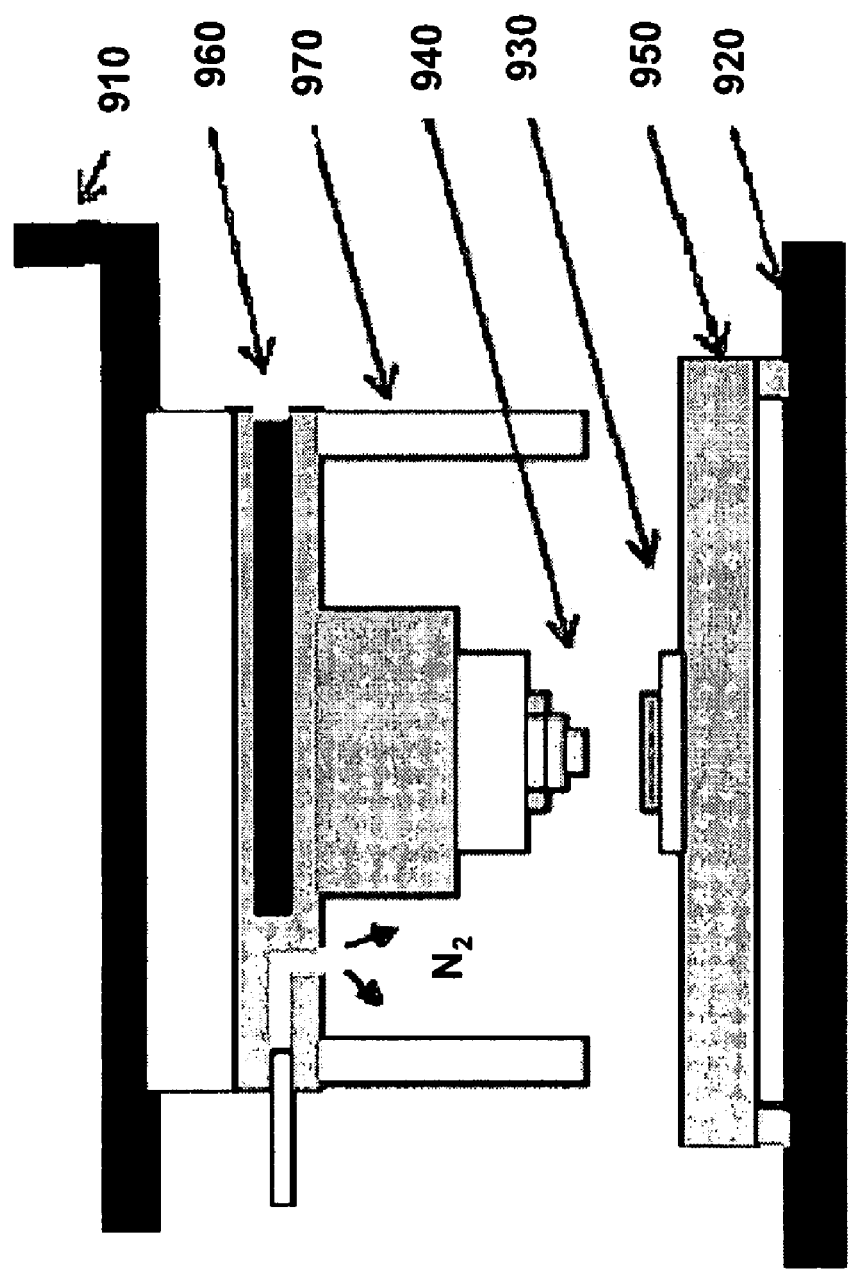
FIG. 42 is a schematic set-up of a patterning system.
Figure 43:
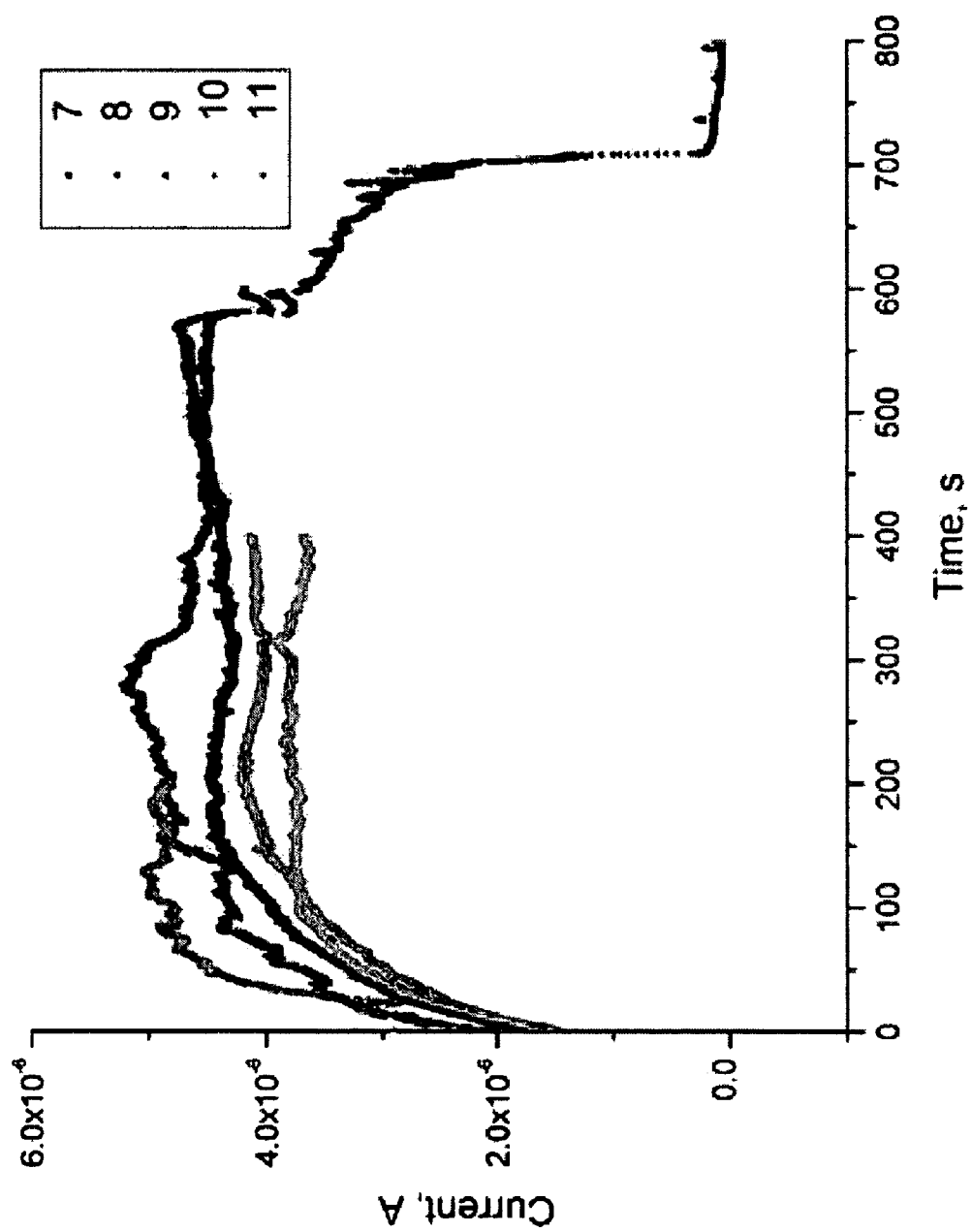
FIG. 43 Sample etch curves from Nafion® electrolyte etching of 50 nm Ag films at a driving potential of 4V.

Although any polymeric electrolyte that permits metal ion conduction through its bulk between electrodes can be used in the processes and devices provided herein, this example demonstrates patterning with NAFION® 115 (DuPont) polymeric electrolyte. Squares (3 mm×3 mm) of Nafion 115 polymer are soaked in a 20 mM bath of $AgNO_3$ for 24 hours at room temperature. Following treatment they were blotted dry using filter paper, and subsequently patterned either by focused ion beam milling (FEI DB 235, 1 pA aperture), or embossed into a suitable mold at elevated temperatures for 10-15 minutes. Etching is performed by placing the processed Nafion films in contact with 50-100 nm Ag and Cu films on a 10 nm Cr seed layer and applying potentials ranging from about 1-4V. FIG. 42 shows an exemplary setup, and FIG. 43 shows the characteristic etch curves observed during Ag patterning with Nafion.

Referring to FIG. 42, dual actuated stage 910 and wedge compensator 920 (comprising a compliant elastomeric layer) provide means for adjusting contact pressure. Other means for adjusting contact pressure include by a motor or positioner that provides an adjustable contact force between substrate 930 (e.g., metal) and solid state ionic conductor 940 (e.g., polymeric electrolyte). Means for adjusting temperature is by any heating means such as heaters, blowers, electric circuits, etc. For example, substrate heater 950 and/or cartridge heater 960, as shown in FIG. 42. Further, to avoid unwanted contaminants and better control physical parameters, the system is optionally contained within an enclosure 970. In an embodiment, a gas is introduced to the system as shown by the arrows indicating flow direction of $N_2$ gas. The system for providing electrolyte polymer stamping provides functional control of various process parameters to facilitate high fidelity and high resolution patterning. Examples include positioning stage 910 having better than 10 nm precision. A heating stage 950 and inert gas chamber 970 hold the stamp 940 and optionally hydrate the polymeric electrolyte stamp 940 under controlled conditions.

Figure 44A:
FIG. 44A is an example of large area stamp specimens for use in generating large area patterns. B is a view of an embossed stamp with a scale bar of 1 mm and a close-up inset in the top left having a scale bar of 5 μm. C is a corresponding printed line by the S4 process provided herein with the lines having a 3 μm pitch.
Figure 44B:
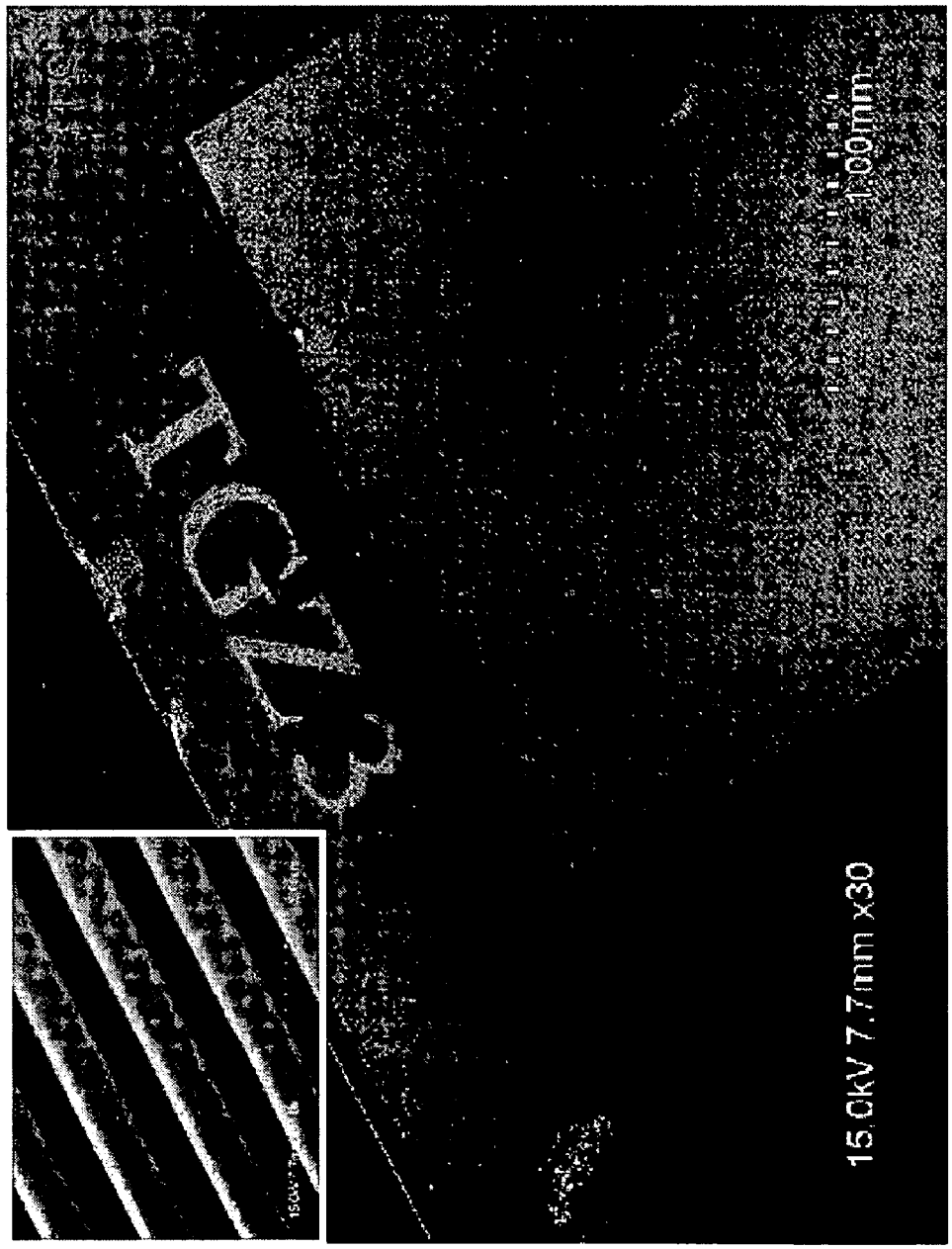
Figure 44C:
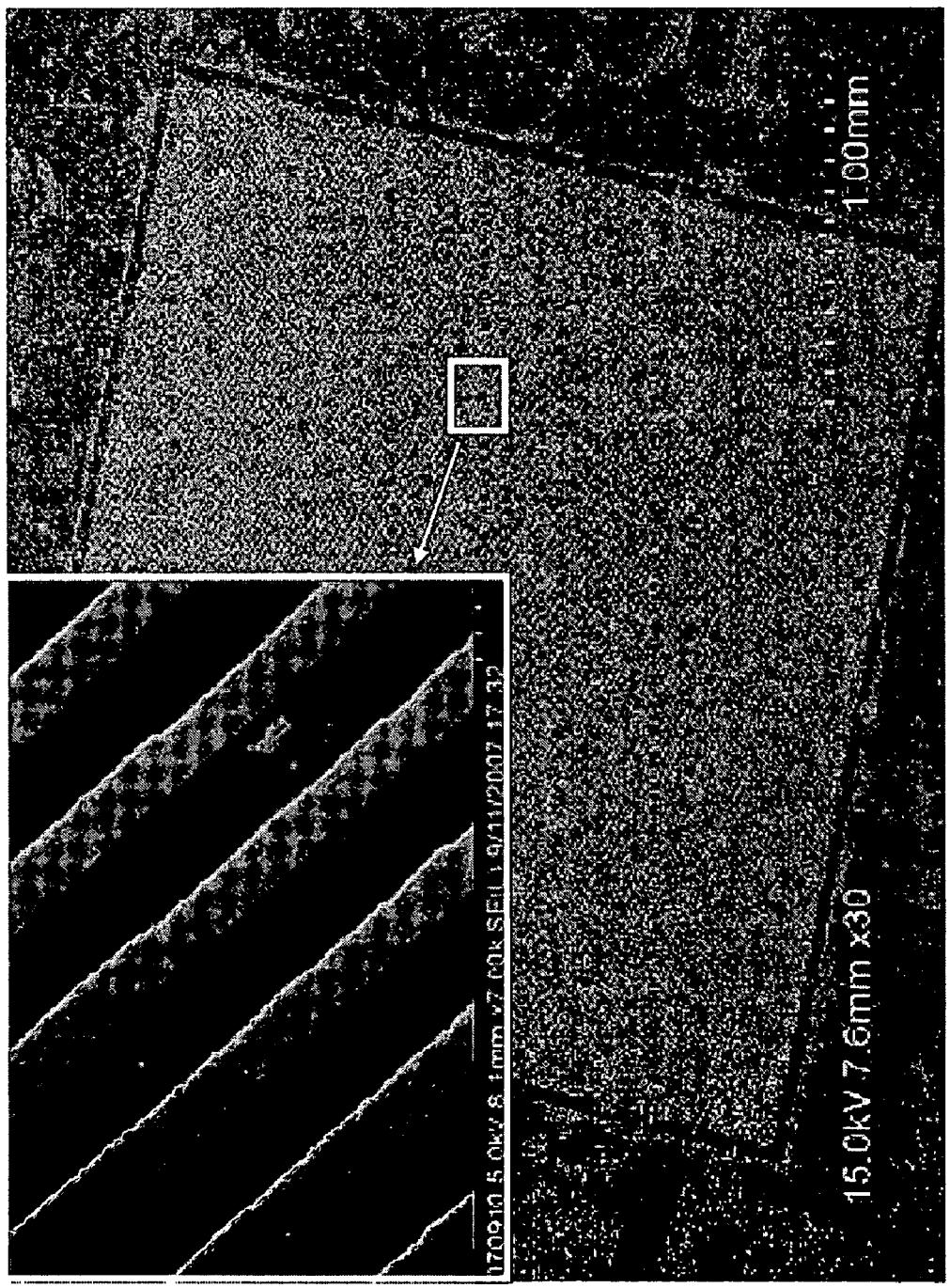
Figure 45B:
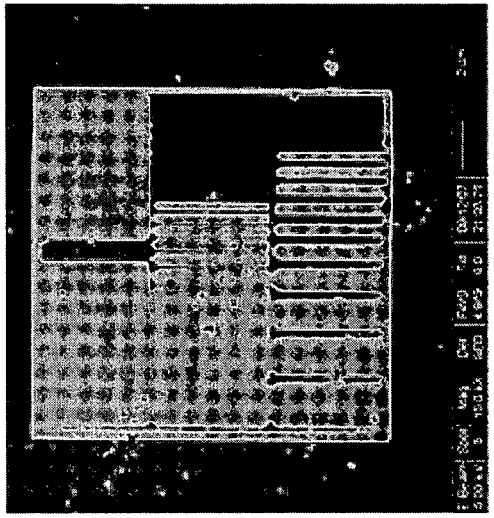
FIG. 45 Examples of patterning using Nafion. A Ion milled calibration grating pattern in polymer; B etched into a 50 nm e-beam evaporated silver film on glass to produce 200 nm features. Compass rose pattern on Nafion stamp C and corresponding results of stamping (D).
Figure 45D:
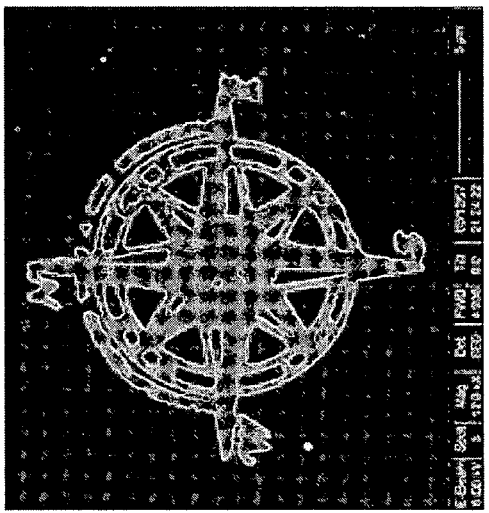
Figure 45A:
Figure 45C:
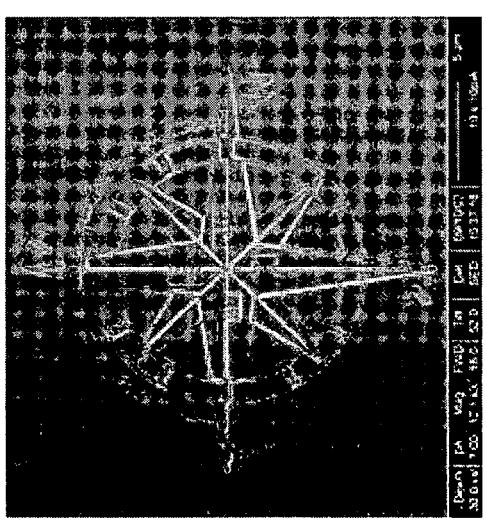

FIG. 44 provides examples of large area (e.g., greater than 6 mm per side) solid electrolyte stamps made by embossing the solid electrolyte into a silicon mold, and transfer of the pattern. The polymeric electrolyte etch curve is similar to the observed etch curve for silver nano-patterning with $Ag_2S$. FIG. 45 shows some of the electrolyte stamp patterns and patterns generated in metal by an electrolyte stamp. Distortions are due primarily due improper contact alignment and pressure between the polymer and silver substrate. Distortions are minimized or avoided by selection of one or more process parameters during patterning, such as pressure, temperature, and operating voltage. FIG. 46A-B shows patterning of Ag and Cu after embossing a 8 $mm^2$ Nafion film into a calibration grating (NT-MDT TGX1). FIG. 46C shows Ag etching performed by prepatterning the Nafion film with a 20 nm gold etch stop. FIG. 47 shows patterns etched into various metals by the electrolyte stamp.

Gold is patterned with 2.5 μm pitch lines over a surface area of about 36 $mm^2$. In another embodiment, metallic alloys are patterned.

Figure 48:
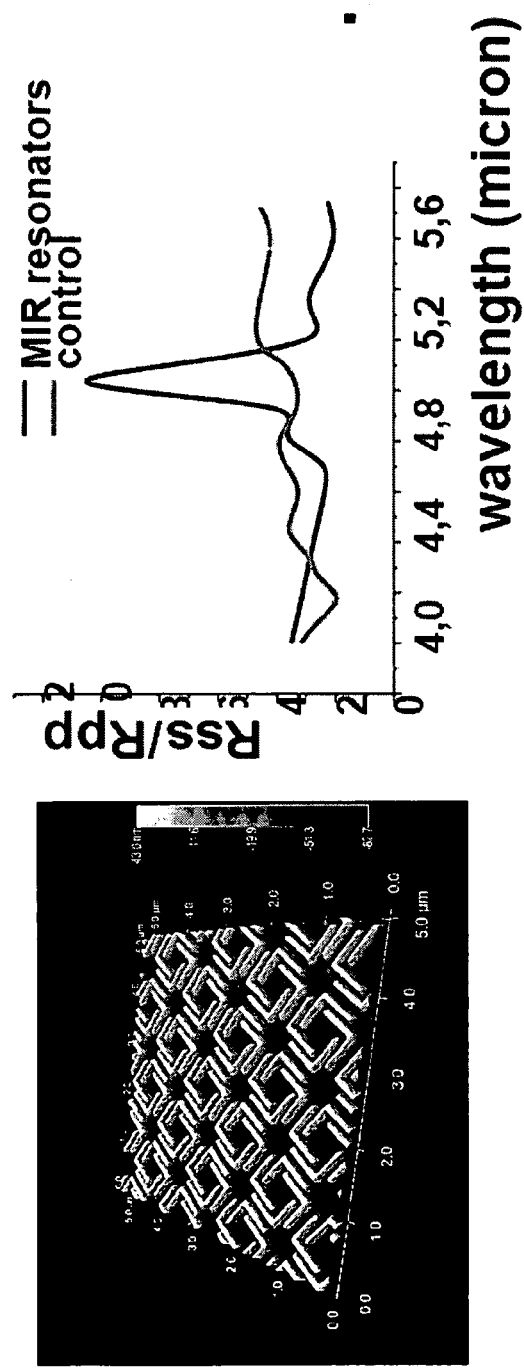
FIG. 48 Examples of optical applications such as gradient index plasmonic lens with anisotropy and programmable plasmonic resonance tags at optical wavelength.
Figure 49:
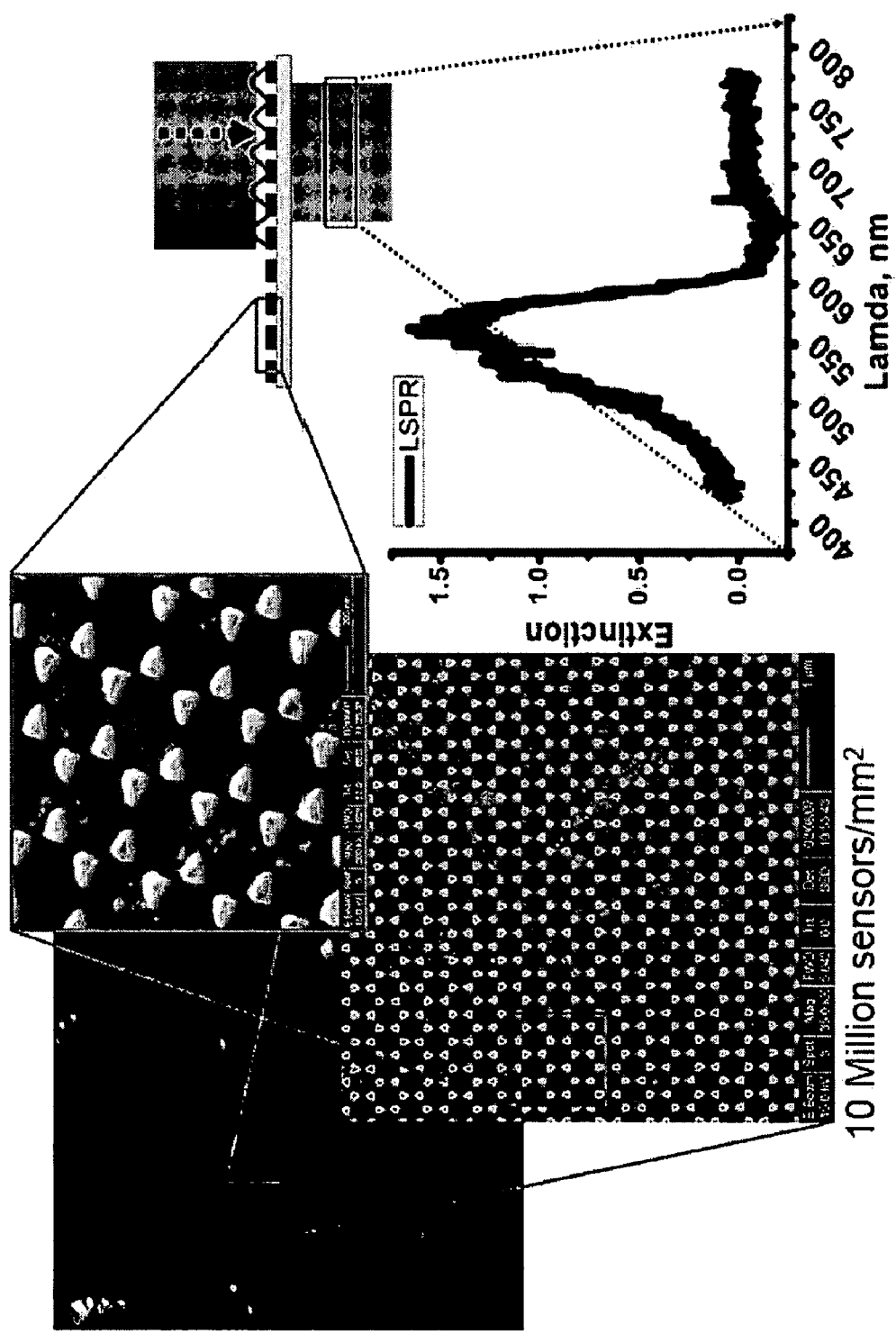
FIG. 49 A multifunctional chemical sensor array having approximately ten million sensors/$mm^2$.
Figure 50:
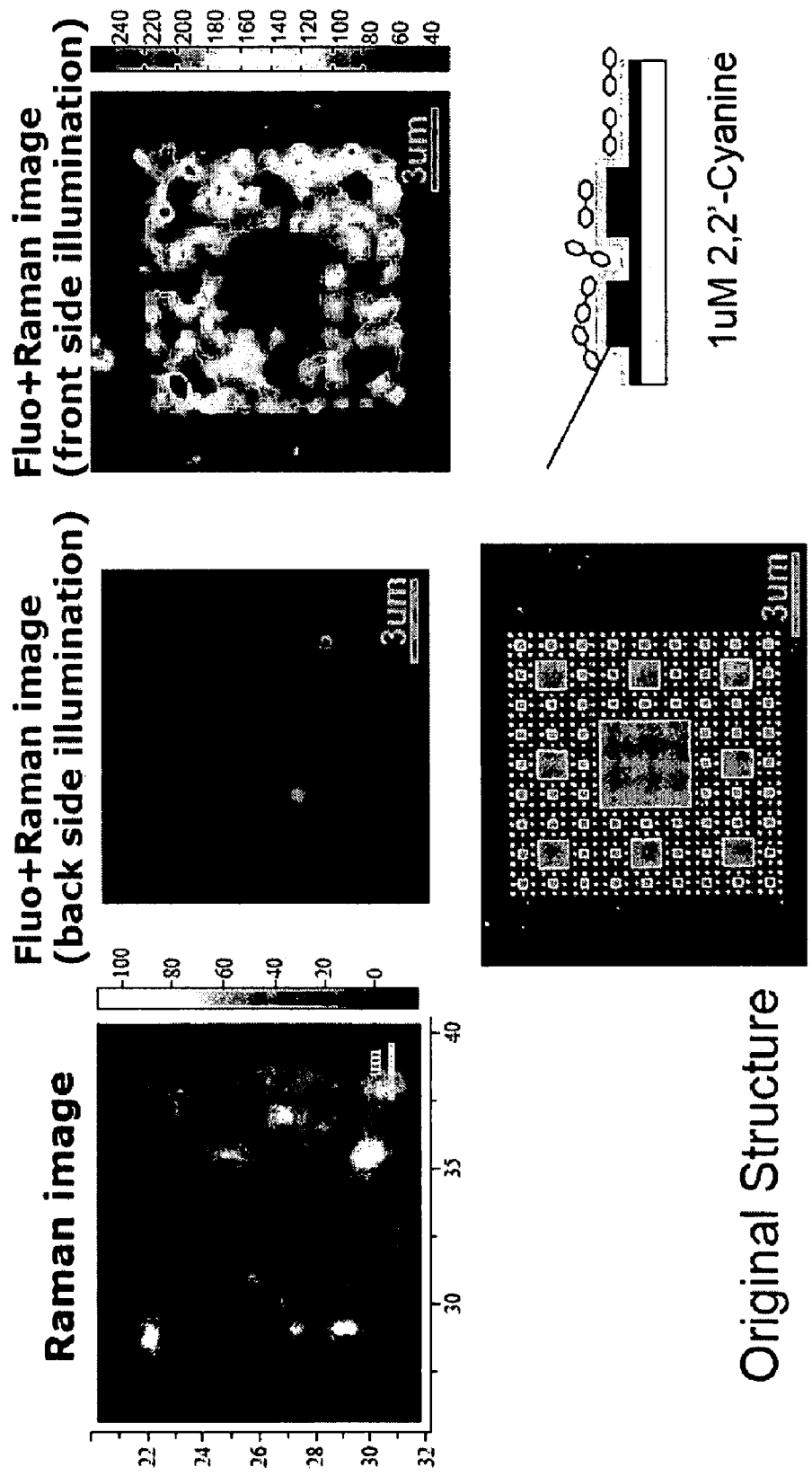
FIG. 50 Enhanced Raman/fluorescence sensing.
Figure 51:
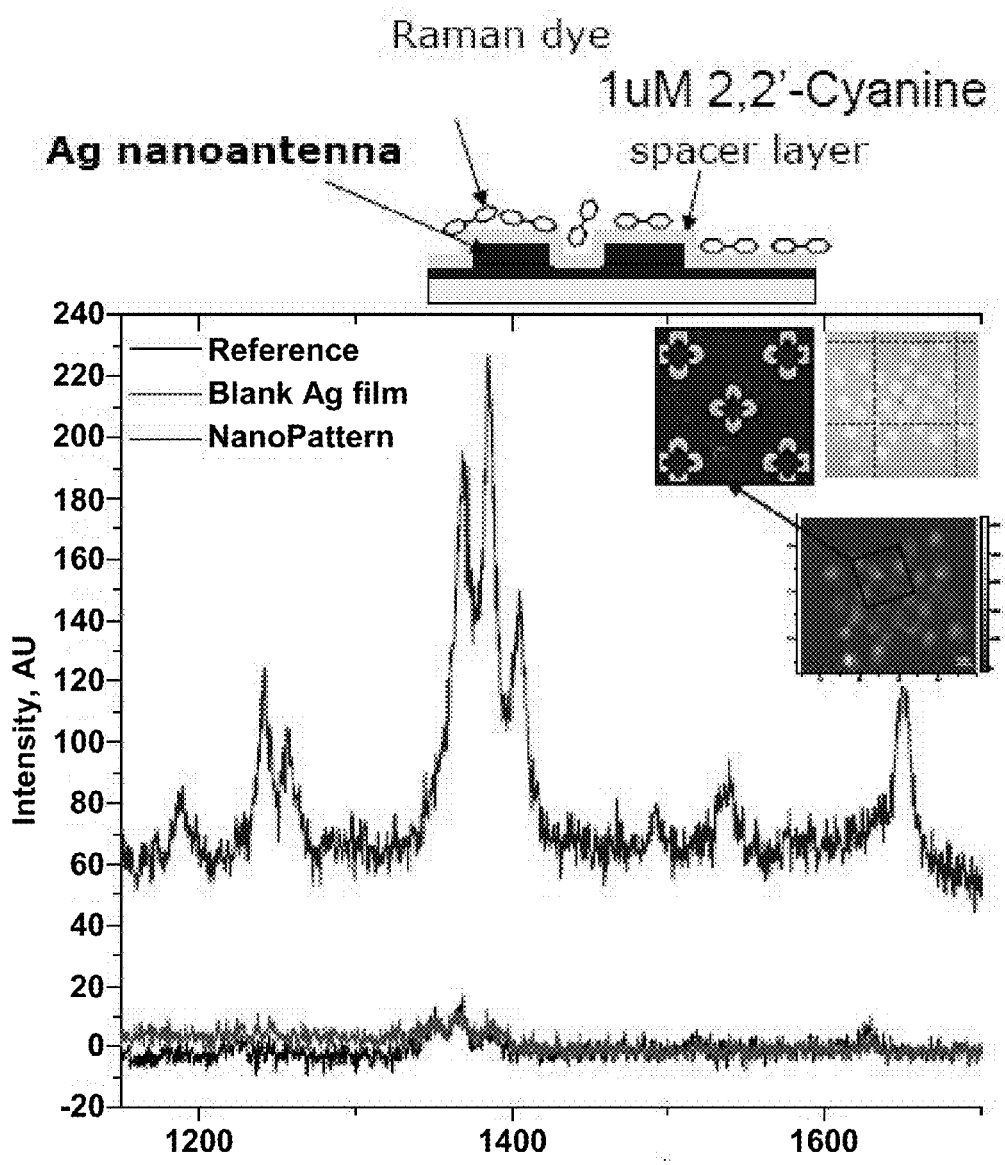
FIG. 51 Surface enhanced Raman sensing. Raman enhancement is more than two orders of magnitude better than roughened silver film. The sensing can be performed with about 10 μW illumination and 1-2 s integration time.
Figure 51:
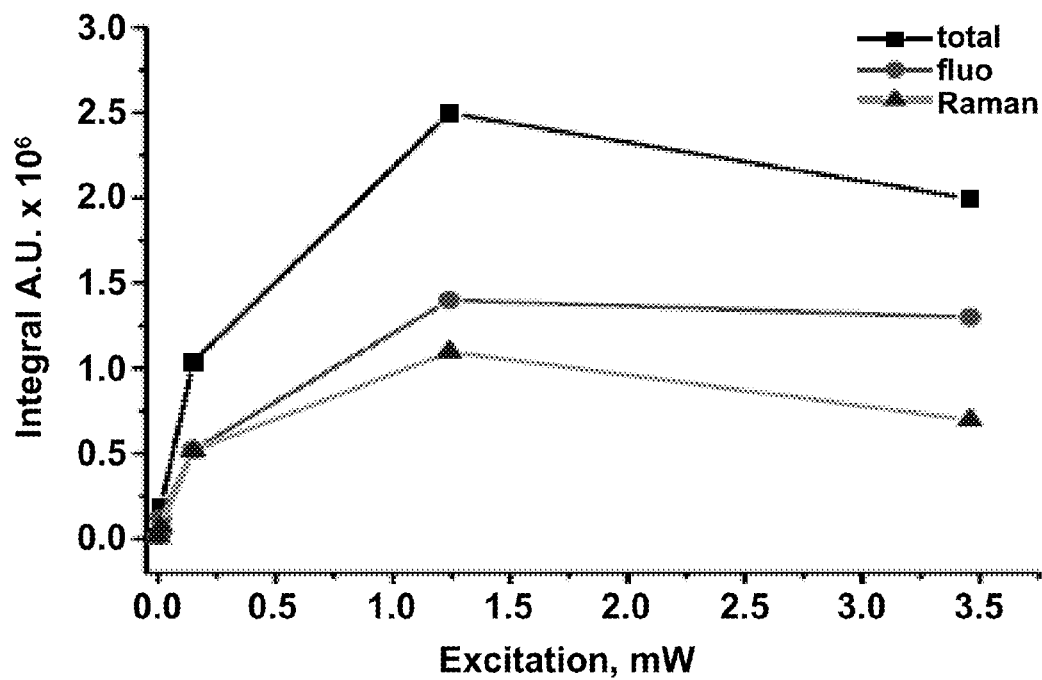

Applications for systems made by any of the processes disclosed herein include, but are not limited to, optical systems (FIG. 48), multifunctional chemical sensor arrays (FIG. 49), enhanced Raman/fluorescence sensing (FIGS. 50-51).

This example illustrates the electrochemical stamping process is a high-throughput technique to directly form metal patterns in the nanometer resolution range, such as about 20 nm resolution. The process can be performed at room temperature, ambient pressure and without liquid chemicals. The processes proved an economical means of making metal masks and nanostructures that is competitive with existing nanostamping processes. Examples of applications include plasmonic structures, nano-wire sensors, antennae, electronic devices (e.g., integrated circuits, interconnects, printed circuit boards having fine pitch features, fuse and circuit breaker technology, micro-heaters, sensing), and other technologies requiring micro-scale and nanoscale patterning of metals. The processes may be incorporated with biological applications by patterning bio-agents with a metallic pattern, such as silver, for example. The desired pattern is produced by any of the processes and systems provided herein. Bio-agents are bound to the metallic pattern. The pattern is placed in contact with a substrate and when the silver is pulled back into the stamp, the bio-agent may be transferred to the substrate. Further, the stamps are optionally reprogrammable for use with a class of soft lithography and nanoimprint processes. The processes disclosed herein can be used to produce adaptive plasmonic systems for enhanced chemical sensitivity and optical information processing (e.g., scanners for bioassays).

STATEMENTS REGARDING INCORPORATION BY REFERENCE AND VARIATIONS

All references cited throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein can be used to practice the invention, unless otherwise stated.

Whenever a range is given in the specification, for example, a temperature range, a size range, a conductivity range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

REFERENCES

U.S. patent application Ser. No. 11/376,908, filed Mar. 16, 2006

K. Terabe, et al., Quantized conductance atomic switch, Nature, Vol 433, 6, January 2005.

K. Terabe, et al., Formation and disappearance of a nanoscale silver cluster realized by solid electrochemical reaction, Journal of applied physics, Vol 91, 12, June, 2002.

M. Lee, et al., Electrochemical nanopatterning of Ag on solid-state ionic conductor RbAg4I5 using atomic force microscopy, Applied physics letters, Vol 85, 16, October 2004.

Kai Kamada, et al, Solid-State Electrochemical Micromachining, Chemistry of Materials, Vol 17, 1930, 2005

David Mullin, et al, Use of solid electrolytic erosion for generating nano-aperture near-field collectors, Applied Physics Letters, Vol 71, 437, July 1997.

Rolf Schuster, et al, Nanoscale Electrochemistry, Physical Review Letters, Vol 80, 5599, June 1998; Rolf Schuster, et al, Electrochemical Micromachining, Science, Vol 289, 98, July, 2000

A. L. Trimmer, et al, Single-step electrochemical machining of complex nanostructures with ultrashort voltage pulses, Applied Physics Letters, Vol 82, 3327, May 2003.

Fang N., Lee H., Sun C., and Zhang X., "Sub-Diffraction-Limited Optical Imaging with a Silver Superlens", Science, 308, 534-537 (2005)

Ho C, Qiao R, Heng J B, Chatterjee A, Timp R J, Aluru N R, Timp G. "Electrolytic transport through a synthetic nanometer-diameter pore", Proc. NAS, 102, 10445-10450 (2005)

Hull S, "Superionics: crystal structures and conduction processes", Rep. Prog. Phys. 67, 1233-1314 (2004)

Myer, J., "Nanoionics: ion transport and electrochemical storage in confined systems", Nature Materials, 4, 905-915 (2005).

Rynders R M, and Alkire R C, "Use of In Situ Atomic Force Microscopy to Image Copper Electrodeposits on Platinum," J. Electrochem. Soc., 141, 1166-1173 (1994).

Sata N., Eberman K., Eberl K., Maier J., "Mesoscopic fast ion conduction in nanometre-scale planar heterostructures", Nature, 408, 946-949 (2000).

Wysk H., Schmalzried H., "Electrochemical investigation of the α/β-phase transition of silver sulfide", Solid State Ionics 96, 41-47 (1997)

M. Madou, Fundamentals of Microfabrication, 2nd Ed., CRC press New York, 2002.

W. S. Ruska, Microelectronic Processing, MaGraw-Hill, New York, 1987.

S. Y. Chou et al., Nanoimprint lithography, J. Vac. Sci. Technol. B, Vol. 14, No. 6, 1996.

F. Q. Xie, et al., Gate controlled atomic quantum switch, Phys. Rev. Lett. 93, 128303 (2004).

Terabe et al., Ionic/electronic mixed conductor tip of a scanning tunneling microscope as a metal atom source for nanostructuring, Applied physics letters, Vol. 80, No. 21 2002.

F. Prinz, et al, Electrochemical nanopatterning of Ag on solid-state ionic conductor BrAg,I5 using atomic force microscopy, App. Phy. Letters, Vol 85, No. 16, 2004.

H. Rickert, Electrochemistry of Solids, Springer-Verlag, 1982.

S. D. Park et al., Etch characteristics of silver by inductively coupled fluorine-based plasma, Thin Solid Films, 445 (2003), 138-143.

P. Avouris, T. Hertel, R. Martel, Atomic force microscope tip-induced local oxidation of silicon: Kinetics, mechanism, and nanofabrication, Appl. Phys. Lett. 71, (1997) 285

S. Bozhevolnyi et al, Channel plasmon subwavelength waveguide components including interferometers and ring resonators, Nature, 440, (2006) 508, B. Bhattacharyya et al, Electrochemical Micro-machining: New Possibilities for Micro-manufacturing, J. of Materials Processing Technology, Vol. 113 (2001), 301-305.

Choudary et al, Solid Electrolytes and Applications, ed. E. C. Subbarao, Plenum Press, 1980

S. Y. Chou et al., Imprint Lithography with 25-Nanometer Resolution, Science 272 (1996) 85-87.

S. Y. Chou et al., Sub-10 nm Imprint Lithography and Applications, J. Vac. Sci. Technol. B 15 (1997) 2897-2904.

Dong, J., C. Yuan, J. A. Stori, and P. M. Ferreira, Development of a High-speed 3-Axis Machine Tool Using a Novel Parallel-kinematics X-Y Table, International Journal of Machine Tools and Manufacture, 2003.

Ebbesen T. W., Lezec H. J., Ghaemi H. F., Thio T., Wolff P. A., Extraordinary optical transmission through subwavelength hole arrays, Nature, 391 (1998) 667

Fang N, Hsu K H, Rapaka V K, and Ferreira P M, Pattern transfer by Solid-State Electrochemical Stamping, U.S. patent application Ser. No. 11/376,908.

Fang N., Lee H., Sun C., and Zhang X., Sub-Diffraction-Limited Optical Imaging with a Silver Superlens, Science, 308, 534-537 (2005)

R. Hans, Electrochemistry of Solids, Springer-Verlag, Berlin Heidelberg, New York., 1982, 165-166.

M. Hebb, Electrical conductivity of silver sulfide, The journal of chemical physics, Vol. 20, No. 1, 1952, 185-190.

Keng H. Hsu, Placid M. Ferreira, and Fang N., Direct Nanopatterning With Solid Ionic Stamping, ASME IMECE, Chicago, Nov. 5-10, 2006.

Keng Hsu, Nicholas Fang and Placid M. Ferreira, A Solid Phase Electrochemical Nanoimprint Process, in NNT'06 Conference, November 15-17, San Francisco, Calif. 2006.

International Assessment of Research and Development in Micromanufacturing (2005), http://www.wtec.org/micromfg/report/Micro-report.pdf S. Kashida et al., Electronic structure of Ag2S, band calculation and photoelectron spectroscopy, Solid state ionics, (2003), 167-175.

S. Kaeriyama et al, A nonvolatile programmable solid-electrolyte nanometer switch, IEEE J. of Solid-State Circuits 40, (2005) 168

Lee, M. O'Hayre R, Prinz F B, Gur T M, Electrochemical nanopatterning of Ag on solid-state ionic conductor RbAg4I5 using atomic force microscopy, Appl. Phys. Lett., 85, (2004) 3552-3554

W. P. Lim, et al, Preparation of Ag2S Nanocrystals of Predictable Shape and Size, Angew. Chem., Int. Ed, 43 (2004), 5685-5689.

Lin A. C. and Wei C. L, Automated selection of cutting tools based on solid models, Journal of Materials Processing Technology, Volume 72, (1997), pp. 317-329

M. Madou, Fundamentals of Microfabrication, 2nd Ed., CRC press New York, 2002.

S. Maier et. al, Observation of coupled plasmon-polariton modes in Au nanoparticle chain waveguides of different lengths: Estimation of waveguide loss, Appl. Phys. Lett., 18, (2002) 1714

S. Maier, L. Brongersma and H. Atwater, Electromagnetic energy transport along Yagi arrays, Mat. Sci. and Eng. 19 (2002) 291

T. Matsui and J. Wagners in Solid Electrolytes: General Principles, Characterization, Materials and Applications, Academic Press, 1978

J. McDonald in Superionic Conductors, eds. G. Mahan and W. Roth, Plenum Press, 1976

S. O'Brien and J. B. Pendry, J. Phys.-Cond. Matt. 14 6383 (2002). W. S. Ruska, Microelectronic Processing, MaGraw-Hill, New York, 1987.

S. D. Park et al., Etch characteristics of silver by inductively coupled fluorine-based plasma, Thin Solid Films, 445 (2003), 138-143.

H. Rickert, Electrochemistry of Solids, Springer-Verlag, 1982.

M. Shahinpoor and K. J. Kim, Ionic polymer-metal composites: III. Modeling and simulation as biomimetic sensors, actuators, transducers, and artificial muscles, Smart Mater. Struct., 14, (2004) 197.

R. Schuster, V. Kirchner, X. H. Xia, A. M. Bittner, G. Ertl, Nanoscale Electrochemistry, Phys. Rev. Lett. 80, 5599 (1998).

Thio T., Pellerin K. M., Linke R. A., Lezec H. J., Ebbesen T. W., Enhanced light transmission through a single subwavelength aperture, Optics Letters, 26 (2001) 1972.

A. L. Trimmer et al., Single-step electrochemical machining of complex nanostructures with ultrashort voltage pulses, Applied Physics Letters, Vol 82, No. 19, 2003.

D. Veeramani and Y.-S. Gau, Selection of an optimal set of cutting-tools for a general triangular pocket, International Journal of Production Research, Volume 35, 9, 1997

C. Wagner, Investigations on Silver Sulfide, The Journal of chemical physics, Vol. 21, 1953, 1819-1827

K. Wang and D. M. Mittleman, Metal wires for terahertz wave guiding, Nature, 432, (2004) 376

Weissmüller et al., Charge-Induced Reversible Strain in a Metal, Science, 300 (2003) 312

Wu D., Fang N., Sun C., Zhang X., Padilla W., Basov D., Smith D., and Schultz S., A Terahertz Plasmonic High Pass Filter, Applied Physics Letters, 83 (12003) 201-203

Wu, W., Liu, Y M, Fang N., et al, 2006, "Mid-IR Metamaterials Fabricated by Nanoimprint Lithography", submitted to Appl. Phys Lett.

H. Wysk et al., Electrochemical investigation of the alpha/beta-phase transition of silver sulfide, Solid State Ionics, 96, (1997) 41-47.

Yen T.-J., Padilla W., Fang N., Vier D., Smith D. R., Pendry J. B., Basov D. N., and Zhang X., 2004, "Terahertz Magnetic Response From Artificial Materials", Science, Vol 303(5663), pp 1494-1496.

S. Zankovych et al., Nanoimprint Lithography: challenges and prospects, Nanotechnology, 12 (2001) 91-95.

We claim:

1. A method of making a structure comprising:
providing a first electrode in electrical contact with a solid state ionic conductor;
providing a second electrode in electrical contact with a metal;
establishing electrical contact between at least a portion of said solid state ionic conductor and said metal by physically contacting said solid state ionic conductor with said metal; and
generating an electric field between said first and second electrodes, wherein a portion of the metal is oxidized thereby generating metal ions and free electrons, wherein said metal ions migrate through the solid state ionic conductor to the first electrode where they are reduced and wherein said free electrons migrate to said second electrode, thereby making said structures;
wherein said solid state ionic conductor is a stamping tool comprising a pattern of relief features that generates a pattern of electrical contacts between said stamping tool and said metal to at least partially transfer said pattern of relief features to said metal via electrochemical etching.

2. The method of claim 1, wherein the solid state ionic conductor is a polymer electrolyte.

3. The method of claim 1, wherein the metal comprises a metallic alloy.

4. The method of claim 1, wherein the metal is selected from the group consisting of: Au, Cr, Ti, Cu, and Ag.

5. The method of claim 1, wherein the structure comprises at least a portion of a metal mask, metal-on-polymer mask, or an interconnect.

6. The method of claim 1, wherein the structure has nanoscale resolution.

7. The method of claim 1, wherein the electrochemical etching is achieved by substitutional stamping.

8. The method of claim 7, wherein the stamping tool comprises a polymer electrolyte.

9. The method of claim 8, wherein the polymer electrolyte comprises a copper ion conducting polymer composite.

10. The method of claim 7, wherein the stamping tool comprises $Ag_2S$ and the metal comprises Cu.

11. The method of claim 1 wherein a process parameter is manipulated to optimize structure manufacture, said process parameter selected from the group consisting of bias voltage, contact pressure, and patterning temperature.

12. The method of claim 1 further comprising the step of establishing contact between the stamping tool and a substrate undergoing processing via a flexure-based actuator.

13. The method of claim 1, wherein the pattern of structures is generated over a surface area that is greater than or equal to 25 $mm^2$.

14. The method of claim 1, wherein the structure is incorporated into a device selected from the group consisting of:
a. a printed circuit;
b. a chemical or biological sensor;
c. an optical device;
d. a low-loss capacitor; and
e. a waveguide.

15. The method of claim 1, wherein said solid state ionic conductor is a glassy ionic conductor.

16. The method of claim 15, wherein said glassy ionic conductor comprises a mobile ionic conductive phase in a glass host matrix.

17. An electrochemical patterning system for making one or more structures, comprising:
a first electrode in electrical contact with a solid state ionic conductor, wherein said solid state ionic conductor is a polymeric electrolyte or a glassy ionic conductor;
a second electrode in electrical contact with a metal, wherein at least a portion of said solid state ionic conductor and said metal are in electrical and physical contact; and
a power supply electrically connected to the first and second electrodes for establishing a potential difference between the first and second electrodes,
wherein said solid state ionic conductor is a stamping tool comprising a pattern of relief features that generates a pattern of electrical contacts between said stamping tool and said metal.

18. The system of claim 17, wherein the structure is a metal mask, metal-on-polymer mask, or an interconnect.

19. The system of claim 17, further comprising means for adjusting one or more process parameter selected from the group consisting of bias voltage, contact pressure and patterning temperature.

20. The system of claim 17, wherein said stamping tool has a surface shape corresponding to a desired metal mask, metal-on-polymer mask, or an interconnect pattern.

21. The system of claim 17 further comprising a dual-actuated stage operationally connected to the stamping tool so as to establish contact between the stamp tool and a substrate undergoing processing.

22. The system of claim 21, wherein the dual-actuated stage comprises a stepper and a flexure based actuation system.

23. The system of claim 17 further comprising a system for wedge compensation between the stamping tool and a substrate undergoing processing.

24. The system of claim 17 further comprising a closed-loop electrical system electrically connected to the electrodes and operationally connected to a means for providing motion of the stamping tool relative to the metal.

25. The system of claim 17, wherein the solid state ionic conductor is a glassy ionic conductor.

* * * * *